US012790569B2

(12) United States Patent
Sasaki et al.

(10) Patent No.: US 12,790,569 B2
(45) Date of Patent: Nov. 10, 2026

(54) SUBSTRATE TREATING METHOD AND TREATMENT LIQUID

(71) Applicant: SCREEN Holdings Co., Ltd., Kyoto (JP)

(72) Inventors: Yuta Sasaki, Kyoto (JP); Yosuke Hanawa, Kyoto (JP); Shogo Kunieda, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 462 days.

(21) Appl. No.: 18/557,913

(22) PCT Filed: Apr. 21, 2022

(86) PCT No.: PCT/JP2022/018423
§ 371 (c)(1),
(2) Date: Oct. 27, 2023

(87) PCT Pub. No.: WO2022/230756
PCT Pub. Date: Nov. 3, 2022

(65) Prior Publication Data

US 2024/0218302 A1 Jul. 4, 2024

(30) Foreign Application Priority Data

Apr. 28, 2021 (JP) ................................. 2021-075834
Mar. 17, 2022 (JP) ................................. 2022-042568

(51) Int. Cl.
*C11D 7/50* (2006.01)
*C11D 7/26* (2006.01)
(Continued)

(52) U.S. Cl.
CPC ............ *C11D 7/5022* (2013.01); *C11D 7/261* (2013.01); *C11D 7/32* (2013.01); *H10P 70/20* (2026.01)

(58) Field of Classification Search
CPC ......... C11D 7/5022; C11D 7/261; C11D 7/32; H10P 70/20
(Continued)

(56) References Cited

U.S. PATENT DOCUMENTS 7,363,729 B2 * 4/2008 Tanaka ...................... F26B 3/28 205/333
9,221,027 B2 * 12/2015 Kuppler ................. B01J 10/005
(Continued)

FOREIGN PATENT DOCUMENTS

JP H02-154413 A 6/1990
JP H11-258803 A 9/1999
(Continued)

OTHER PUBLICATIONS

International Search Report mailed Jul. 26, 2022 in corresponding PCT International Application No. PCT/JP2022/018423.
(Continued)

*Primary Examiner* — Stephen M Gravini
(74) *Attorney, Agent, or Firm* — OSTROLENK FABER LLP

(57) ABSTRACT

A substrate treating method and treatment liquid. A substrate has an upper surface with a pattern forming area and a pattern non-forming area. The method includes a treatment liquid supplying step, a solidified film forming step, a sublimation step, and a removing step. In the treatment liquid supplying step, a treatment liquid film is formed on the upper surface of the substrate. The treatment liquid contains a sublimable substance and a solvent. In the solidified film forming step, a solidified film containing the sublimable substance is formed on the upper surface of the substrate by evaporating the solvent from the liquid film. The solidified film has a first solidified film on the pattern non-forming area and a second solidified film on the pattern
(Continued)

non-forming area. In the sublimation step, the first solidified film sublimates. In the removing step, the second solidified film is removed from the substrate.

17 Claims, 27 Drawing Sheets

(51) Int. Cl.
*C11D 7/32* (2006.01)
*H10P 70/00* (2026.01)

(58) Field of Classification Search
USPC ........................................................ 34/357
See application file for complete search history.

(56) References Cited

U.S. PATENT DOCUMENTS

| | | | | |
|---|---|---|---|---|
| 10,423,070 | B2 * | 9/2019 | Kanaoka | G03F 7/11 |
| 10,451,346 | B1 * | 10/2019 | Nguyen | F26B 5/06 |
| 11,097,139 | B1 * | 8/2021 | Shen | G01M 3/2807 |
| 11,921,428 | B2 * | 3/2024 | Uozumi | G03F 7/162 |
| 12,225,914 | B1 * | 2/2025 | Porter | A23B 2/001 |
| 12,571,587 | B2 * | 3/2026 | Erickson | F26B 3/12 |
| 12,611,888 | B2 * | 4/2026 | Barberan Latorre | B41M 3/00 |
| 2008/0014532 | A1 | 1/2008 | Kessel et al. | |
| 2015/0155159 | A1 | 6/2015 | Igarashi et al. | |
| 2017/0268112 | A1 | 9/2017 | Akiyama et al. | |
| 2019/0091736 | A1 | 3/2019 | Okutani et al. | |
| 2019/0198341 | A1 | 6/2019 | Ogihara et al. | |
| 2020/0381269 | A1 | 12/2020 | Fujiwara et al. | |
| 2020/0411309 | A1 | 12/2020 | Otsuji et al. | |
| 2024/0218302 | A1 * | 7/2024 | Sasaki | C11D 7/261 |
| 2024/0418443 | A1 * | 12/2024 | Tanaka | B08B 3/04 |
| 2025/0118454 | A1 * | 4/2025 | Lu | B32B 3/10 |
| 2026/0092179 | A1 * | 4/2026 | Milne | C09B 7/02 |

FOREIGN PATENT DOCUMENTS

| | | | | | |
|---|---|---|---|---|---|
| JP | 2009-543708 | A | | 12/2009 | |
| JP | 2014-11426 | A | | 1/2014 | |
| JP | 2015-106645 | A | | 6/2015 | |
| JP | 2016-104896 | A | | 6/2016 | |
| JP | 2019-112584 | A | | 7/2019 | |
| JP | 2019-114774 | A | | 7/2019 | |
| JP | 2020-194950 | A | | 12/2020 | |
| KR | 10-2020-0000401 | A | | 1/2020 | |
| KR | 20230173723 | A | * | 12/2023 | H10P 70/20 |
| TW | 202103279 | A | | 1/2021 | |
| TW | 1829142 | B | * | 1/2024 | H10P 70/20 |
| WO | WO-2022230756 | A1 | * | 11/2022 | H10P 76/00 |

OTHER PUBLICATIONS

Written Opinion mailed Jul. 12, 2022 in corresponding PCT International Application No. PCT/JP2022/018423.

Office Action dated Dec. 30, 2024 for corresponding Korean Patent Application No. 10-2023-7040472.

Office Action dated Apr. 25, 2026 for corresponding Chinese Patent Application No. 202280031605.X.

* cited by examiner

FIG. 10

| | Sublimable substance | Solvent | Ratio of volume of sublimable substance to solvent RV [Vol%] | Collapse rate [%] |
|---|---|---|---|---|
| Experimental example 1 | Pinacolone oxime | Isopropyl alcohol | 2.5 | 31.2 |
| Experimental example 2 | Acetophenone oxime | Isopropyl alcohol | 2.5 | 23.2 |
| Experimental example 3 | Cyclopentanone oxime | Isopropyl alcohol | 2.5 | 31.1 |
| Experimental example 4 | 4-tert-butylphenol | Isopropyl alcohol | 2.5 | 7.2 |

FIG. 27

| | Substrate | Surface condition of substrate | Sublimable substance | Solvent | Sublimable substance : solvent (ratio of volume) | Average collapse rate [%] | Angle [degree] |
|---|---|---|---|---|---|---|---|
| Experimental example 5a | Wb | Hydrophobic | Pinacolone oxime | Isopropyl alcohol | 1:30 | 0.02 | 69.1 |
| Experimental example 5b | Wb | Hydrophilic | Pinacolone oxime | Isopropyl alcohol | 1:30 | 0.16 | 59.6 |
| Comparative example 1a | Wc | Hydrophobic | Cyclohexanone oxime | Isopropyl alcohol | 1:40 | 0.7 | 26.2 |
| Comparative example 1b | Wc | Hydrophilic | Cyclohexanone oxime | Isopropyl alcohol | 1:40 | 78.6 | 83.2 |
| Comparative example 2a | Wc | Hydrophobic | Cyclohexanone oxime | Methanol | 1:40 | 0.1 | 24.9 |
| Comparative example 2b | Wc | Hydrophilic | Cyclohexanone oxime | Methanol | 1:40 | 100 | 87.1 |

FIG. 28

| | Substrate | Surface condition of substrate | Sublimable substance | Solvent | Sublimable substance : solvent (ratio of volume) | Average collapse rate [%] | Angle [degree] |
|---|---|---|---|---|---|---|---|
| Comparative example 3a | Wc | Hydrophobic | Camphor | Isopropyl alcohol | 1:110 | 37.4 | 69.6 |
| Comparative example 3b | Wc | Hydrophilic | Camphor | Isopropyl alcohol | 1:110 | 100 | 94.7 |
| Comparative example 4a | Wc | Hydrophobic | Camphor | Methanol | 1:100 | 9.95 | 72.6 |
| Comparative example 4b | Wc | Hydrophilic | Camphor | Methanol | 1:100 | 100 | 95.5 |
| Comparative example 5a | Wa | Hydrophobic | Cyclohexanone oxime | Isopropyl alcohol | 1:40 | 12.5 | 26.2 |
| Comparative example 6a | Wa | Hydrophobic | Cyclohexanone oxime | Isopropyl alcohol | 1:40 | 11.7 | 25.6 |
| Comparative example 7a | Wa | Hydrophobic | Cyclohexanone oxime | Isopropyl alcohol | 1:40 | 5.4 | 24.7 |

SUBSTRATE TREATING METHOD AND TREATMENT LIQUID

CROSS-REFERENCE TO RELATED APPLICATIONS

The present application is a 35 U.S.C. §§ 371 national stage application of International Application No. PCT/JP2022/018423 filed Apr. 21, 2022, which claims priority to Japanese Patent Application No. 2021-075834, filed Apr. 28, 2021, and Japanese Patent Application No. 2022-042568, filed Mar. 17, 2022 the contents of which are incorporated herein by reference.

TECHNICAL FIELD

The present invention relates to a substrate treating method for performing treatment on substrates and a treatment liquid used for treating the substrates. Examples of the substrates include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate.

BACKGROUND ART

Patent Literature 1 discloses a substrate treating method for treating substrates. The substrate has a pattern forming area where patterns are formed. The pattern forming area has a solidified film formed thereon. The solidified film contains a sublimable substance. The sublimable substance is, for example, tert-butanol. The solidified film includes a first section and a second section. The first section and the second section are each positioned on the pattern forming area. The first section is positioned above the patterns. The first section corresponds to a surface layer of the solidified film. The second section is positioned below the first section. The second section is positioned at the same level as that of the patterns. The second section is embedded between adjacent patterns. The second section is embedded between adjacent projections.

The substrate drying method in Patent Literature 1 includes a first sublimation step and a second sublimation step. In the first sublimation step, first gas is supplied to the solidified film to sublimate the first section. When the first sublimation step is completed, the first section is removed from the pattern forming area, and the second section remains on the pattern forming area. In the second sublimation step after the first sublimation step, second gas is supplied to the second section to sublimate the second section. The second gas has a temperature lower than that of the first gas. When the second sublimation step is completed, the second section is removed from the pattern forming area. Accordingly, when the second sublimation step is completed, the solidified film is entirely removed from the substrate, and the substrate is to be dried.

Patent Literature 1 further includes a substrate heating step. The substrate heating step is performed after the first sublimation step and the second sublimation step. That is, the substrate heating step is performed after the solidified film is entirely sublimated. In the substrate heating step, third gas is supplied to the substrate to heat the substrate. This suppresses condensation of gas, surrounding the substrate, on the substrate. Gas surrounding the substrate is hard to be condensed on the substrate.

As described above, Patent Literature 1 discloses the first sublimation step and the second sublimation step for sublimating the solidified film on the pattern forming area. The substrate heating step is not a step for sublimating the solidified film.

PRIOR ART DOCUMENT

Patent Literature

[Patent Literature 1]
Japanese Unexamined Patent Publication No. 2014-11426A

SUMMARY OF INVENTION

Technical Problem

Even with the currently-used substrate treating method, a substrate cannot be efficiently dried occasionally. For example, even with the currently-used substrate treating method, a solidified film may sometimes be hard to be sublimated rapidly. For example, even with the currently-used substrate treating method, it may sometimes need a long time to sublimate the solidified film.

Moreover, even with the currently-used substrate treating method, a substrate sometimes cannot be treated appropriately. For example, even with the currently-used substrate treating method, a pattern formed on a surface of a substrate may collapse. For example, if a pattern is fine, the currently-used substrate treating method may insufficiently suppress collapse of the pattern.

The present invention has been made regarding the state of the art noted above, and its primary object is to provide a substrate treating method that allows efficient substrate treatment. Moreover, a secondary object of the present invention is to provide a substrate treating method and a treatment liquid that allow suitable substrate treatment.

Solution to Problem

The present invention is constituted as stated below to achieve the first object. One aspect of the present invention provides a substrate treating method for performing treatment on a substrate, the substrate having an upper surface provided with a pattern forming area where a pattern is formed and a pattern non-forming area where the pattern is not formed. The substrate treating method includes a treatment liquid supplying step of supplying a treatment liquid, containing a sublimable substance and a solvent, to the upper surface of the substrate to form a liquid film of the treatment liquid on the upper surface of the substrate, a solidified film forming step of evaporating the solvent from the liquid film to form a solidified film on the upper surface of the substrate, the solidified film containing the sublimable substance and including a first solidified film on the pattern forming area and a second solidified film on the pattern non-forming area, a sublimation step of blowing first gas to the first solidified film to sublimate the first solidified film, and a removing step of removing the second solidified film from the substrate.

The substrate has the upper surface. The upper surface includes the pattern forming area and the pattern non-forming area. The pattern forming area is part of the upper surface of the substrate where patterns are formed. The pattern non-forming area is part of the upper surface of the substrate where patterns are not formed.

With the substrate treating method, the substrate described above is treated. The substrate treating method includes the treatment liquid supplying step and the solidified film forming step. In the treatment liquid supplying step, a treatment liquid is supplied to the substrate. The treatment liquid contains the sublimable substance and the solvent. In the treatment liquid supplying step, a liquid film of the treatment liquid is formed on the upper surface of the substrate. In the solidified film forming step, the solvent is evaporated from the liquid film. In the solidified film forming step, the solidified film is formed on the upper surface of the substrate. The solidified film contains the sublimable substance. The solidified film includes the first solidified film and the second solidified film. The first solidified film is positioned on the pattern forming area. The second solidified film is positioned on the pattern non-forming area.

The substrate treating method includes the sublimation step. In the sublimation step, the first gas is blown to the first solidified film. In the sublimation step, the first solidified film is sublimated. The first solidified film is sublimated, thereby being removed from the pattern forming area. Accordingly, in the sublimation step, the pattern forming area is dried while the patterns formed on the pattern forming area are protected.

The substrate treating method includes the removing step. In the removing step, the second solidified film is removed from the substrate. Accordingly, with the removing step, the pattern non-forming area is dried.

Here, the second solidified film is positioned on the pattern non-forming area. That is, the second solidified film is not positioned on the pattern forming area. Accordingly, there is no possibility that the patterns are collapsed even in promoted removal of the second solidified film. As a result, with the removing step, the second solidified film can be removed from the substrate efficiently.

In summary, the substrate treating method includes the removing step in addition to the sublimation step. In the sublimation step, the first solidified film is sublimated. In the removing step, the second solidified film is removed. As described above, the second solidified film need not to be sublimated in the sublimation step. With the removing step, the second solidified film can be removed from the substrate efficiently. Accordingly, the substrate can be dried efficiently with both the sublimation step and the removing step. Consequently, the substrate can be treated efficiently with the substrate treating method.

It is preferred in the aspect of the substrate treating method described above that the removing step starts after the sublimation step is completed. Accordingly, the removing step is not performed until the sublimation step is completed. Consequently, the removing step is not performed until drying the pattern forming area is completed. This can protect the patterns formed on the pattern forming area more suitably.

It is preferred in the aspect of the substrate treating method described above that a period of time where the removing step is performed overlaps with at least part of a period of time where the sublimation step is performed. This achieves reduction in time for performing the sublimation step and the removing step entirely. As a result, the substrate can be treated more efficiently.

It is preferred in the aspect of the substrate treating method described above that the removing step starts after the sublimation step starts. Accordingly, the sublimation step starts earlier than the removing step. Accordingly, drying of the pattern forming area starts earlier than the removing step. This can protect the patterns formed on the pattern forming area suitably.

It is preferred in the aspect of the substrate treating method described above that the second solidified film is changed into a gas phase in the removing step. Changing the second solidified film into the gas phase achieves suitable removal of the second solidified film from the substrate. Here in the removing step, the second solidified film may be changed into the gas phase not through a liquid phase. Alternatively, in the removing step, the second solidified film may be changed into the gas phase through a liquid phase.

Also in the removing step, the second solidified film may be changed into liquid temporarily before being changed into gas. As described above, the second solidified film is positioned on the pattern non-forming area. The second solidified film is not positioned on the pattern forming area. Accordingly, even if the second solidified film is temporarily changed into liquid, the liquid does not reach the pattern forming area. This can protect the patterns formed on the pattern forming area suitably even if the second solidified film is temporarily changed into liquid.

It is preferred in the aspect of the substrate treating method described above that the second solidified film is vaporized in the removing step. Vaporizing the second solidified film achieves suitable removal of the second solidified film from the substrate.

It is preferred in the aspect of the substrate treating method described above that second gas is blown to the second solidified film in the removing step. The second gas can change the second solidified film into the gas phase suitably. As a result, with the removing step, the second solidified film can be removed from the substrate suitably.

It is preferred in the aspect of the substrate treating method described above that a flow rate of the second gas is larger than a flow rate of the first gas. The second gas can change the second solidified film into the gas phase efficiently. As a result, with the removing step, the second solidified film can be removed from the substrate efficiently. In other words, removal of the second solidified film can be promoted suitably. For example, reduction in time for the removing step can be achieved.

It is preferred in the aspect of the substrate treating method described above that the second solidified film is heated with the second gas in the removing step. The second gas can change the second solidified film into the gas phase more efficiently. As a result, with the removing step, the second solidified film can be removed from the substrate more efficiently. In other words, removal of the second solidified film can be promoted suitably.

It is preferred in the aspect of the substrate treating method described above that the second gas has a temperature higher than a temperature of the first gas. The second gas can heat the second solidified film suitably. Accordingly, removal of the second solidified film can be promoted suitably.

It is preferred in the aspect of the substrate treating method described above that the second gas has a temperature higher than a melting point of the sublimable substance. The second gas can change the second solidified film into the gas phase more efficiently. This can also protect the patterns formed on the pattern forming area suitably even if the second solidified film is temporarily changed into liquid.

It is preferred in the aspect of the substrate treating method described above that the second gas has a temperature higher than a melting point of the second solidified film.

The second gas can change the second solidified film into the gas phase more efficiently. This can also protect the patterns formed on the pattern forming area suitably even if the second solidified film is temporarily changed into liquid.

It is preferred in the aspect of the substrate treating method described above that the second solidified film is heated in the removing step. With the removing step, the second solidified film can be removed from the substrate more efficiently.

It is preferred in the aspect of the substrate treating method described above that the pattern non-forming area is heated and the second solidified film is heated via the pattern non-forming area in the removing step. As described above, the second solidified film is positioned on the pattern non-forming area. Accordingly, the pattern non-forming area contacts the second solidified film. As a result, heating the pattern non-forming area can cause suitable heating of the second solidified film via the pattern non-forming area.

It is preferred in the aspect of the substrate treating method described above that the pattern non-forming area is heated to a temperature higher than a temperature of the first gas in the removing step. The second solidified film can be heated suitably. This can promote drying of the pattern non-forming area suitably.

It is preferred in the aspect of the substrate treating method described above that a lower surface of the substrate is heated in the removing step. The pattern non-forming area can be heated suitably.

It is preferred in the aspect of the substrate treating method described above that the second solidified film is heated with at least any of high-temperature fluid, a resistance heater, and a lamp heater in the removing step. The second solidified film can be heated suitably.

It is preferred in the aspect of the substrate treating method described above that sublimable substance has a vapor pressure of 100 Pa or less at room temperature. When the sublimable substance has a vapor pressure of 100 Pa or less, the vapor pressure of the sublimable substance is relatively low. Inventors have found that, when the vapor pressure of the sublimable substance is relatively low, the second solidified film is harder to be sublimated than the first solidified film. As described above, the substrate treating method includes the removing step in addition to the sublimation step. Accordingly, with the substrate treating method, the second solidified film can be removed from the substrate suitably even when the second solidified film is hard to be sublimated. Consequently, the substrate can be treated efficiently with the substrate treating method even when the vapor pressure of the sublimable substance is 100 Pa or less. In other words, the substrate treating method produces a significantly large effect when the vapor pressure of the sublimable substance is 100 Pa or less.

It is preferred in the aspect of the substrate treating method described above that the sublimable substance contains at least one selected from pinacolone oxime, acetophenone oxime, cyclopentanone oxime, and 4-tert-butylphenol. This can perform appropriate treatment to the substrate. That is, with the substrate treating method described above, the secondary object can be achieved in addition to the primary object.

Specifically, when the sublimable substance contains pinacolone oxime, the substrate treating method described above can perform appropriate treatment to the substrate. Here, the Inventors has found the following features Fa1) and Fa2).

Fa1) Pinacolone oxime has an attribute to be sublimable while protecting the patterns on the substrate.

Fa2) Pinacolone oxime is suitable for use in the substrate treating method and the treatment liquid from the attribute described in the above feature Fa1).

When the sublimable substance contains acetophenone oxime, the substrate treating method described above can perform appropriate treatment to the substrate. Here, the Inventors has found the following features Fb1) and Fb2).

Fb1) Acetophenone oxime has an attribute to be sublimable while protecting the patterns on the substrate.

Fb2) Acetophenone oxime is suitable for use in the substrate treating method and the treatment liquid from the attribute described in the above feature Fb1).

When the sublimable substance contains cyclopentanone oxime, the substrate treating method described above can perform appropriate treatment to the substrate. Here, the Inventors has found the following features Fc1) and Fc2).

Fc1) Cyclopentanone oxime has an attribute to be sublimable while protecting the patterns on the substrate.

Fc2) Cyclopentanone oxime is suitable for use in the substrate treating method and the treatment liquid from the attribute described in the above feature Fc1).

When the sublimable substance contains 4-tert-butylphenol, the substrate treating method described above can perform appropriate treatment to the substrate. Here, the Inventors has found the following features Fd1) and Fd2).

Fd1) 4-tert-butylphenol has an attribute to be sublimable while protecting the patterns on the substrate.

Fd2) 4-tert-butylphenol is suitable for use in the substrate treating method and the treatment liquid from the attribute described in the above feature Fd1).

The present invention is constituted as stated below to achieve the second object. Another aspect of the present invention provides a substrate treating method for performing treatment on a substrate on which a pattern is formed. The substrate treating method includes: a treatment liquid supplying step of supplying a treatment liquid, containing a sublimable substance and a solvent, to the substrate; a solidified film forming step of forming a solidified film containing the sublimable substance on the substrate by evaporating the solvent from the treatment liquid on the substrate; and a sublimation step of sublimating the solidified film, and the sublimable substance contains at least one selected from pinacolone oxime, acetophenone oxime, cyclopentanone oxime, and 4-tert-butylphenol.

With the substrate treating method, the substrate on which the pattern is formed is treated. Specifically, the substrate treating method includes a treatment liquid supplying step, a solidified film forming step, and a sublimation step. In the treatment liquid supplying step, the treatment liquid is supplied to the substrates. The treatment liquid contains the sublimable substance and the solvent. In the solidified film forming step, the solvent evaporates from the treatment liquid on the substrate. In the solidified film forming step, the solidified film is formed on the substrate. The solidified film contains the sublimable substance. In the sublimation step, the solidified film sublimates.

The sublimable substance contains at least one selected from pinacolone oxime, acetophenone oxime, cyclopentanone oxime, and 4-tert-butylphenol. Accordingly, the substrate treating method according to the aspect of the present invention can perform suitable treatment on substrates. Specifically, the substrate can be treated appropriately while the pattern formed on the substrate is protected with the substrate treating method.

The present invention is constituted as stated below to achieve the second object. Another aspect of the present invention provides a treatment liquid used for performing treatment on a substrate on which a pattern is formed, the treatment liquid containing a sublimable substance and a solvent, and the sublimable substance contains at least one selected from pinacolone oxime, acetophenone oxime, cyclopentanone oxime, and 4-tert-butylphenol.

The treatment liquid is used for treating the substrate on which the patterns are formed. Specifically, the treatment liquid is a treatment liquid for use in treating substrates. Specifically, the treatment liquid is a treatment liquid for use in drying substrates.

The treatment liquid contains the sublimable substance and the solvent. The sublimable substance contains at least one selected from pinacolone oxime, acetophenone oxime, cyclopentanone oxime, and 4-tert-butylphenol. Accordingly, the substrate can be treated appropriately with use of the treatment liquid. Specifically, the substrate can be treated appropriately with use of the treatment liquid while the pattern formed on the substrate is protected.

It is preferred in the treatment liquid described above that the solvent is isopropyl alcohol. The substrate can be treated more appropriately with use of the treatment liquid.

Advantageous Effects of Invention

The substrates can be treated efficiently with the substrate treating method the according to the present invention. The substrates can be treated appropriately with the substrate treating method and the treatment liquid according to the present invention.

BRIEF DESCRIPTION OF DRAWINGS

FIG. 10 is a table showing evaluations of substrates treated in first to fourth experimental examples.

FIG. 27 is a table showing evaluations of substrates treated in experimental examples 5a and 5b and comparative examples 1a, 1b, 2a, and 2b.

FIG. 28 is a table showing evaluations of substrates treated in comparative examples 3a, 3b, 4a, 4b, 5a, 6a, and 7a.

DESCRIPTION OF EMBODIMENTS

The following describes a substrate treating method and a treatment liquid of the present invention with reference to the drawings.

1. First Embodiment

1-1. Outline of Substrate Treating Apparatus

Figure 1:
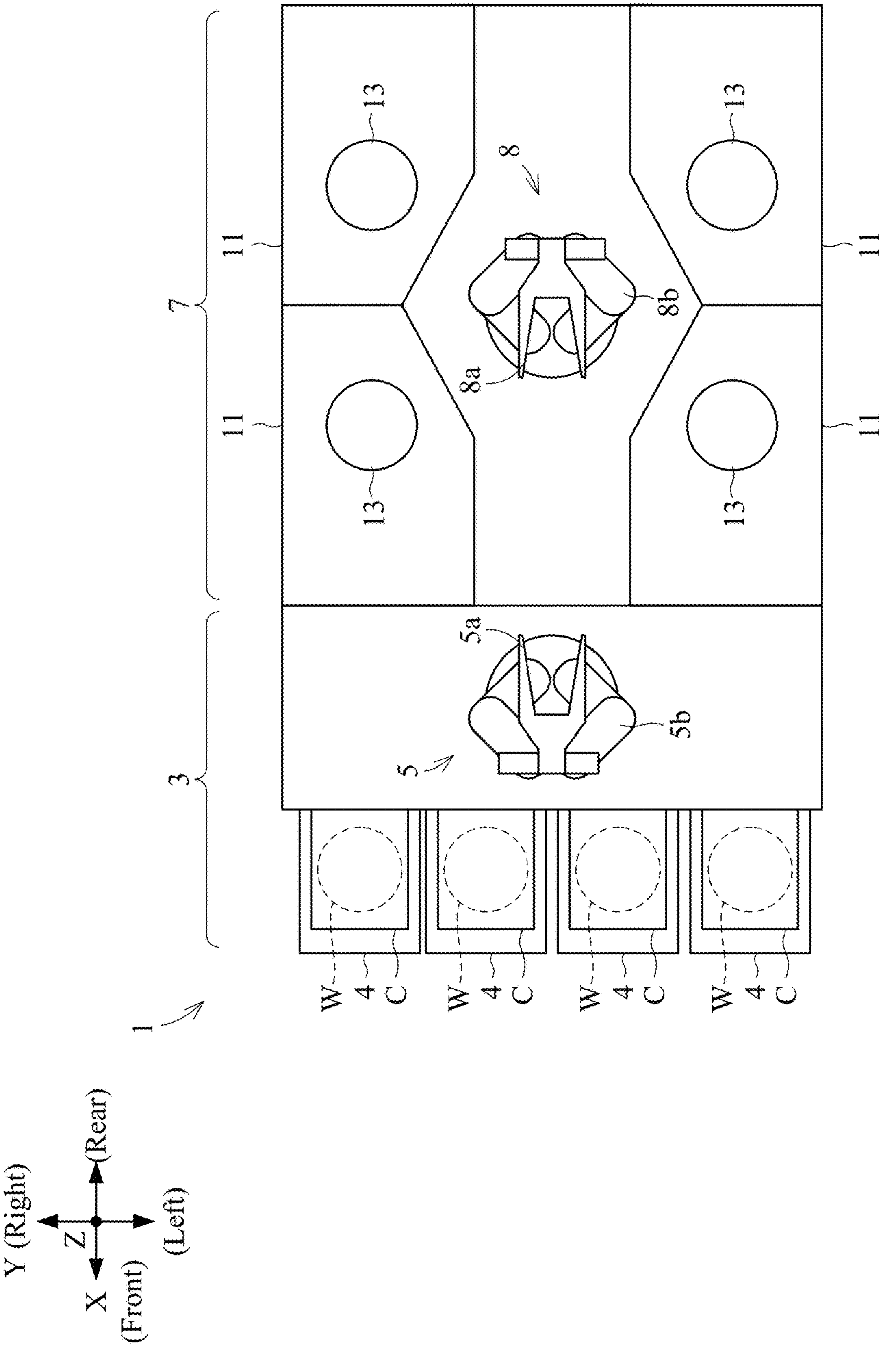
FIG. 1 is a plan view of an interior of a substrate treating apparatus according to a first embodiment.

FIG. 1 is a plan view of an interior of a substrate treating apparatus 1 according to the first embodiment. The substrate treating apparatus 1 performs treatment on a substrate W. The treatment performed on the substrate W includes a drying treatment.

Examples of the substrate W include a semiconductor wafer, a substrate for liquid crystal display, a substrate for organic electroluminescence (EL), a substrate for flat panel display (FPD), a substrate for optical display, a magnetic disk substrate, an optical disk substrate, a magneto-optical disk substrate, a substrate for photomask, and a solar cell substrate. The substrate W has a thin and flat plate shape. The substrate W has a substantially circular shape in plan view.

The substrate treating apparatus 1 includes an indexer 3, and a treating block 7. The treating block 7 is connected to the indexer 3. The indexer 3 supplies a substrate W to the treating block 7. The treating block 7 performs a treatment to the substrate W. The indexer 3 collects the substrate W from the treating block 7.

In this specification, the direction in which the indexer 3 and the treating block 7 are arranged is referred to as a "front-back direction X" for convenience. The front-back direction X is horizontal. One direction of the front-back direction X from the treating block 7 to the indexer 3 is referred to as a "forward direction". The direction opposite to the forward direction is referred to as a "rearward direction". A horizontal direction orthogonal to the front-back direction X is referred to as a "transverse direction Y". Moreover, one direction of the transverse direction Y is referred to as an "rightward direction", as appropriate. The direction opposite to the rightward direction is referred to as a "leftward direction". The perpendicular direction relative to the horizontal direction is referred to as a "vertical direction Z". For reference, the drawings show front, rear, right, left, up, and down, as appropriate.

The indexer 3 includes a plurality of (e.g., four) carrier platforms 4. The carrier platforms 4 each include one carrier C placed thereon. The carrier C accommodates a plurality of substrates W. The carrier C is, for example, a front opening unified pod (FOUP), a standard mechanical interface (SMIF), or an open cassette (OC).

The indexer 3 includes a transport mechanism 5. The transport mechanism 5 is arranged rearward of the carrier platforms 4. The transport mechanism 5 transports substrates W. The transport mechanism 5 can access the carriers C placed on the carrier platforms 4, respectively. The transport mechanism 5 includes a hand 5*a* and a hand driving unit 5*b*. The hand 5*a* supports a substrate W. The hand driving unit 5*b* is coupled to the hand 5*a*. The hand driving unit 5*b* moves the hand 5*a*. The hand driving unit 5*b* moves the hand 5*a* in the front-back direction X, transverse direction Y, and vertical direction Z, for example. The hand driving unit 5*b* rotates the hand 5*a* in a horizontal plane, for example.

The treating block 7 includes a transport mechanism 8. The transport mechanism 8 transports substrates W. The substrates W can be delivered between the transport mechanism 5 and the transport mechanism 8. The transport mechanism 8 includes a hand 8*a* and a hand driving unit 8*b*. The hand 8*a* supports a substrate W. The hand driving unit 8*b* is coupled to the hand 8*a*. The hand driving unit 8*b* moves the hand 8*a*. The hand driving unit 8*b* moves the hand 8*a* in the front-back direction X, transverse direction Y, and vertical direction Z, for example. The hand driving unit 8*b* rotates the hand 8*a* in a horizontal plane, for example.

The treating block 7 includes a plurality of treating units 11. The treating units 11 are arranged laterally of the transport mechanism 8. The treating units 11 each perform treatment on a substrate W individually.

The treating unit 11 includes a substrate holder 13. The substrate holder 13 holds a substrate W.

The transport mechanism 8 can access the treating units 11 individually. The transport mechanism 8 can deliver the substrate W onto the substrate holder 13. The transport mechanism 8 can take the substrate W from the substrate holder 13.

Figure 2:
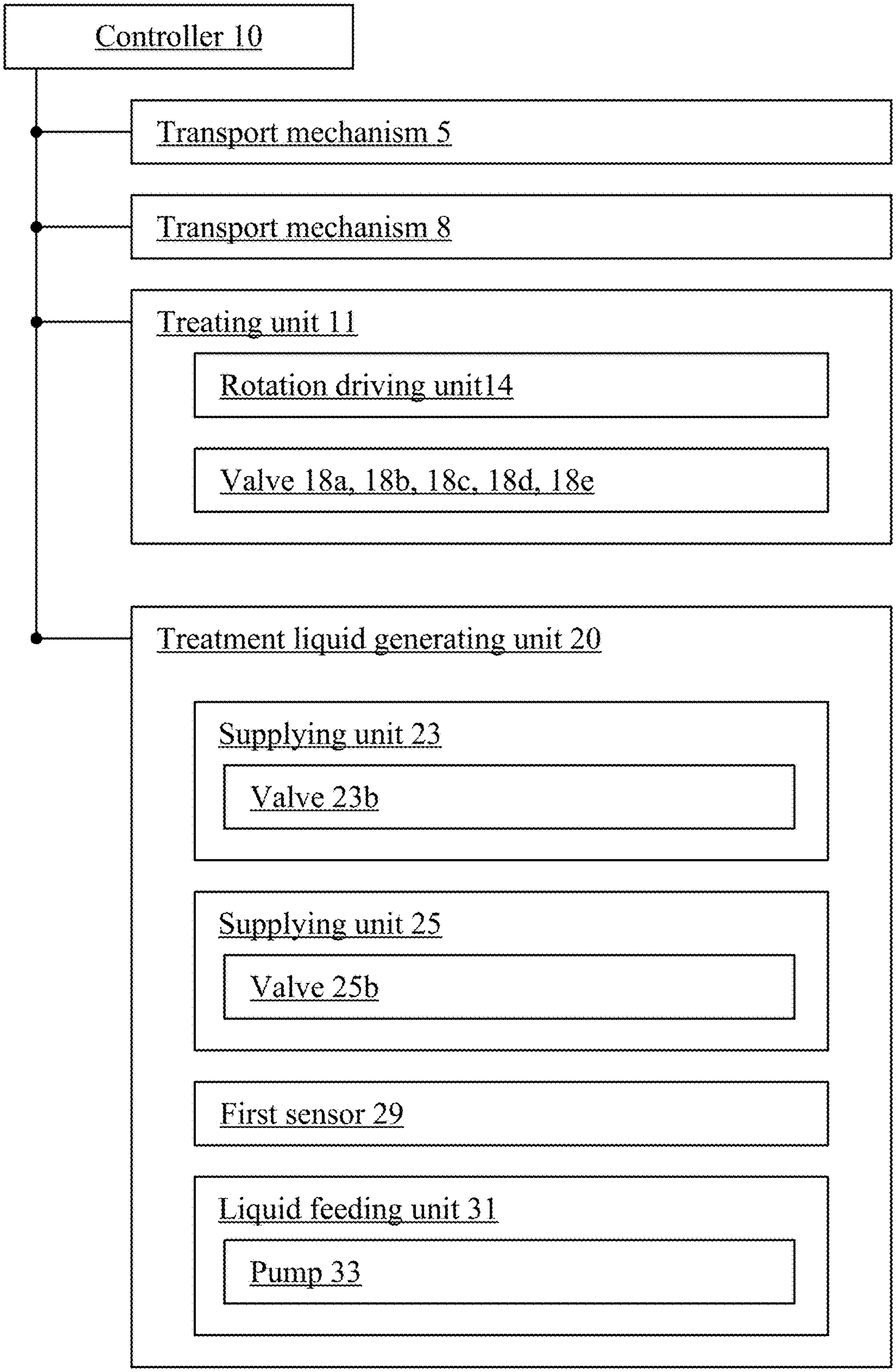
FIG. 2 is a control block diagram of the substrate treating apparatus.

FIG. 2 is a control block diagram of the substrate treating apparatus 1. The substrate treating apparatus 1 includes a controller 10. The controller 10 controls the transport mechanisms 5, 8 and the treating units 11.

The controller 10 is implemented by a central processing unit (CPU) that performs various processes, a random-access memory (RAM) as a workspace of arithmetic processing, and a storage medium such as a fixed disk. The controller 10 contains various types of information stored in a storage medium in advance. The information stored in the controller 10 includes transportation information for controlling the transport mechanisms 5, 8, for example. The information stored in the controller 10 includes processing information for controlling the treating units 11, for example. The processing information is also called processing recipes.

The following simply describes one example of operation of the substrate treating apparatus 1.

The indexer 3 supplies a substrate W to the treating block 7. Specifically, the transport mechanism 5 delivers the substrates W from the carrier C to the transport mechanism 8 of the treating block 7.

The treating block 7 distributes the substrates W from the indexer 3 to the treating units 11. Specifically, the transport mechanism 8 transports the substrates W from the transport mechanism 5 to the substrate holders 13 of each of the treating units 11.

The treating unit 11 performs treatment on a substrate W held by the substrate holder 13. The treating unit 11 performs a drying treatment, for example, on the substrate W.

After the treating unit 11 performs treatment on the substrate W, the treating block 7 returns the substrate W from the treating unit 11 to the indexer 3. Specifically, the transport mechanism 8 transports the substrate W from the substrate holder 13 to the transport mechanism 5.

The indexer 3 collects the substrate W from the treating block 7. Specifically, the transport mechanism 5 transports the substrate W from the transport mechanism 8 to the carrier C.

1-2. Construction of Treating Unit 11

Figure 3:
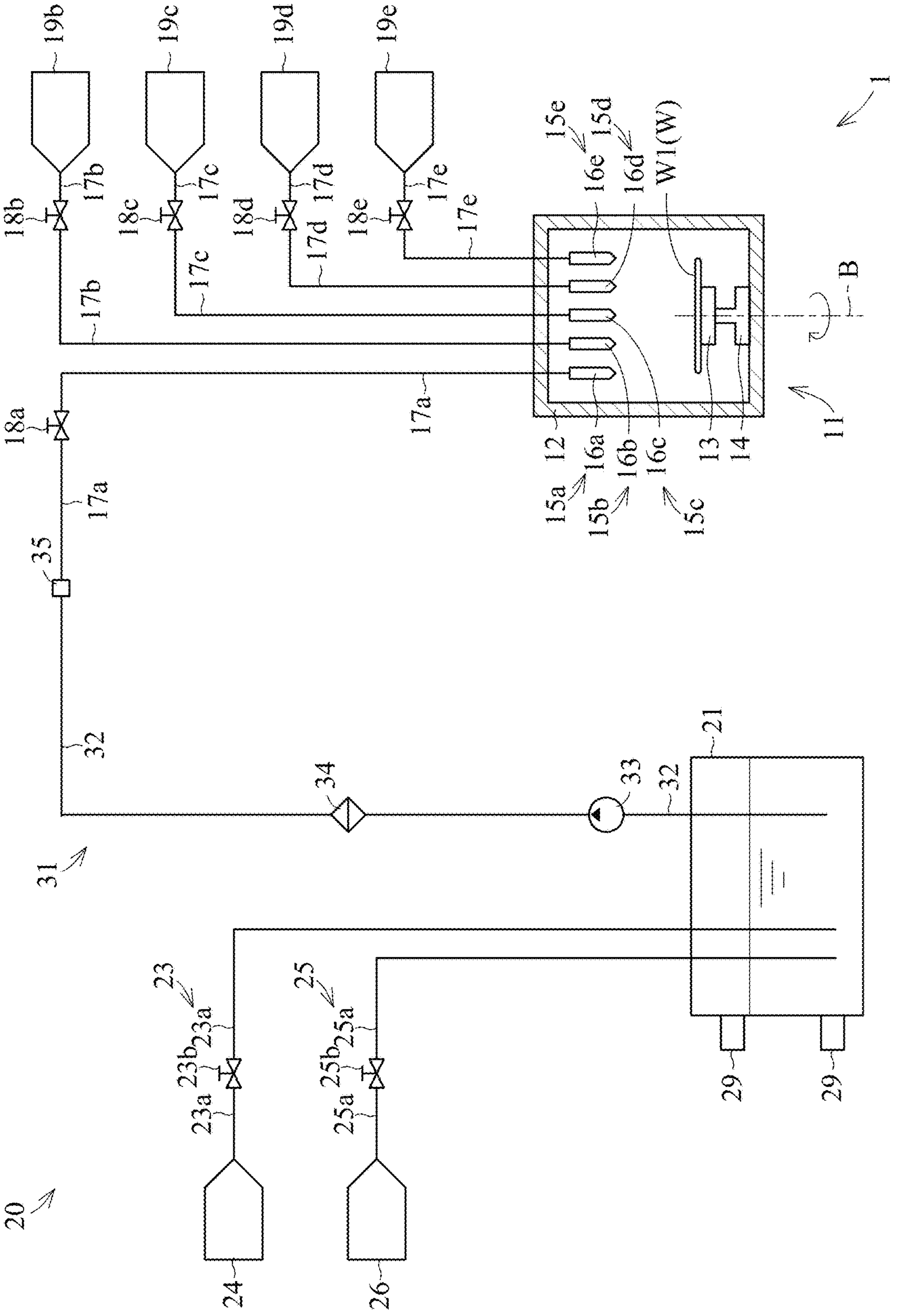
FIG. 3 shows a construction of a treating unit and a treatment liquid generating unit according to the first embodiment.

FIG. 3 shows the construction of the treating unit 11. The treating units 11 each have the same construction. The treating unit 11 is classified as a single-wafer processing unit. That is, the treating units 11 each perform treatment on only one substrate W at one time.

The treating units 11 each include a casing 12. The casing 12 has a substantial box shape. The substrates W are treated within the casing 12.

The interior of the casing 12 is kept at room temperature in the first embodiment. The interior of the casing 12 is kept at normal pressure. Accordingly, substrates W are treated under an environment of room temperature and normal pressure. Here, the room temperature includes an ambient temperature. The room temperature falls within a temperature range of 5 to 35 degrees centigrade, for example. The room temperature falls within a temperature range of 10 to 30 degrees centigrade, for example. The room temperature falls within a temperature range of 20 to 25 degrees centigrade, for example. The normal pressure includes normal atmospheric pressure (1 atm, 101325 Pa). The normal pressure falls within a pressure range of 0.7 to 1.3 atm, for example. In the present specification, pressure is indicated as absolute pressure relative to absolute vacuum.

The substrate holder 13 described above is arranged inside of the casing 12. The substrate holder 13 holds one substrate W. The substrate holder 13 holds the substrate W in a substantially horizontal posture. For example, the substrate holder 13 hold at least either a lower surface of the substrate W or an edge of the substrate W. The lower surface of the substrate W is also called a back side of the substrate W.

The treating units 11 each include a rotation driving unit 14. At least part of the rotation driving unit 14 is located inside of the casing 12. The rotation driving unit 14 is connected to the substrate holder 13. The rotation driving unit 14 rotates the substrate holder 13. The substrate W held by the substrate holder 13 rotates integrally with the substrate holder 13. The substrate W held by the substrate holder 13 rotates around a rotation axis B. A rotation axis B passes through the center of the substrate W and extends in the vertical direction Z, for example.

The treating units 11 each include one or more (e.g., five) supplying units 15*a*, 15*b*, 15*c*, 15*d*, and 15*e*. The supplying units 15*a* to 15*e* each dispense a liquid or gas to a substrate W. More specifically, the supplying units 15*a* to 15*e* each dispense a liquid or gas to the substrate W held by the substrate holder 13. The supplying units 15*a* to 15*e* each dispense a liquid or gas to an upper surface W1 of the substrate W held by the substrate holder 13.

Specifically, the supplying unit 15*a* supplies a treatment liquid. The treatment liquid contains a sublimable substance and a solvent.

As described above, the interior of the casing 12 is kept at room temperature and normal pressure. Accordingly, the treatment liquid is used under an environment of room temperature. The treatment liquid is used under an environment of normal pressure.

The supplying unit 15*b* supplies a chemical liquid. The chemical liquid is, for example, an etchant. The chemical liquid includes, for example, at least either hydrofluoric acid (HF) or buffered hydrofluoric acid (BHF).

The supplying unit 15*c* supplies a rinse liquid. The rinse liquid is, for example, deionized water (DIW).

The supplying unit 15*d* supplies a replacement liquid. The replacement liquid is, for example, an organic solvent. The replacement liquid is, for example, isopropyl alcohol (IPA).

The supplying unit 15*e* supplies first gas. The first gas is, for example, dry gas. The dry gas has a dew point lower than room temperature. The dew point is, for example, approximately −76 degrees centigrade. Accordingly, the dry gas does not dew at room temperature. The first gas is, for example, air. The first gas is, for example, compressed air. The first gas is, for example, inert gas. The first gas is, for example, nitrogen gas.

The supplying unit 15*a* includes a nozzle 16*a*. Likewise, the supplying units 15*b* to 15*e* include nozzles 16*b* to 16*e*, respectively. The nozzles 16*a* to 16*e* are each located inside of the casing 12. The nozzle 16*a* dispenses the treatment liquid. The nozzle 16*b* dispenses the chemical liquid. The nozzle 16*c* dispenses the rinse liquid. The nozzle 16*d* dispenses the replacement liquid. The nozzle 16*e* dispenses the first gas. The nozzle 16*e* blows out the first gas.

The nozzles 16*a* to 16*e* are each movable between a treating position and a standby position. The treating position is, for example, a position above the substrate W held by the substrate holder 13. The treating position is, for example, a position above the center of the substrate W held by the substrate holder 13. The center of the substrate W intersects the rotation axis B. The standby position is, for example, a position apart from the substrate W held by the substrate holder 13.

The supplying unit 15*a* includes a pipe 17*a*. The pipe 17*a* is connected to the nozzle 16*a*. Likewise, the supplying units 15*b* to 15*e* include pipes 17*b* to 17*e*, respectively. The pipes 17*b* to 17*e* are connected to the nozzles 16*b* to 16*e*, respectively.

The supplying unit 15*a* includes a valve 18*a*. The valve 18*a* is provided on the pipe 17*a*. When the valve 18*a* opens, the nozzle 16*a* dispenses the treatment liquid. When the valve 18*b* closes, the nozzle 16*a* does not dispense the treatment liquid. Likewise, the supplying units 15*b* to 15*e* include valves 18*b* to 18*e*, respectively. The valves 18*b* to 18*e* are provided on the pipes 17*b* to 17*e*, respectively. The valves 18*b* to 18*e* each control supply of the chemical liquid, the rinse liquid, the replacement liquid, and the first gas, respectively.

At least part of the pipe 17*a* may be provided externally of the casing 12. The same arrangement of the pipe 17*a* is applicable to arrangement of the pipes 17*b* to 17*e*. The valve 18*a* may be provided externally of the casing 12. The same arrangement of the valve 18*a* is applicable to arrangement of the valves 18*b* to 18*e*.

The substrate treating apparatus 1 includes a treatment liquid generating unit 20. The treatment liquid generating unit 20 generates the treatment liquid.

The treatment liquid generating unit 20 is provided externally of the casing 12. The treatment liquid generating unit 20 is connected to the supplying unit 15*a*. The treatment liquid generating unit 20 is in fluid communication with the supplying unit 15*a*. The treatment liquid generating unit 20 is connected to the pipe 17*a*, for example. The treatment liquid generating unit 20 feeds the treatment liquid to the supplying unit 15*a*.

The supplying unit 15*b* is connected to a chemical liquid supplying source 19*b*. The supplying unit 15*b* is in fluid communication with the chemical liquid supplying source 19*b*. The chemical liquid supplying source 19*b* is connected to the pipe 17*b*, for example. The chemical liquid supplying source 19*b* feeds the chemical liquid to the supplying unit 15*b*.

The supplying unit 15*c* is connected to a rinse liquid supplying source 19*c*. The supplying unit 15*c* is in fluid communication with the rinse liquid supplying source 19*c*. The rinse liquid supplying source 19*c* is connected to the pipe 17*c*, for example. The rinse liquid supplying source 19*c* feeds the rinse liquid to the supplying unit 15*c*.

The supplying unit 15*d* is connected to a replacement liquid supplying source 19*d*. The supplying unit 15*d* is in fluid communication with the replacement liquid supplying source 19*d*. The replacement liquid supplying source 19*d* is connected to the pipe 17*d*, for example. The replacement liquid supplying source 19*d* feeds the replacement liquid to the supplying unit 15*d*.

The supplying unit 15*e* is connected to a first gas supplying source 19*e*. The supplying unit 15*e* is in fluid communication with a first gas supplying source 19*e*. The first gas supplying source 19*e* is connected to the pipe 17*e*, for example. The first gas supplying source 19*e* feeds the first gas to the supplying unit 15*e*.

Here, the treatment liquid generating unit 20 may supply the treatment liquid to a plurality of treating units 11. Alternatively, the treatment liquid generating unit 20 may feed the treatment liquid to only one treating unit 11. The same is applicable to the chemical liquid supplying source 19*b*, the rinse liquid supplying source 19*c*, the replacement liquid supplying source 19*d*, and the first gas supplying source 19*e*.

The chemical liquid supplying source 19*b* may be an element of the substrate treating apparatus 1. For example, the chemical liquid supplying source 19*b* may be a chemical liquid tank included in the substrate treating apparatus 1. Alternatively, the chemical liquid supplying source 19*b* may not be an element of the substrate treating apparatus 1. For example, the chemical liquid supplying source 19*b* may be a utility facility located externally of the substrate treating apparatus 1. Likewise, the rinse liquid supplying source 19*c*, the replacement liquid supplying source 19*d*, and the first gas supplying source 19*e* each may be an element of the substrate treating apparatus 1. Alternatively, the rinse liquid supplying source 19*c*, the replacement liquid supplying source 19*d*, and the first gas supplying source 19*e* each may not be an element of the substrate treating apparatus 1.

The treating units 11 may each further have a cup, not shown. The cup is located inside of the casing 12. The cup is arranged around the substrate holder 13. The cup receives liquid scattered from the substrate W held by the substrate holder 13.

Reference is made to FIG. 2. The controller 10 controls the rotation driving unit 14, and the valves 18*a* to 18*e*.

1-3. Treatment Liquid

The following describes a treatment liquid generated by the treatment liquid generating unit 20. The treatment liquid contains a sublimable substance and a solvent. The treatment liquid constitutes only a sublimable substance and a solvent, for example.

The sublimable substance has sublimability. "Sublimability" means a property that a single substance, a chemical compound or a mixture changes its phase from a solid phase to a gas phase or from a gas phase to a solid phase without passing through a liquid phase.

The sublimable substance contains, for example, at least one selected from the following chemical compounds a, b, c, and d.

Chemical compound a: pinacolone oxime
Chemical compound b: acetophenone oxime
Chemical compound c: cyclopentanone oxime
Chemical compound d: 4-tert-butylphenol The sublimable substance consists of, for example, at least one selected from the chemical compounds a, b, c, and d. In other words, the sublimable substance corresponds to any one selected from the chemical compounds a, b, c, and d.

The sublimable substance corresponds to, for example, two or more selected from the chemical compounds a, b, c, and d. The sublimable substance consists of, for example, two or more selected from the chemical compounds a, b, c, and d. For example, the sublimable substance corresponds to any two selected from the chemical compounds a, b, c, and d. For example, the sublimable substance consists of any two selected from the chemical compounds a, b, c, and d. For example, the sublimable substance corresponds to any three selected from the chemical compounds a, b, c, and d. For example, the sublimable substance consists of any three selected from the chemical compounds a, b, c, and d. For example, the sublimable substance corresponds to the chemical compounds a, b, c, and d. For example, the sublimable substance consists of the chemical compounds a, b, c, and d.

The solvent is liquid at room temperature. The solvent dissolves the sublimable substance. Accordingly, the sublimable substance in the treatment liquid is dissolved in the solvent. That is, the treatment liquid contains the solvent and the sublimable substance dissolved in the solvent. The sublimable substance corresponds to a solute in the treatment liquid.

The solvent has a relatively high vapor pressure at room temperature. For example, it is preferred that a vapor pressure of the solvent at room temperature is higher than a vapor pressure of the sublimable substance at room temperature.

The solvent is, for example, an organic solvent. The solvent is, for example, alcohol.

The solvent contains, for example, at least one selected from the following chemical compounds e1 to e10.

Chemical compound e1: isopropyl alcohol (IPA)
Chemical compound e2: acetone
Chemical compound e3: methanol
Chemical compound e4: ethanol
Chemical compound e5: tert-butanol
Chemical compound e6: 1-propanol
Chemical compound e7: isobutanol
Chemical compound e8: 1-ethoxy-2-propanol
Chemical compound e9: 1-butanol
Chemical compound e10: propylene glycol monomethyl ether acetate The volume of the sublimable substance contained in the treatment liquid is smaller than the volume of the solvent contained in the treatment liquid. For example, it is preferred that a volume ratio RV of the sublimable substance to the solvent is 1 Vol % or more and 20 Vol %. Here, the volume ratio RV is defined by the following mathematical expression:

RV=(volume of sublimable substance in treatment liquid)/(volume of solvent in the treatment liquid)*100 [Vol %].

1-4. Construction of Treatment Liquid Generating Unit 20

Reference is made to FIG. 3. The treatment liquid generating unit 20 generates a treatment liquid.

The treatment liquid generating unit 20 includes a tank 21. The tank 21 is connected to the supplying unit 15*a*. The tank 21 is in fluid communication with the supplying unit 15*a*. The tank 21 is connected to with the nozzle 16*a*. The tank 21 is in fluid communication with the nozzle 16*a*. In the first embodiment, the treatment liquid generating unit 20 generates the treatment liquid in the tank 21. The treatment liquid is generated under an environment of room temperature. The treatment liquid is generated under an environment of normal pressure.

The treatment liquid generating unit 20 stores the generated treatment liquid in the tank 21. The treatment liquid is stored in the tank 21. The treatment liquid is stored under an environment of room temperature. The treatment liquid is stored under an environment of normal pressure.

The treatment liquid generating unit 20 includes a supplying unit 23 and a supplying unit 25. The supplying unit 23 supplies the sublimable substance to the tank 21. The supplying unit 25 supplies the solvent to the tank 21. The sublimable substance and the solvent are mixed within the tank 21. This results in generation of a treatment liquid containing the sublimable substance and the solvent.

The supplying unit 23 is connected to the tank 21. The supplying unit 23 is in fluid communication with the tank 21. The supplying unit 23 is also connected to a sublimable substance supplying source 24. The supplying unit 23 is also in fluid communication with the sublimable substance supplying source 24. The sublimable substance supplying source 24 feeds the sublimable substance to the supplying unit 23.

The supplying unit 23 includes a pipe 23*a* and a valve 23*b*, for example. The pipe 23*a* has a first end connected to the tank 21, and a second end connected to the sublimable substance supplying source 24. The first end of the pipe 23*a* is in fluid communication with the tank 21. The second end of the pipe 23*a* is in fluid communication with the sublimable substance supplying source 24. The valve 23*b* is provided on the pipe 23*a*. When the valve 23*b* is opened, the supplying unit 23 supplies the sublimable substance to the tank 21. When the valve 23*b* is closed, the supplying unit 23 does not supply the sublimable substance to the tank 21.

The supplying unit 25 is connected to the tank 21. The supplying unit 25 is in fluid communication with the tank 21. The supplying unit 25 is also connected to a solvent supplying source 26. The supplying unit 25 is also in fluid communication with the solvent supplying source 26. The solvent supplying source 26 feeds the solvent to the supplying unit 25.

The supplying unit 25 includes a pipe 25*a* and a valve 25*b*, for example. The pipe 25*a* has a first end connected to the tank 21, and a second end connected to the solvent supplying source 26. The first end of the pipe 25*a* is in fluid communication with the tank 21. The second end of the pipe 25*a* is in fluid communication with the solvent supplying source 26. The valve 25*b* is provided on the pipe 25*a*. When the valve 25*b* is opened, the supplying unit 25 supplies the solvent to the tank 21. When the valve 25*b* is closed, the supplying unit 25 does not supply the solvent to the tank 21.

The treatment liquid generating unit 20 includes at least one or more (e.g., two) first sensors 29. The first sensor 29 detects an amount of the treatment liquid stored in the tank 21. The first sensor 29 is attached to the tank 21, for example. The first sensor 29 detects a height position of a liquid level of the treatment liquid stored in the tank 21, for example. The first sensor 29 is, for example, a liquid level sensor.

The treatment liquid generating unit 20 includes a liquid feeding unit 31. The liquid feeding unit 31 feeds the treatment liquid from the tank 21 to the supplying unit 15*a*.

The liquid feeding unit 31 includes a pipe 32, a pump 33, a filter 34, and a joint 35, for example. The pipe 32 is connected to the tank 21. The pipe 32 is in fluid communication with the tank 21. The pump 33 is provided on the pipe 32. The filter 34 is provided on the pipe 32. The joint 35 is connected to the pipe 32. The joint 35 is also connected to the pipe 17*a*. The pipes 32 and 17*a* are in fluid communication with each other via the joint 35.

The pump 33 feeds the treatment liquid from the tank 21 to the pipe 17*a* through the pipe 17*a* and the joint 35. Thereby, the pump 33 feeds the treatment liquid from the tank 21 to the supplying unit 15*a*. The filter 34 filters the treatment liquid that flows in the pipe 17*a*. The filter 34 removes foreign substances from the treatment liquid.

Reference is made to FIG. 2. The controller 10 controls the treatment liquid generating unit 20. The controller 10 is communicably and electrically connected to the treatment liquid generating unit 20.

The controller 10 controls the supplying unit 23, the supplying unit 25, and the liquid feeding unit 31. The controller 10 controls the valves 23*b* and 25*b*, and the pump 33.

The controller 10 obtains detection results of the first sensor 29.

The controller 10 contains treatment liquid generating information for controlling the treatment liquid generating unit 20. The treatment liquid generating information is stored in advance in the storage medium of the controller 10.

<1-5. Operation Example of Treatment Liquid Generating Unit 20 and Treating Unit 11>

Figure 4:
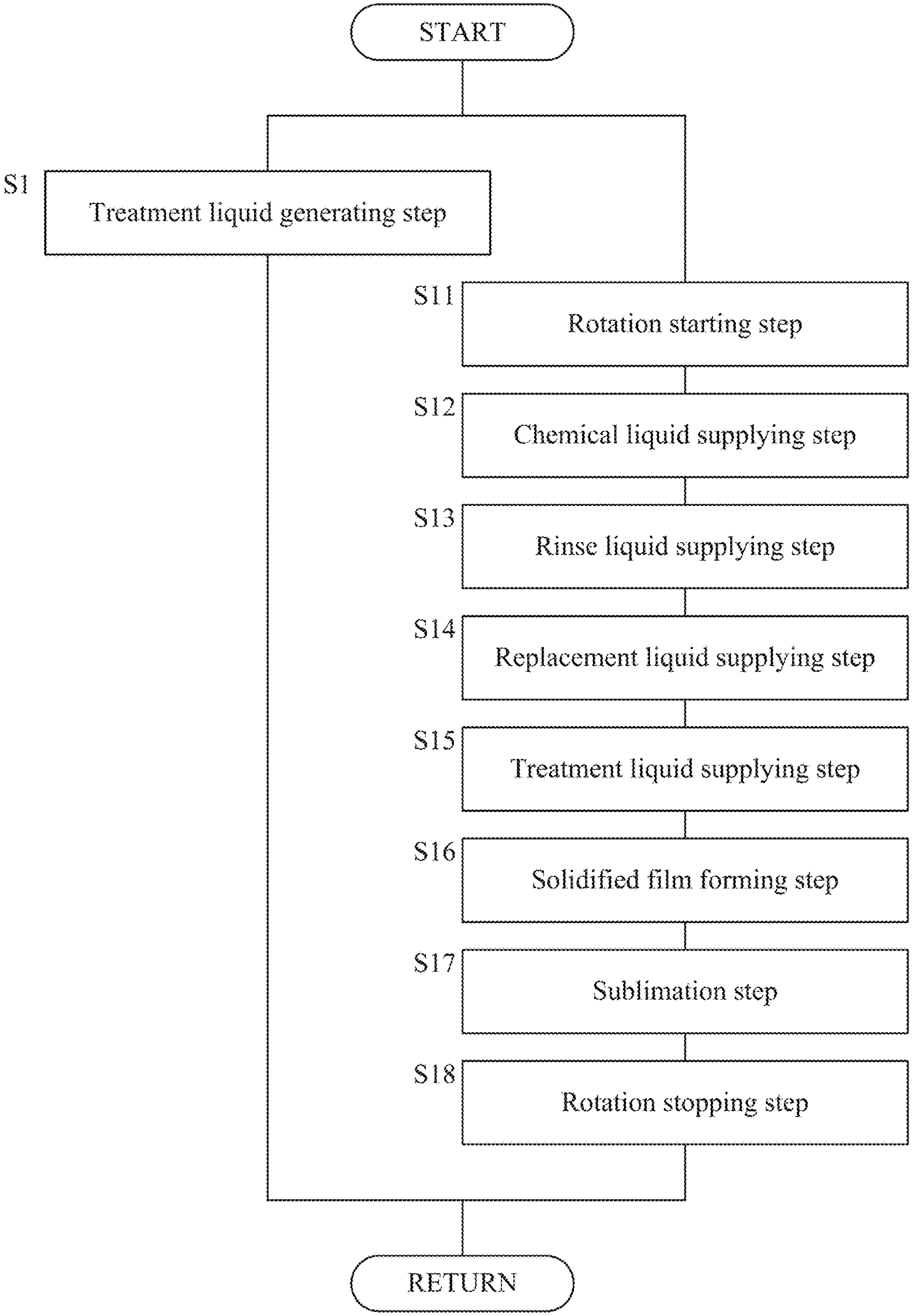
FIG. 4 is a flow chart showing procedures of a substrate treating method according to the first embodiment.

FIG. 4 is a flow chart showing procedures of a substrate treating method according to the first embodiment. The substrate treating method includes a Step S1 and Steps S11 to S18. The treatment liquid generating unit 20 performs the Step S1. The treating units 11 substantially perform the Steps S11 to S18. The Step S1 is performed in parallel with the Steps S11 to S18. The treatment liquid generating unit 20 and the treating units 11 operate in accordance with control by the controller 10.

Step S1: Treatment Liquid Generating Step

The treatment liquid generating unit 20 generates a treatment liquid. Specifically, the supplying unit 23 supplies the sublimable substance to the tank 21. The supplying unit 25 supplies the solvent to the tank 21. Accordingly, the treatment liquid is generated in the tank 21. Then, the treatment liquid is stored in the tank 21.

The first sensor 29 detects an amount of the treatment liquid stored in the tank 21. The controller 10 monitors detection results of the first sensor 29.

The controller 10 starts and stops the treatment liquid generating step in accordance with detection results of the first sensor 29. For example, when an amount of the treatment liquid stored in the tank 21 is smaller than a first threshold, the controller 10 starts the treatment liquid generating step. Accordingly, the treatment liquid generating unit 20 starts generation of the treatment liquid. As a result, the treatment liquid stored in the tank 21 increases. For example, when an amount of the treatment liquid stored in the tank 21 is larger than a second threshold, the controller 10 stops the treatment liquid generating step. The second threshold is larger than the first threshold. Accordingly, the treatment liquid generating unit 20 stops generation of the treatment liquid. As a result, increase in treatment liquid stored in the tank 21 stops. The first threshold and the second threshold are set in advance, for example. The first threshold and the second threshold are defined in the treatment liquid generating information, for example.

Step S11: Rotation Starting Step

The substrate holder 13 holds a substrate W. The substrate W is held in a substantially horizontal posture. The rotation driving unit 14 starts to rotate the substrate holder 13. The substrate W held by the substrate holder 13 starts rotation. The Steps S12 to S17 are performed while the substrate W rotates.

Step S12: Chemical Liquid Supplying Step

The supplying unit 15*b* supplies a chemical liquid to the substrate W. Specifically, the valve 18*b* opens. The nozzle 16*b* dispenses the chemical liquid. The chemical liquid is supplied onto the upper surface W1 of the substrate W. For example, the substrate W is etched with the chemical liquid. For example, a native oxide is removed from the substrate W with the chemical liquid. Then, the supplying unit 15*b* stops supply of the chemical liquid to the substrate W.

Specifically, the valve 18*b* closes. The nozzle 16*b* stops dispensing the chemical liquid.

Step S13: Rinse Liquid Supplying Step

The supplying unit 15*c* supplies a rinse liquid to the substrate W. Specifically, the valve 18*c* opens. The nozzle 16*c* dispenses the rinse liquid. The rinse liquid is supplied onto the upper surface W1 of the substrate W. For example, the substrate W is cleaned with the rinse liquid. For example, the chemical liquid is removed from the substrate W with the rinse liquid. Then, the supplying unit 15*c* stops supply of the rinse liquid to the substrate W. Specifically, the valve 18*c* closes. The nozzle 16*c* stops dispensing the rinse liquid.

Step S14: Replacement Liquid Supplying Step

The supplying unit 15*d* supplies a replacement liquid to the substrate W. Specifically, the valve 18*d* opens. The nozzle 16*d* dispenses the replacement liquid. The replacement liquid is supplied onto the upper surface W1 of the substrate W. The rinse liquid is removed from the substrate W with the replacement liquid. This achieves replacement of the rinse liquid on the substrate W with the replacement liquid. Then, the supplying unit 15*d* stops supply of the replacement liquid to the substrate W. Specifically, the valve 18*d* closes. The nozzle 16*d* stops dispensing the replacement liquid.

Step S15: Treatment Liquid Supplying Step

The treatment liquid generating unit 20 feeds the treatment liquid, generated in the treatment liquid generating step, to the supplying unit 15*a*. Specifically, the pump 33 feeds the treatment liquid from the tank 21 to the supplying unit 15*a*. The supplying unit 15*a* supplies the treatment liquid to the substrate W. The supplying unit 15*a* supplies the treatment liquid to the upper surface W1 of the substrate W. Specifically, the valve 18*a* opens. The nozzle 16*a* dispenses the treatment liquid. The treatment liquid is supplied onto the upper surface W1 of the substrate W. The replacement liquid is removed from the substrate W with the treatment liquid. This achieves replacement of the replacement liquid on the substrate W with the treatment liquid. Then, the treatment liquid generating unit 20 stops feeding of the treatment liquid to the supplying unit 15*a*. Specifically, the pump 33 stops. The supplying unit 15*a* stops supply of the treatment liquid to the substrate W. Specifically, the valve 18*a* closes. The nozzle 16*a* stops dispensing the treatment liquid.

Figure 5:
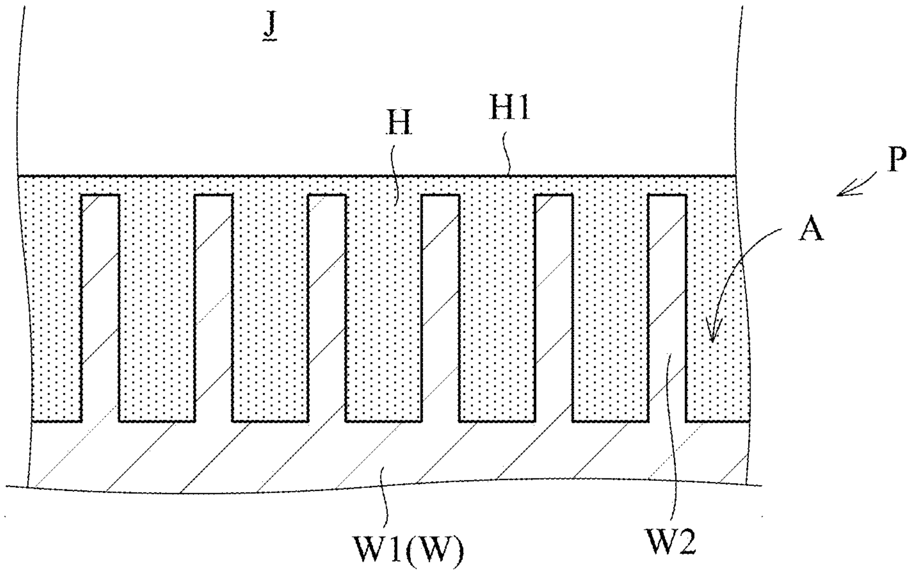
FIG. 5 schematically shows a substrate in a treatment liquid supplying step.

FIG. 5 schematically shows the substrate W in the treatment liquid supplying step. The substrate W has a pattern P. The pattern P is formed on the surface of the substrate W. When the substrate W is held by the substrate holder 13, the pattern P is positioned on the upper surface W1 of the substrate W. When the substrate W is held by the substrate holder 13, the pattern P is directed upward.

The pattern P may be formed on the substrate W before the treating unit 11 treats the substrate W, for example. The pattern P may be formed on the substrate W in the chemical liquid supplying step (Step S12), for example.

The pattern P includes projections W2 and recesses A. The projections W2 are part of the substrate W. The projections W2 are a structure. The projections W2 are each formed with a silicon oxide (SiO2) film, a silicon nitride (SiN) film, or a polysilicon film, for example. The projections W2 project upward. The recess A is laterally adjacent to the projection W2. The recess A is a space. The recess A is opened upward. The projection W2 corresponds to a wall defining the recess A.

The treatment liquid on the substrate W forms a liquid film H. The liquid film H of the treatment liquid is positioned above the upper surface W1 of the substrate W. The liquid film H covers the upper surface W1 of the substrate W.

The liquid film H has a top face H1. The top face H1 is positioned higher in level than the entire of the pattern P. The pattern P is entirely immersed in the liquid film H. The top face H1 is positioned higher in level than the entire of the projections W2. The projections W2 are entirely immersed in the liquid film H.

The recesses A are filled with the liquid film H. The recesses A are entirely filled only with the liquid film H.

Here, the replacement liquid has already been removed from the upper surface W1 of the substrate W with the treatment liquid. Consequently, there is no replacement liquid on the upper surface W1 of the substrate W. No replacement liquid remains in the recesses A.

Gas J exists above the liquid film H. The gas J contacts the top face H1. The top face H1 corresponds to a gas-liquid interface between the liquid film H and the gas J.

In the treatment liquid supplying step, a thickness of the liquid film H may be adjusted additionally. The thickness of the liquid film H corresponds to a height position of the top face H1 of the liquid film H. For example, the thickness of the liquid film H may be adjusted while the nozzle 16*a* supplies the treatment liquid H to the substrate W. For example, the thickness of the liquid film H may be adjusted after the nozzle 16*a* stops supplying the treatment liquid. For example, the thickness of the liquid film H may be adjusted by controlling a rotation speed of the substrate W. For example, the thickness of the liquid film H may be adjusted by controlling a rotation period of time of the substrate W.

Step S16: Solidified Film Forming Step

In the solidified film forming step, the solvent evaporates from the treatment liquid on the substrate W. In the solidified film forming step, the solvent evaporates from the liquid film H. The solvent changes into gas.

Here, the solvent has a relatively high vapor pressure. Accordingly, the solvent evaporates easily.

Figure 6:
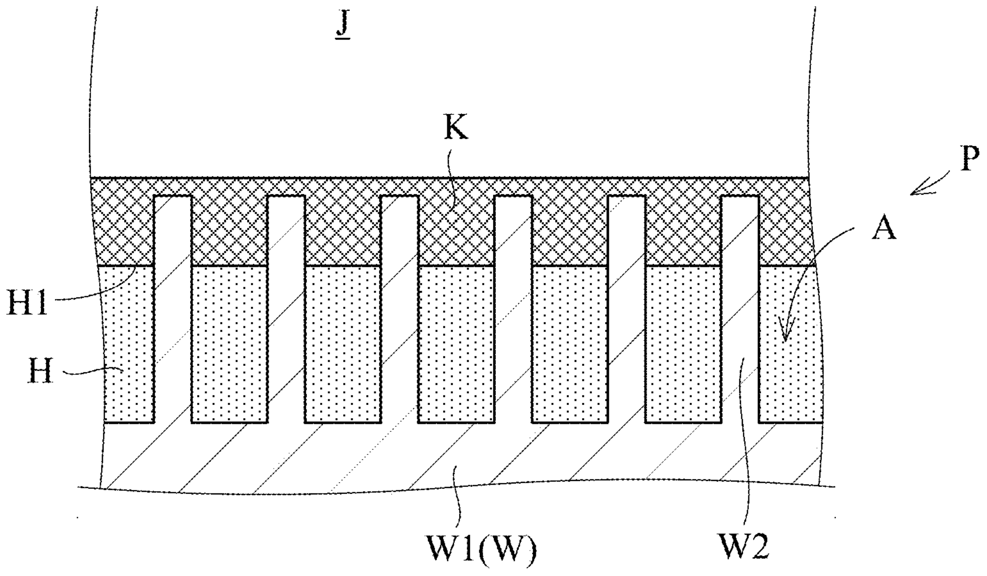
FIG. 6 schematically shows the substrate in a solidified film forming step.

FIG. 6 schematically shows the substrate W in the solidified film forming step. As the solvent evaporates from the liquid film H, the liquid film H gradually changes into a solidified film K.

Specifically, the solvent is removed from the liquid film H with evaporation of the solvent, and the solvent contained in the liquid film H decreases. The concentration of the sublimable substance in the liquid film H increases. The sublimable substance is deposited on the substrate W. That is, the sublimable substance is changed to solid from the solute of the treatment liquid forming the liquid film H. As a result, the solidified film K is formed on the substrate W. The solidified film K is formed on the upper surface W1 of the substrate W. The solidified film K contains the sublimable substance. The solidified film K contains the sublimable substance in a solid phase. The solidified film K does not contain the solvent. The solidified film K is solid.

The liquid film H gradually decreases. The solidified film K gradually increases. Firstly, an upper part of the liquid film H changes into the solidified film K. The remaining liquid film H is positioned below the solidified film K. The height position of the top face H1 of the liquid film H is gradually lowered. The solidified film K covers the top face H1 of the liquid film H.

After the solidified film K covers the top face H1 of the liquid film H, the liquid film H does not contact the gas J. The liquid film H is covered with the solidified film K, whereby a gas-liquid interface between the liquid film H and the gas J disappears. The liquid film H contacts the solidified film K. The gas J contacts the solidified film K. Accordingly, the liquid film H is reduced in the solidified film forming step without applying any significant force to the projections W2. The solvent is removed from the substrate W without applying any significant force to the projections W2. The significant force is, for example, a surface tension of the treatment liquid. The significant force is, for example, a surface tension of the solvent. The significant force is, for example, a capillary force.

Figure 7:
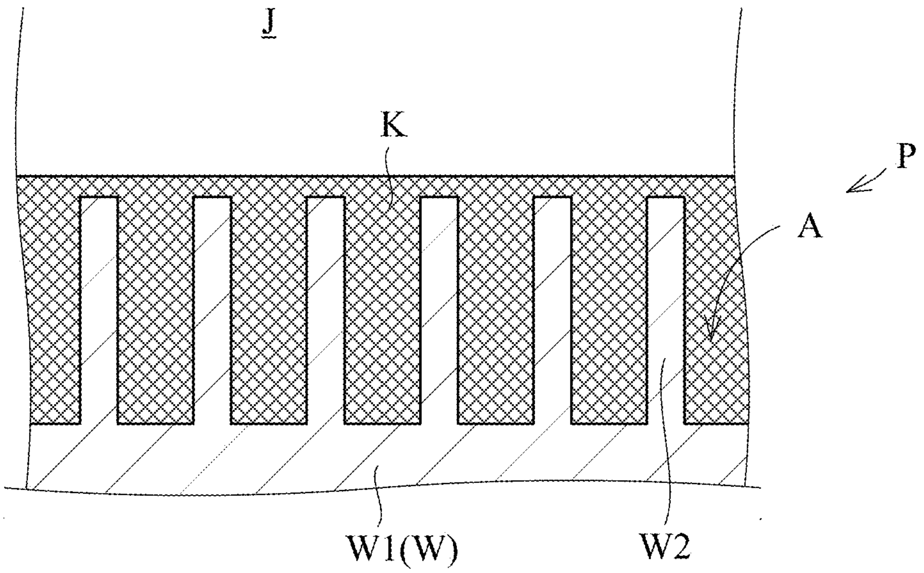
FIG. 7 schematically shows the substrate in the solidified film forming step.

FIG. 7 schematically shows the substrate W in the solidified film forming step. Finally, the liquid film H entirely disappears from the substrate W. There exists no liquid on the upper surface W1 of the substrate W. The liquid film H does not remain in the recesses A when the solidified film forming step is completed. There exists no liquid in the recesses A when the solidified film forming step is completed. The recesses A are filled with the solidified film K. The recesses A are entirely filled only with the solidified film K. The pattern P contacts the solidified film K. The pattern P does not contact any liquid. The projections W2 contact the solidified film K. The projections W2 do not contact any liquid.

Step S17: Sublimation Step

In the sublimation step, the solidified film sublimates. In the sublimation step, the supplying unit 15*e* supplies first gas to the substrate W. Specifically, the valve 18*e* opens. The nozzle 16*e* dispenses the first gas. The nozzle 16*e* blows out the first gas onto the upper surface W1 of the substrate W. The first gas is supplied to the solidified film K. Thereby, the solidified film K sublimates. The solidified film K changes into gas without being liquid. Such sublimation of the solidified film K causes the solidified film K to be removed from the substrate W. Then, the supplying unit 15*e* stops supply of the first gas to the solidified film K. Specifically, the valve 18*e* closes. The nozzle 16*e* stops blowing the first gas.

Figure 8:
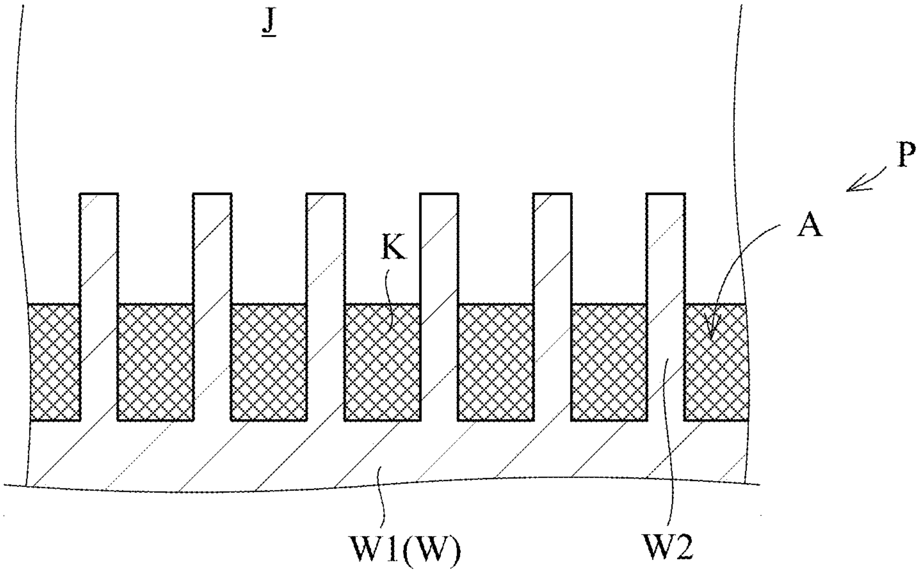
FIG. 8 schematically shows the substrate in a sublimation step.

FIG. 8 schematically shows the substrate W in the sublimation step. The solidified film K is gradually reduced as the solidified film K sublimates. The gas J enters into the recesses A as the solidified film K sublimates.

When the solidified film K sublimates, the solidified film K does not change into liquid. Accordingly, there exists no liquid on the upper surface W1 of the substrate W in the sublimation step. There exists no liquid in the recesses A. The pattern P does not contact any liquid. The projections W2 do not contact any liquid. The solidified film K is removed from the upper surface W1 of the substrate W without applying any significant force to the projections W2.

Figure 9:
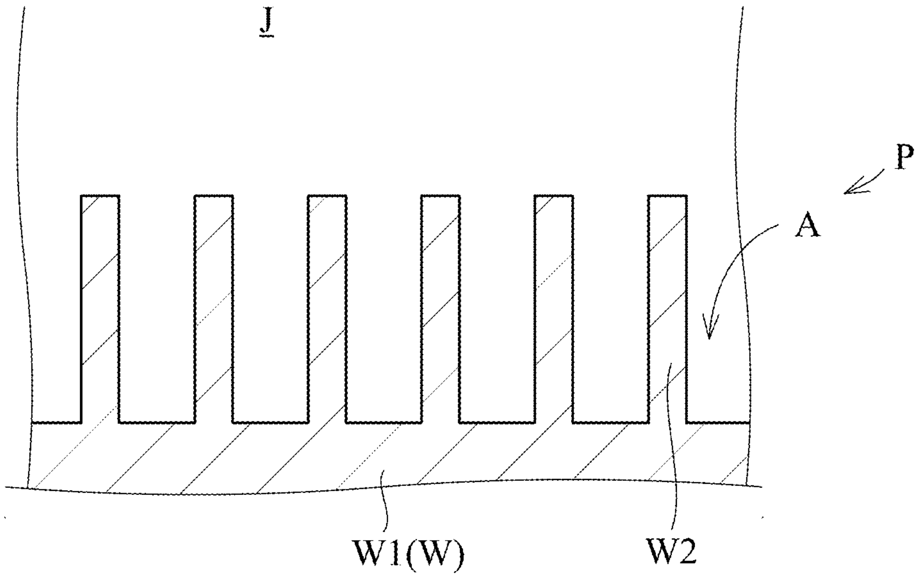
FIG. 9 schematically shows the substrate in the sublimation step.

FIG. 9 schematically shows the substrate W in the sublimation step. Finally, the solidified film K disappears from the upper surface W1 of the substrate W. The recesses A are filled with the gas J. The recesses A are entirely filled only with the gas J. There exists no liquid on the upper surface W1 of the substrate W. The substrate W is dried completely.

The treatment liquid supplying step, the solidified film forming step, and the sublimation step corresponds to an example of using the treatment liquid. The treatment liquid is used under an environment of room temperature. The treatment liquid is used under an environment of normal pressure.

Step S18: Rotation Stopping Step

The rotation driving unit 14 stops rotating the substrate holder 13. The substrate W held by the substrate holder 13 stops rotation. The substrate W rests. The treating unit 11 completes treatment on the substrate W.

1-6. Technical Meanings of Chemical Compounds a to d

The following describes technical meanings of the chemical compounds a to d as the sublimable substance from experimental examples 1 to 4.

The experimental example 1 is performed under conditions as below. In the experimental example 1, a series of treatment is performed on the substrate W, the series including the chemical liquid supplying step, a rinse liquid supplying step, a replacement liquid supplying step, a treatment liquid supplying step, a solidified film forming step, and a sublimation step.

In the chemical liquid supplying step, hydrofluoric acid is used as a chemical liquid. The hydrofluoric acid is a mixed liquid of hydrogen fluoride and water. A volume ratio of the hydrogen fluoride and water is as under.

Hydrogen fluoride:Water=1:10 (volume ratio)

In the rinse liquid supplying step, deionized water (DIW) is used as a rinse liquid.

In the replacement liquid supplying step, isopropyl alcohol is used as a replacement liquid.

In the treatment liquid supplying step, a treatment liquid consisting of a sublimable substance and a solvent is used. The sublimable substance is pinacolone oxime. The solvent is isopropyl alcohol (IPA). A volume ratio RV of the sublimable substance to the solvent is 2.5 [Vol %].

In the solidified film forming step, the substrate W is rotated at a rotation speed of 1500 rpm.

In the sublimation step, first gas is supplied to the substrate W while the substrate W is rotated at the rotation speed of 1500 rpm.

In the experimental example 2, the sublimable substance is acetophenone oxime. The conditions of the experimental example 2 other than the above are the same as those of the experimental example 1.

In the experimental example 3, the sublimable substance is cyclopentanone oxime. The conditions of the experimental example 3 other than the above are the same as those of the experimental example 1.

In the experimental example 4, the sublimable substance is 4-tert-butylphenol. The conditions of the experimental example 4 other than the above are the same as those of the experimental example 1.

Substrates W treated in the experimental examples 1 to 4 are individually evaluated under the following evaluation criterions. An observer observes one or more measurement points on a substrate W. Here, the measurement points are each a minute region on the substrate W. The measurement points are magnified 50,000 times by a scanning electron microscopy, for example. The observer evacuates every projection W2 at each of the measurement points. The observer determines every projection W2 at each of the measurement points. Specifically, the observer performs determination for every projection W2 about whether or not the projection W2 collapses. The observer counts the number N of the determined projections W2. The number N corresponds to the number of projections W2 evaluated by the observer. The observer counts the number n of collapsed projections W2. Here, the number n is equal to or less than the number N. The observer calculates a collapse rate. The collapse rate is defined by the numbers N and n as follows:

$$\text{Collapse rate}=n/N*100[\%].$$

FIG. 10 is a table showing evaluations of substrates W treated in the experimental examples 1 to 4. Specifically, FIG. 10 shows a relationship of collapse rates to the experimental examples 1 to 4.

In the experimental example 1, a collapse rate is 31.2%. In the experimental example 2, a collapse rate is 23.2%. In the experimental example 3, a collapse rate is 31.1%. In the experimental example 4, a collapse rate is 7.2%.

It is found that collapse of the pattern P is suppressed suitably in each of the experimental examples 1 to 4. It is found that collapse of the projections W2 is suppressed suitably in each of the experimental examples 1 to 4. Consequently, it is found that the substrate W can be treated appropriately while the pattern P formed on the substrate W is protected in each of the experimental examples 1 to 4. That is, it is found that the substrate W can be treated appropriately in each of the experimental examples 1 to 4.

Here, the Inventors has found the following features from the experimental example 1.

Fa1) Pinacolone oxime has an attribute to be sublimable while protecting the pattern P on the substrate.

Fa2) Pinacolone oxime is suitable for use in the substrate treating method and the treatment liquid from the attribute described in the above feature Fa1).

Here, the Inventors has found the following features from the experimental example 2.

Fb1) Acetophenone oxime has an attribute to be sublimable while protecting the pattern P on the substrate.

Fb2) Acetophenone oxime is suitable for use in the substrate treating method and the treatment liquid from the attribute described in the above feature Fb1).

Here, the Inventors has found the following features from the experimental example 3.

Fc1) Cyclopentanone oxime has an attribute to be sublimable while protecting the pattern P on the substrate.

Fc2) Cyclopentanone oxime is suitable for use in the substrate treating method and the treatment liquid from the attribute described in the above feature Fc1).

Here, the Inventors has found the following features from the experimental example 4.

Fd1) 4-tert-butylphenol has an attribute to be sublimable while protecting the pattern P on the substrate.

Fd2) 4-tert-butylphenol is suitable for use in the substrate treating method and the treatment liquid from the attribute described in the above feature Fd1).

1-7. Effect of First Embodiment

The treatment liquid in the first embodiment is used for treating a substrate W on which a pattern P is formed. Specifically, the treatment liquid is a treatment liquid for use in treating substrates. Specifically, the treatment liquid is a treatment liquid for use in drying substrates. The treatment liquid contains a sublimable substance and a solvent. The sublimable substance contains, for example, at least one selected from the above chemical compounds a, b, c, and d. Accordingly, the substrate W can be treated appropriately with use of the treatment liquid. Specifically, the substrate W can be treated appropriately with use of the treatment liquid while the pattern P formed on the substrate W is protected. The substrate W can be treated appropriately with use of the treatment liquid while collapse of the projections W2 formed on the substrate W is suppressed.

The sublimable substance is, for example, pinacolone oxime. Accordingly, the substrate treating method can perform suitable treatment on the substrate W.

The sublimable substance is, for example, acetophenone oxime. Accordingly, the substrate treating method can perform suitable treatment on the substrate W.

The sublimable substance is, for example, cyclopentanone oxime. Accordingly, the substrate treating method can perform suitable treatment on the substrate W.

The sublimable substance is, for example, 4-tert-butylphenol. Accordingly, the substrate treating method can perform suitable treatment on the substrate W.

The solvent contains at least one selected from the chemical compounds e1 to e10. Accordingly, the substrate treating method can perform more suitable treatment on the substrate W.

The solvent is, for example, isopropyl alcohol. Accordingly, the substrate treating method can perform more suitable treatment on the substrate W.

The substrate treating method according to the first embodiment performs treatment on the substrate W on which the pattern P is formed. The substrate treating method includes the treatment liquid supplying step, the solidified film forming step, and the sublimation step. In the treatment liquid supplying step, the treatment liquid is supplied to the substrates W. The treatment liquid contains a sublimable substance and a solvent. In the solidified film forming step, the solvent evaporates from the treatment liquid on the substrate W. In the solidified film forming step, the solidified film K is formed on the substrate W. The solidified film K contains the sublimable substance. In the sublimation step, the solidified film K sublimates. As described above, the sublimable substance contains at least one selected from the chemical compounds a, b, c, and d. Accordingly, the substrate treating method can perform suitable treatment on the substrate W. Specifically, the substrate W can be treated appropriately while the pattern P formed on the substrate W is protected. The substrate treating method can perform suitable treatment on the substrate W while collapse of the projections W2 formed on the substrate W is suppressed.

As described above, the solvent contains at least one selected from the chemical compounds e1 to e10. Accordingly, the substrate treating method can perform more suitable treatment on the substrate W.

2. Second Embodiment

The following describes a second embodiment with reference to drawings. Like numerals are used to identify like components which are the same as those in the first embodiment, and the components will not particularly be described.

2-1. Substrate W

Figure 11:
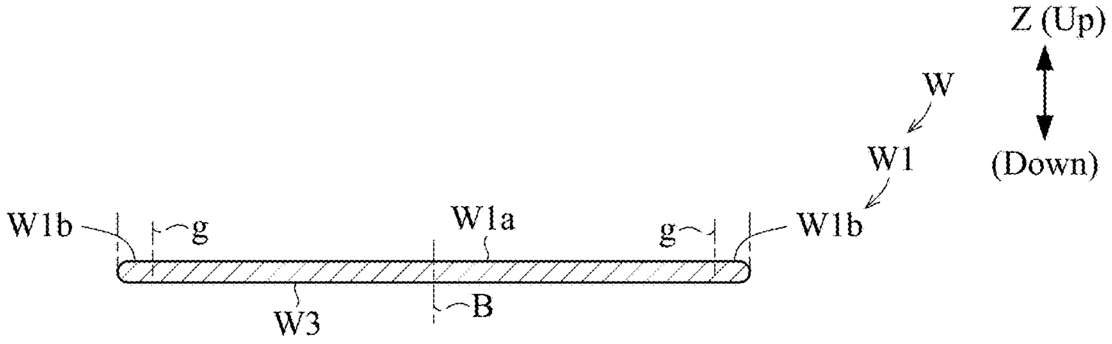
FIG. 11 is a cross sectional view of a substrate.
Figure 12:
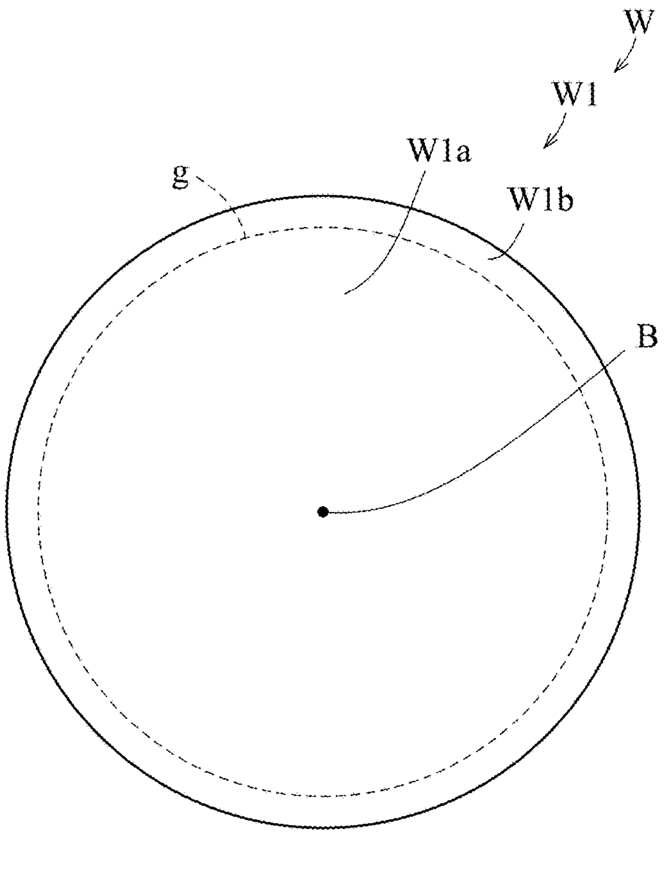
FIG. 12 is a plan view of the substrate.

Firstly, a substrate W is to be described. FIG. 11 is a cross sectional view of the substrate W. FIG. 12 is a plan view of the substrate W. As described in the first embodiment, the substrate W has a thin and flat plate shape. The substrate W has a substantially circular shape in plan view. The substrate W has an upper surface W1. When the substrate W is held by the substrate holder 13, the upper surface W1 is directed upward.

The upper surface W1 has a pattern forming area W1*a* and a pattern non-forming area W1*b*. The pattern forming area W1*a* is part of the upper surface W1 where a pattern P is formed. The pattern non-forming area W1*b* is part of the upper surface W1 where the pattern P is not formed.

FIG. 11 illustrates an imaginary line g. The imaginary line g is a boundary between the pattern forming area W1*a* and the pattern non-forming area W1*b*.

The pattern non-forming area W1*b* is positioned on a peripheral edge. The pattern non-forming area W1*b* has an annular shape in plan view. The pattern non-forming area W1*b* contains an edge of the substrate W. The pattern non-forming area W1*b* contains, for example, a bevel portion of the substrate W. The bevel portion is a part on which beveling is performed. The bevel portion is inclined, for example. The bevel portion is curved convexly toward outward of the substrate W, for example. The outward is a direction orthogonal to and apart from a rotation axis B, for example.

The pattern forming area W1*a* is surrounded by the pattern non-forming area W1*b* in plan view. The pattern forming area W1*a* is positioned inward of the pattern non-forming area W1*b* in plan view. The pattern forming area W1*a* contains the center of the upper surface W1 in plan view. The pattern forming area W1*a* intersects the rotation axis B. The pattern forming area W1*a* has a circular shape in plan view, for example.

The substrate W also has a lower surface W3. The lower surface W3 of the substrate W is also called a back side of the substrate W. When the substrate W is held by the substrate holder 13, the lower surface W3 is directed downward.

2-2. Construction of Treating Unit 11

The second embodiment has an outline of a substrate treating apparatus 1 and a construction of a treatment liquid generating unit 20 substantially same as those in the first embodiment. The following describes a construction of a treating unit 11 according to the second embodiment.

Figure 13:
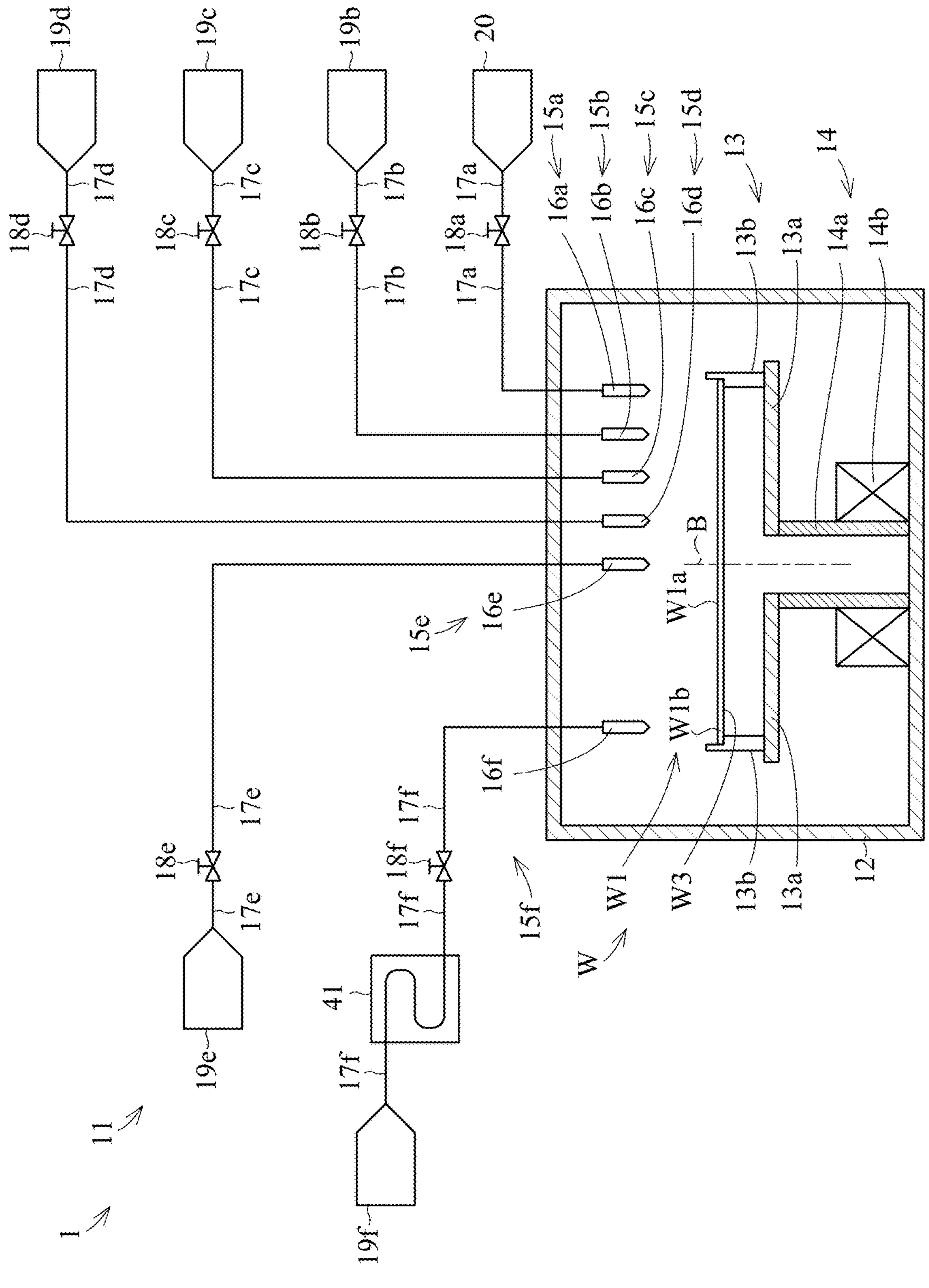
FIG. 13 shows a construction of a treating unit and a treatment liquid generating unit according to a second embodiment.

FIG. 13 shows a construction of the treating unit 11 and a treatment liquid generating unit 20 according to the second embodiment. FIG. 13 simply shows the construction of the treatment liquid generating unit 20. The following describes an example of a structure of a substrate holder 13. The substrate holder 13 includes one base 13*a*. The base 13*a* is connected to a rotation driving unit 14. The base 13*a* is rotatable about the rotation axis B.

The base 13*a* has a planar discal shape. The base 13*a* has substantially the same dimension as that of the substrate W in plan view, which illustration is omitted. The base 13*a* has an opening formed in the center of the base 13*a*. The base 13*a* has an annular ring shape in plan view.

The substrate holder 13 includes a plurality of grippers 13*b*. The grippers 13*b* are attached to the base 13*a*. The grippers 13*b* are rotatable integrally with the base 13*a*. The grippers 13*b* hold a substrate W. The grippers 13*b* hold the substrate W in a substantially horizontal posture.

The grippers 13*b* each extend upward from the base 13*a*. The grippers 13*b* are aligned on a circumference whose center corresponds to the rotation axis B, for example. The grippers 13*b* hold the edge of the substrate W.

When the substrate holder 13 holds the substrate W, the base 13*a* is positioned below the substrate W. When the substrate holder 13 holds the substrate W, the base 13*a* faces the lower surface W3 of the substrate W.

The following describes an example of a structure of the rotation driving unit 14. The rotation driving unit 14 includes a rotary shaft 14*a* and a motor 14*b*. The rotary shaft 14*a* is connected to the base 13*a*. The rotary shaft 14*a* extends on the rotation axis B. The rotary shaft 14*a* has a hollow portion formed inside of the rotary shaft 14*a*. The motor 14*b* is coupled to the rotary shaft 14*a*. The motor 14*b* rotates the rotary shaft 14*a* around the rotation axis B.

The treatment liquid supplied from the supplying unit 15*a* contains a sublimable substance and a solvent. The sublimable substance in the second embodiment may contain at least one selected from the chemical compounds a to d described above. The sublimable substance in the second embodiment need not contain at least one selected from the chemical compounds a to d. The sublimable substance in the second embodiment may contain a compound except the chemical compounds a to d.

The sublimable substance may have a vapor pressure of 100 Pa or less. More specifically, a vapor pressure of the sublimable substance at room temperature may be 100 Pa or less.

Alternatively, a vapor pressure of the sublimable substance at room temperature may be 100 Pa or more.

Moreover, it is preferred that a vapor pressure of the sublimable substance at room temperature is 0.1 Pa or more.

The vapor pressure of the chemical compounds a to d described above is not disclose in a web site of Pub Chem (http://pubchem.ncbi.nlm.nih.gov/) as published database.

The treating unit 11 includes a supplying unit 15*f* in addition to the supplying units 15*a* to 15*e*. The supplying unit 15*f* supplies second gas to the substrate W.

The second gas has a component same as that of the first gas, for example. The second gas has a composition same as that of the first gas, for example. The second gas is, for example, dry gas. The second gas is, for example, air. The second gas is, for example, compressed air. The second gas is, for example, inert gas. The second gas is, for example, nitrogen gas.

The supplying unit 15*f* includes a nozzle 16*f*. The nozzle 16*f* is located inside of a casing 12. The nozzle 16*f* dispenses the second gas. The nozzle 16*f* blows out the second gas.

The nozzle 16*f* blows out the second gas in a direction directed to the pattern non-forming area W1*b*. The nozzle 16*f* points the pattern non-forming area W1*b*. The nozzle 16*f* blows out the second gas toward the pattern non-forming area W1*b*.

The nozzle 16*f* blows out the second gas in a direction not directed to the pattern forming area W1*a*. The nozzle 16*f* does not point the pattern forming area W1*a*. The nozzle 16*f* does not blow out the second gas toward the pattern forming area W1*a*.

On the other hand, the nozzle 16*e* blows out the first gas in a direction directed to the pattern forming area W1*a*. The nozzle 16*e* points the pattern forming area W1*a*. The nozzle 16*e* blows out the first gas toward the pattern forming area W1*a*.

The supplying unit 15*f* a includes a pipe 17*f* and a valve 18*f*. The pipe 17*f* is connected to the nozzle 16*f*. At least part of the pipe 17*f* may be provided externally of the casing 12. The valve 18*f* is provided on the pipe 17*f*. When the valve 18*f* is opened, the nozzle 16*f* dispenses the second gas. When the valve 18*f* is closed, the nozzle 16*f* does not dispense the second gas. The valve 18*f* may be provided externally of the casing 12.

The treating unit 11 includes a heating unit 41. The heating unit 41 is connected to the supplying unit 15*f*. The heating unit 41 is in fluid communication with the supplying unit 15*f*, for example. The heating unit 41 is provided on the pipe 17*f*, for example. The heating unit 41 heats the second gas. The heating unit 41 controls a temperature of the second gas. The heating unit 41 includes at least either a heat exchanger or a resistance heater, for example. The heating unit 41 may be provided externally of the casing 12.

The supplying unit 15*f* is connected to a second gas supplying source 19*f*. The supplying unit 15*f* is in fluid communication with the second gas supplying source 19*f*. The second gas supplying source 19*f* is connected to the pipe 17*f*, for example. The second gas supplying source 19*f* feeds the second gas to the supplying unit 15*f*. The second gas supplying source 19*f* feeds the second gas to the nozzle 16*f* through the heating unit 41. The second gas supplying source 19*f* may be an element of the substrate treating apparatus 1. Alternatively, the second gas supplying source 19*f* may not be an element of the substrate treating apparatus 1.

A controller 10 controls the supplying unit 15*f*, which illustration is omitted. The controller 10 controls the valve 18*f*. Moreover, the controller 15*f* controls the heating unit 41.

2-3. Operation Example of Treatment Liquid Generating Unit 20 and Treating Unit 11

Figure 14:
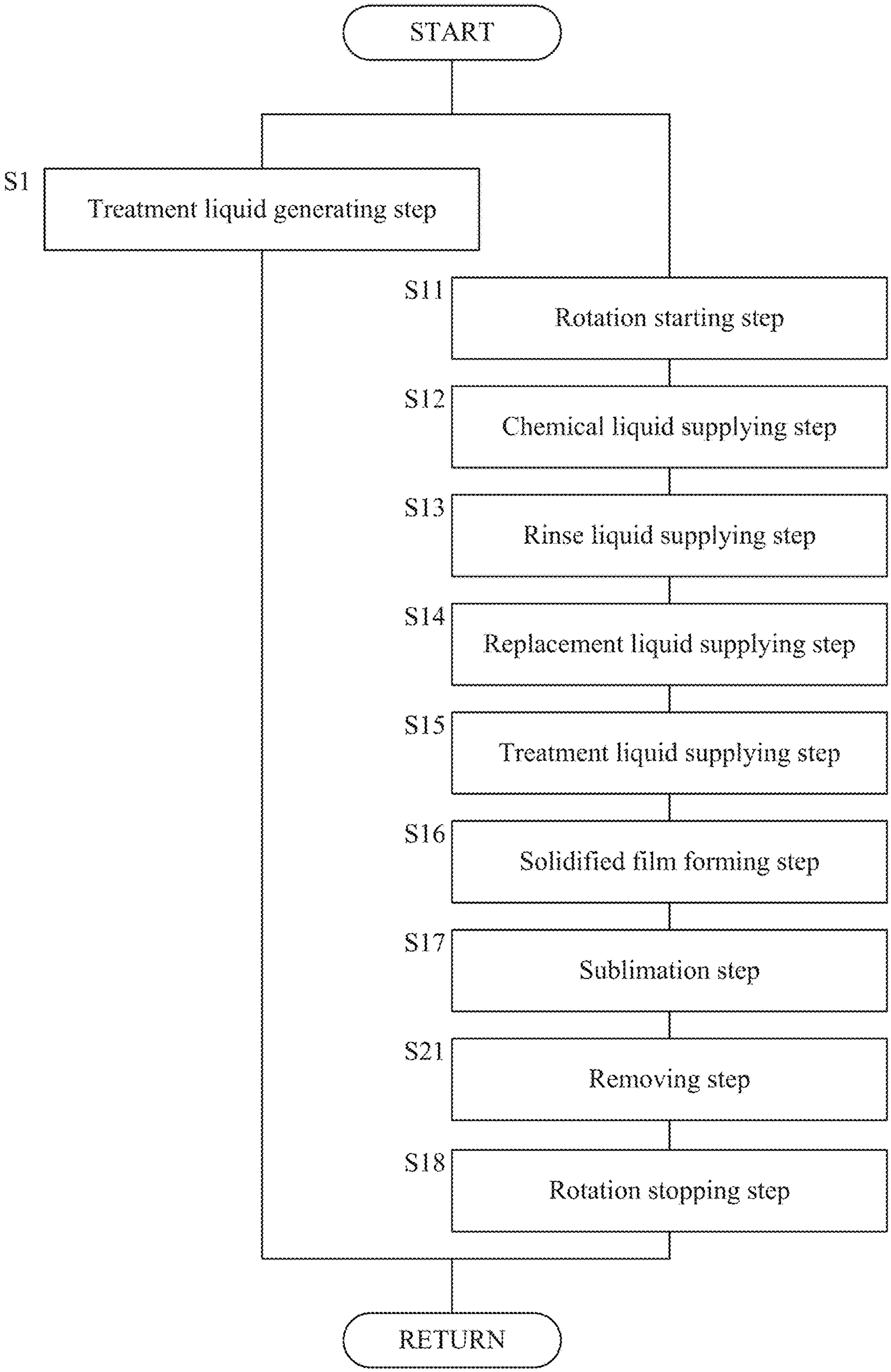
FIG. 14 is a flow chart showing procedures of a substrate treating method according to the second embodiment.

FIG. 14 is a flow chart showing procedures of a substrate treating method according to the second embodiment. The substrate treating method according to the second embodiment includes a Step S21 in addition to the Steps S1 and S11 to S18 described in the first embodiment. Operation in the Steps S1, S11 to S14 and S18 are substantially common between the first embodiment and the second embodiment. Accordingly, description about the operation in the Steps S1, S11 to S14 and S18 is to be omitted. The following describes operation in Steps S15 to S17 and S21.

Step S15: Treatment Liquid Supplying Step

In the treatment liquid supplying step, the treatment liquid is supplied to the substrates W. In the treatment liquid supplying step, the treatment liquid is supplied to the upper surface W1 of the substrate W.

Figure 15:
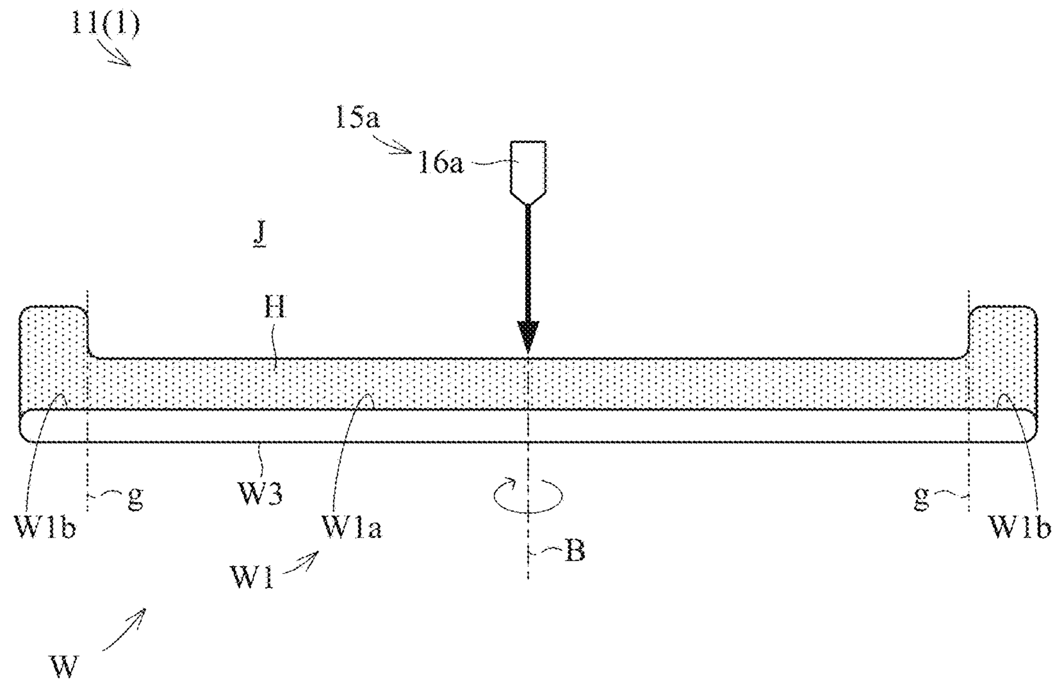
FIG. 15 schematically shows a substrate in a treatment liquid supplying step.

FIG. 15 schematically shows the substrate W in the treatment liquid supplying step. FIG. 15 omits illustration of the substrate holder 13 and the like. FIG. 15 omits illustration of the pattern P and the like. The substrate W is in substantially a horizontal posture. The substrate W is rotated around the rotation axis B.

The nozzle 16*a* is positioned above the substrate W, for example. The nozzle 16*a* dispenses the treatment liquid onto the upper surface W1 of the substrate W, for example. The nozzle 16*a* dispenses the treatment liquid to the pattern forming area W1*a*, for example. The nozzle 16*a* dispenses the treatment liquid to the center of the upper surface W1, for example.

The liquid film H of the treatment liquid is formed on the upper surface W1 of the substrate W. The liquid film H of the treatment liquid is formed on the pattern forming area W1*a* and the pattern non-forming area W1*b*. The liquid film H of the treatment liquid covers the upper surface W1 of the substrate W. The liquid film H of the treatment liquid covers both the pattern forming area W1*a* and the pattern non-forming area W1*b*.

FIG. 15 exemplarily illustrates the liquid film H having an uneven thickness. In FIG. 15, a thickness of the liquid film H on the pattern non-forming area W1*b* is larger than a thickness of the liquid film H on the pattern forming area W1*a*. The liquid film H bulges upward in the pattern non-forming area W1*b*. Bulging of the liquid film H in the pattern non-forming area W1*b* is considered to occur due to a balance between a centrifugal force on the liquid film H and a surface tension of the liquid film H, for example.

Step S16: Solidified Film Forming Step

In the solidified film forming step, the solvent evaporates from the treatment liquid on the substrate W. In the solidified film forming step, the solvent evaporates from the liquid film H. In the solidified film forming step, a solidified film K is formed on the upper surface W1 of the substrate W.

Figure 16:
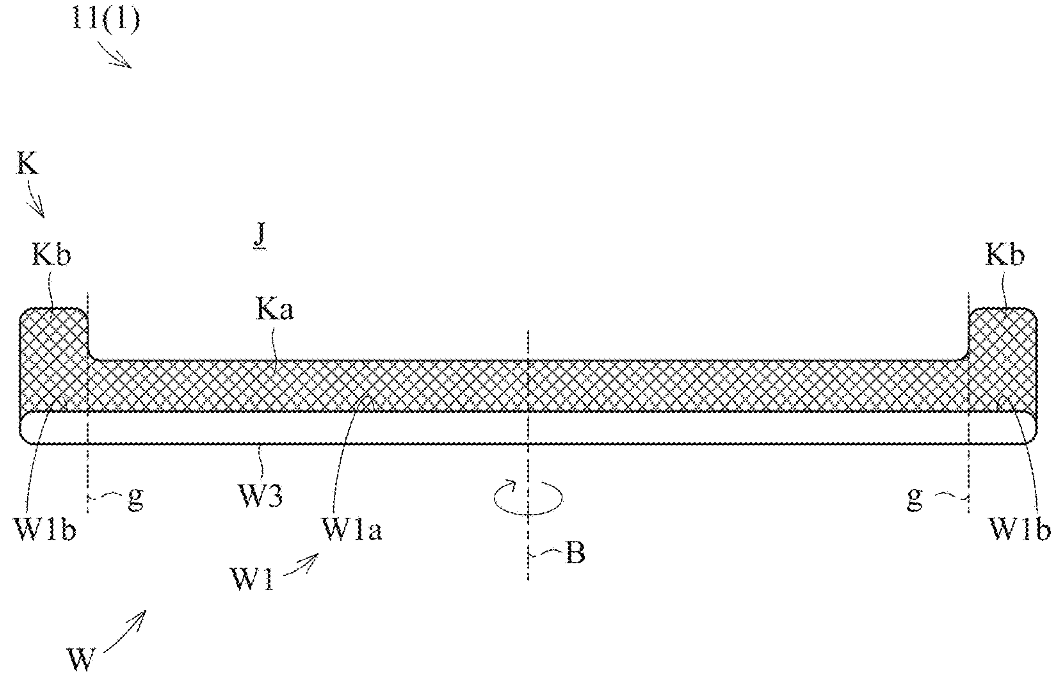
FIG. 16 schematically shows the substrate in a solidified film forming step.

FIG. 16 schematically shows the substrate W in the solidified film forming step. The substrate W is in substantially a horizontal posture. The substrate W is rotated around the rotation axis B.

The solidified film K covers the upper surface W1 of the substrate W entirely.

Here, part of the solidified film K positioned on the pattern forming area W1*a* is called a "first solidified film Ka". Part of the solidified film K positioned on the pattern non-forming area W1*b* is called a "second solidified film Kb". The first solidified film Ka covers the pattern forming area W1*a*. The second solidified film Kb covers the pattern non-forming area W1*b*. The second solidified film Kb is not positioned on the pattern forming area W1*a*.

FIG. 16 exemplarily shows the first solidified film Ka and the second solidified film Kb that differ from each other in thickness. In FIG. 16, a thickness of the second solidified film Kb is larger than a thickness of the first solidified film Ka. The second solidified film Kb bulges higher than the first solidified film Ka. Bulging of the second solidified film Kb is considered to occur due to the bulging of the liquid film H in the pattern non-forming area W1*b*. Bulging of the second solidified film Kb is also considered to occur due to gradual formation of the second solidified film Kb while the substrate W rotates.

Step S17: Sublimation Step

In the sublimation step, the first gas is blown to the first solidified film Ka. In the sublimation step, the first solidified film Ka sublimates.

Figure 17:
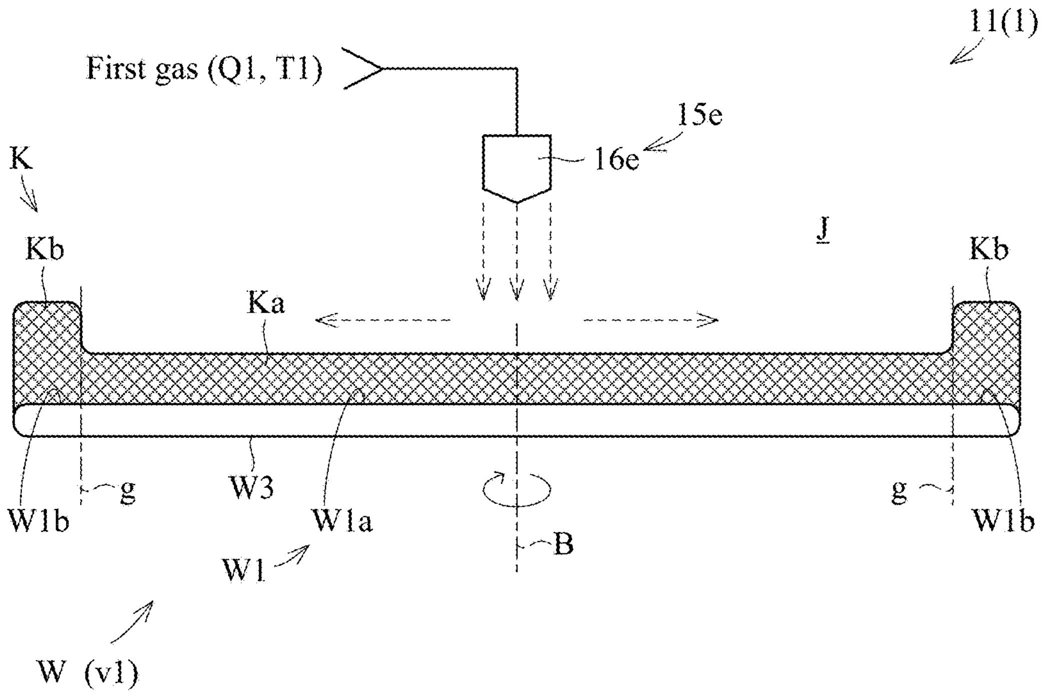
FIG. 17 schematically shows the substrate in a sublimation step.

FIG. 17 schematically shows the substrate W in the sublimation step. The substrate W is in substantially a horizontal posture. The substrate W is rotated around the rotation axis B.

The nozzle 16*e* is positioned above the substrate W. The nozzle 16*e* is positioned above the pattern forming area W1*a* (i.e., first solidified film Ka). The nozzle 16*e* dispenses the first gas to the pattern forming area W1*a* (i.e., first solidified film Ka). The nozzle 16*e* dispenses the first gas to the center of the upper surface W1, for example. The nozzle 16*e* dispenses the first gas to the center of the first solidified film Ka, for example.

The first gas contacts first solidified film Ka. After the first gas contacts first solidified film Ka, the first gas turns its direction to flow outward of the substrate W. The first gas flows on a surface of the first solidified film Ka. The first solidified film Ka is exposed to the flow of the first gas.

Thereby, the first solidified film Ka sublimates. The first solidified film Ka sublimates, thereby being removed from the substrate W (specifically, pattern forming area W1*a*).

Figure 18:
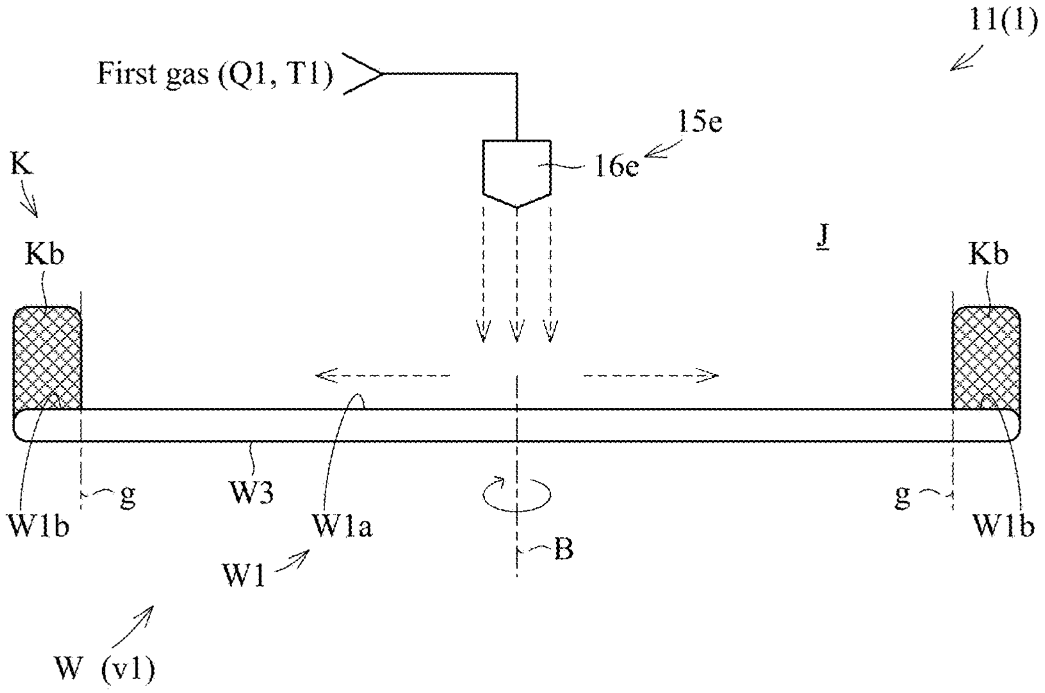
FIG. 18 schematically shows the substrate in the sublimation step.

FIG. 18 schematically shows the substrate W in the sublimation step. As shown in FIG. 18, the first solidified film Ka entirely sublimates when the sublimation step is completed. When the sublimation step is completed, the first solidified film Ka does not remain on the pattern forming area W1*a*. With the sublimation step, the pattern forming area W1*a* is dried.

In the sublimation step, the second solidified film Kb is not removed from the substrate W, for example. In the sublimation step, the second solidified film Kb entirely remains on the substrate W, for example. Alternatively, the second solidified film Kb may partially sublimate. The second solidified film Kb may partially be removed from the substrate W. When the sublimation step is completed, at least part of the second solidified film Kb still remains on the pattern non-forming area W1*b*.

The following describes a treatment condition of the sublimation step. In the sublimation step, the substrate W is rotated at a rotation speed v1. In the sublimation step, the nozzle 16*e* blows out the first gas at a flow rate Q1. In the sublimation step, the first gas has a temperature T1.

Here, the temperature T1 is equal to room temperature, for example. Alternatively, the temperature T1 may be lower than room temperature.

When the sublimation step starts, the solidified film K (including the first solidified film Ka) has a temperature substantially equal to the room temperature. Accordingly, the temperature of the first solidified film Ka does not rise even when the first gas is supplied to the first solidified film Ka. That is, the first solidified film Ka is not heated with the first gas in the sublimation step. In the sublimation step, the first solidified film Ka sublimates while the temperature of the solidified film K is kept equal to or lower than room temperature. Accordingly, the first solidified film Ka sublimates without being solved in the sublimation step.

Step S21: Removing Step

The removing step starts after the sublimation step is completed. A period of time where the removing step is performed does not overlap with a period of time where the sublimation step is performed. For example, the sublimation step is completed at the same timing where the removing step starts.

The first solidified film Ka has already sublimated entirely when the removing step starts. When the removing step starts, at least part of the second solidified film Kb remains on the pattern non-forming area W1*b*.

In the removing step, the second gas is blown to the second solidified film Kb. In the removing step, the second solidified film Kb is removed from the substrate W.

Figure 19:
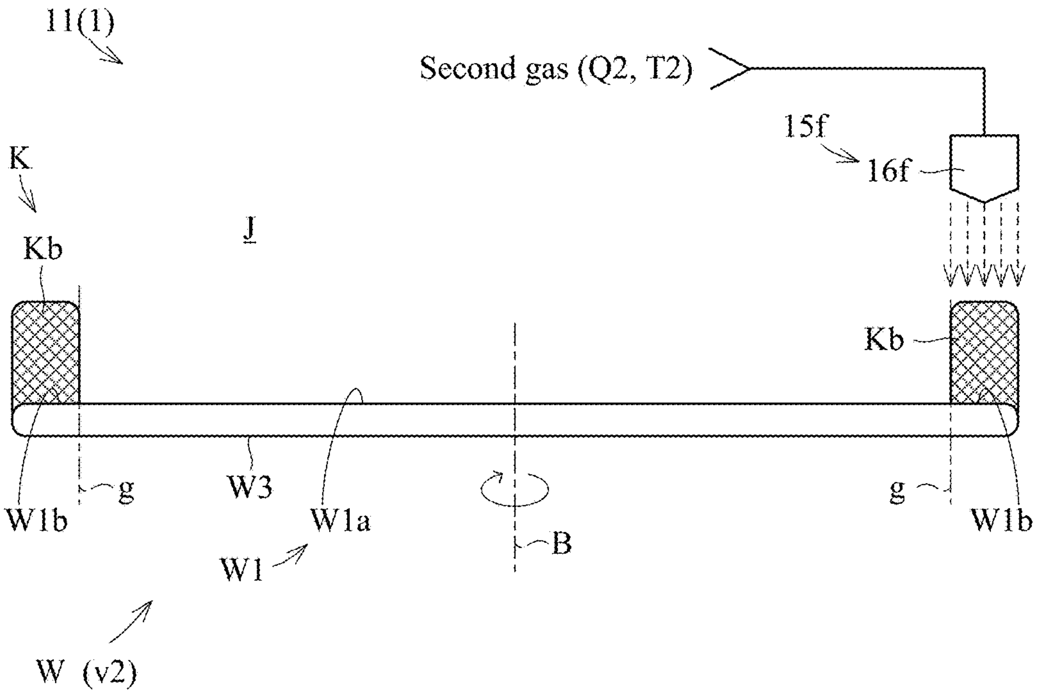
FIG. 19 schematically shows the substrate in a removing step.

FIG. 19 schematically shows the substrate W in the removing step. The substrate W is in substantially a horizontal posture. The substrate W is rotated around the rotation axis B.

The nozzle 16*f* is positioned above the substrate W. The nozzle 16*f* is positioned above the pattern non-forming area W1*b* (i.e., second solidified film Kb), for example. The nozzle 16*f* blows out the second gas in a direction directed to the pattern non-forming area W1*b* (i.e., second solidified film Kb). The nozzle 16*f* aims the pattern non-forming area W1*b* (i.e., second solidified film Kb). The nozzle 16*f* dispenses the second gas toward the pattern non-forming area W1*b* (i.e., second solidified film Kb).

The second gas contacts the second solidified film Kb. The second gas flows on a surface of the second solidified film Kb. The second solidified film Kb is exposed to the flow of the second gas.

This changes the second solidified film Kb to a gas phase (gas). In other words, the second solidified film Kb vaporizes. The second solidified film Kb is changed into the gas phase, thereby being removed from the substrate W (specifically, pattern non-forming area W1*b*).

Here, the second solidified film Kb may be changed into the gas phase not through a liquid phase. That is, the second solidified film Kb may sublimate. Alternatively, the second solidified film Kb may be changed into the gas phase through the liquid phase. That is, the second solidified film Kb may be solved, and then may evaporate. Since the second solidified film Kb is changed to the gas phase in any cases, the second solidified film Kb is removed from the pattern non-forming area W1*b*. Even if the second solidified film Kb is temporarily changed into liquid before the second solidified film Kb is changed into gas, the liquid does not reach the pattern forming area W1*a*. Accordingly, in view of protecting the pattern P, it is allowed that the second solidified film Kb temporarily melts.

Figure 20:
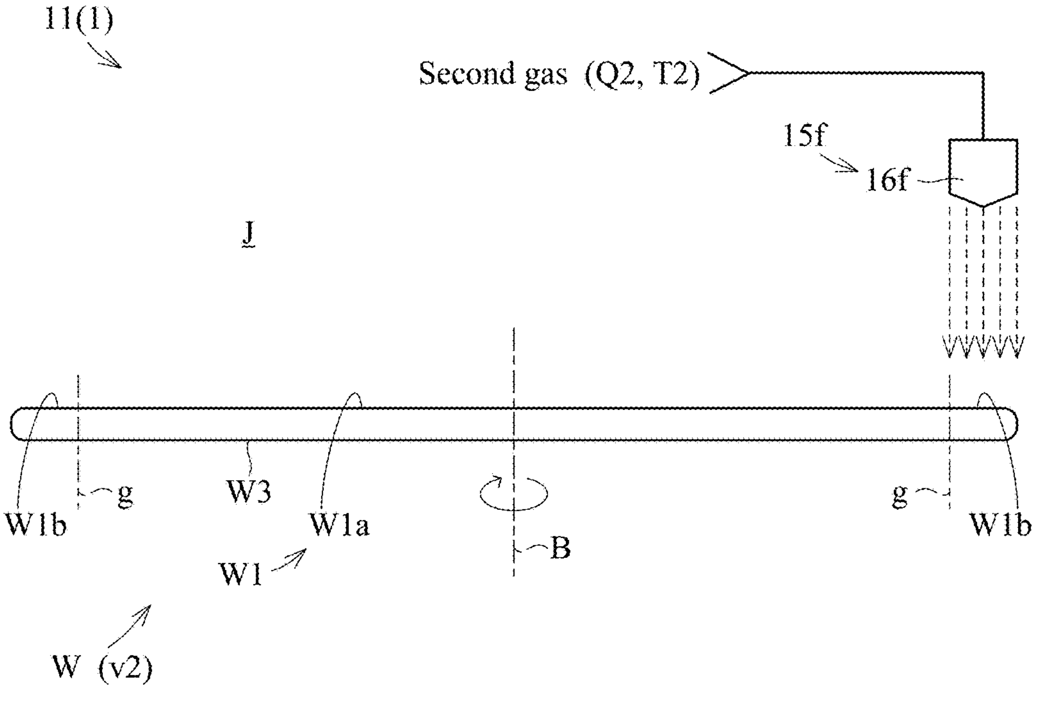
FIG. 20 schematically shows the substrate in the removing step.

FIG. 20 schematically shows the substrate W in the removing step. As shown in FIG. 20, the second solidified film Kb entirely vaporizes when the removing step is completed. When the removing step is completed, the second solidified film Kb does not remain on the pattern non-forming area W1*b*. With the removing step, the pattern non-forming area W1*b* is dried. This results in drying of the substrate W entirely.

The following describes a treatment condition of the removing step. In the removing step, the substrate W is rotated at a rotation speed v2. In the removing step, the nozzle 16*f* blows out the first gas at a flow rate Q2. In the removing step, the heating unit 41 heats the second gas to a temperature T2. Accordingly, the second gas has the temperature T2 in the removing step.

Here, the rotation speed v2 may be substantially equal to the rotation speed v1, for example. Alternatively, the rotation speed v2 may be higher than the rotation speed v1. When the rotation speed v2 is higher than the rotation speed v1, the second solidified film Kb can be removed more rapidly.

The flow rate Q2 may be substantially equal to the flow rate Q1, for example. Alternatively, the flow rate Q2 may be larger than the flow rate Q1. When the flow rate Q2 is larger than the flow rate Q1, the second solidified film Kb can be removed more rapidly.

The following four examples are to be shown for the temperature T2.

First Example of Temperature T2

The temperature T2 is substantially equal to the temperature T1.

In the first example, the second solidified film Kb is removed as under. When the removing step starts, the second solidified film Kb has a temperature substantially equal to the temperature T1. Accordingly, in the first example, the temperature T2 is substantially equal to a temperature of the second solidified film Kb when the removing step starts. Consequently, the temperature of the second solidified film Kb does not rise even when the second gas is supplied to the second solidified film Kb. That is, the second solidified film Kb is not heated with the second gas. In the removing step, the second solidified film Kb vaporizes while the temperature of the second solidified film Kb is kept at a temperature equal to or lower than room temperature. As a result, in the removing step, the second solidified film Kb is removed without being solved. Therefore, the pattern P is positively protected in the removing step.

Second Example of Temperature T2

The temperature T2 is higher than the temperature T1.

In the second example, the second solidified film Kb is removed as under. In the second example, the temperature T2 is higher than a temperature of the second solidified film Kb when the removing step starts. Consequently, the temperature of the second solidified film Kb rises when the second gas is supplied to the second solidified film Kb. That is, the second solidified film Kb is heated with the second gas. In the removing step, the second solidified film Kb is changed into a gas phase while being heated. Consequently, the second solidified film Kb is removed rapidly.

Third Example of Temperature T2

The temperature T2 is higher than room temperature.

In the third example, the second solidified film Kb is removed as under. When the removing step starts, the second solidified film Kb has a temperature substantially equal to or lower than room temperature. Accordingly, in the third example, the temperature T2 is higher than a temperature of the second solidified film Kb when the removing step starts. Accordingly, the second solidified film Kb is heated with the second gas. In the removing step, the second solidified film Kb is changed into a gas phase while being heated. Consequently, the second solidified film Kb is removed rapidly.

Fourth Example of Temperature T2

For example, the temperature T2 is higher than a melting point MP of the sublimable substance at normal pressure. For example, when the sublimable substance contains a plurality of chemical compounds, the temperature T2 is higher than any of melting points MP of the chemical compounds contained in the sublimable substance. For example, the temperature T2 is higher than a melting point of the solidified film K at normal pressure.

A melting point MP of the chemical compound a described above is referred to as a melting point MPa. Likewise, melting points MP of the chemical compounds b, c, and d are referred to as melting points MPb, MPc, MPd, respectively. For example, when the sublimable substance is the chemical compound a, the temperature T2 is higher than the melting point MPa. For example, when the sublimable substance contains the chemical compounds a, b, c, and d, the temperature T2 is higher than any of the melting points MPa, MPb, MPc, and MPd.

The following gives values of the melting points MPa, MPb, MPc, and MPd for reference.

- Melting point MPa of the chemical compound a at standard atmospheric pressure: 76 degrees centigrade
- Melting point MPb of the chemical compound b at standard atmospheric pressure: 60 degrees centigrade
- Melting point MPc of the chemical compound c at standard atmospheric pressure: 58 degrees centigrade
- Melting point MPd of the chemical compound d at standard atmospheric pressure: 101.1 degrees centigrade Here, the normal atmospheric pressure is 101325 Pa.

In the fourth example, the second solidified film Kb is removed as under. When the removing step starts, the second solidified film Kb has a temperature lower than the melting point MP. Accordingly, in the fourth example, the temperature T2 is higher than a temperature of the second solidified film Kb when the removing step starts. Accordingly, the second solidified film Kb is heated with the second gas. In the removing step, the second solidified film Kb is changed into a gas phase while being heated. Consequently, the second solidified film Kb is removed rapidly.

As described above, the second solidified film Kb is heated with the second gas in the second example, the third example, and the fourth example of the temperature T2. In the second example, the third example, and the fourth example of the temperature T2, the second gas is one example of the second gas in the present invention as well as of high-temperature fluid in the present invention.

2-4. Effect of Second Embodiment

The substrate treating method according to the second embodiment performs treatment on the substrate W. The substrate W has the upper surface W1. The upper surface W1 has the pattern forming area W1*a* and the pattern non-forming area W1*b*. The pattern P is formed on the pattern forming area W1*a*. The pattern P is not formed on the pattern non-forming area W1*b*.

With the substrate treating method, the substrate W described above is treated. The substrate treating method includes the treatment liquid supplying step and the solidified film forming step. In the treatment liquid supplying step, the treatment liquid is supplied to the substrate W. The treatment liquid contains a sublimable substance and a solvent. In the treatment liquid supplying step, the liquid film H of the treatment liquid is formed on the upper surface W1 of the substrate W. In the solidified film forming step, the solvent evaporates from the liquid film H. In the solidified film forming step, a solidified film K is formed on the upper surface W1 of the substrate W. The solidified film K contains the sublimable substance. The solidified film K has the first solidified film Ka and the second solidified film Kb. The first solidified film Ka is positioned on the pattern forming area W1*a*. The second solidified film Kb is positioned on the pattern non-forming area W1*b*.

The substrate treating method includes the sublimation step. In the sublimation step, the first gas is blown to the first solidified film Ka. In the sublimation step, the first solidified film Ka sublimates. The first solidified film Ka sublimates, thereby being removed from the pattern forming area W1*a*. Accordingly, in the sublimation step, the pattern forming area W1*a* is dried while the pattern P is protected. In the sublimation step, the pattern forming area W1*a* is dried while collapse of the pattern P (projections W2) is suppressed.

The substrate treating method includes the removing step. In the removing step, the second solidified film Kb is removed from the substrate W. Accordingly, with the removing step, the pattern non-forming area W1*b* is dried.

Here, the second solidified film Kb is positioned on the pattern non-forming area W1*b*. That is, the second solidified film Kb is not positioned on the pattern forming area W1*a*. Accordingly, there is no possibility that the pattern P is collapsed even in promoted removal of the second solidified film Kb. As a result, with the removing step, the second solidified film Kb can be removed from the substrate W efficiently.

In summary, the substrate treating method includes the removing step in addition to the sublimation step. In the sublimation step, the first solidified film Ka sublimates. In the removing step, the second solidified film Kb is removed. As described above, the second solidified film Kb need not be sublimated in the sublimation step. This achieves suitable reduction in time for the sublimation step. The removing step is not needed for protecting the pattern P. As a result, with the removing step, the second solidified film Kb can be removed from the substrate W efficiently. Accordingly, the substrate W can be dried efficiently with both the sublimation step and the removing step. Consequently, the substrate W can be treated efficiently with the substrate treating method.

With the removing step, the second solidified film Kb can be removed efficiently especially when the second solidified film Kb is harder to sublimate than the first solidified film Ka. For example, with the removing step, the second solidified film Kb can be removed efficiently even when the second solidified film Kb has a thickness larger than that of the first solidified film Ka as shown in FIG. 16.

In contrast to the substrate treating method according to the second embodiment including the removing step, the currently-used substrate treating method does not include the removing step. In the currently-used substrate treating method, the solidified film K sublimates entirely in the sublimation step. Accordingly, the solidified film K cannot occasionally sublimate efficiently in the currently-used substrate treating method. In the currently-used substrate treating method, the solidified film K does not easily sublimate entirely in the sublimation step especially when the second solidified film Kb is harder to sublimate than the first solidified film Ka. For example, the second solidified film Kb does not sublimate easily in the sublimation step in the currently-used substrate treating method when the second solidified film Kb has a thickness larger than that of the first solidified film Ka as shown in FIG. 16. In such cases, it takes a significantly long time for the sublimation step. As a result, a throughput of the substrate treating method is lowered. As described above, the substrate treating method according to the second embodiment produces a much larger effect than the currently-used substrate treating method when the second solidified film Kb is harder to sublimate than the first solidified film Ka.

After the sublimation step is completed, the removing step starts. Accordingly, the removing step is not performed until the sublimation step is completed. Consequently, the removing step is not performed until drying of the pattern forming area W1*a* is completed. Therefore, the pattern P can be protected more suitably.

In the removing step, the second solidified film Kb is changed to a gas phase. Changing the second solidified film Kb into the gas phase achieves suitable removal of the second solidified film Kb from the substrate W.

Here, in the removing step, the second solidified film Kb may be changed into liquid temporarily before being changed into gas. In the removing step, the second solidified film Kb may be changed into gas via liquid. That is, the second solidified film Kb may melt in the removing step. As described above, the second solidified film Kb is positioned on the pattern non-forming area W1*b*. The second solidified film Kb is not positioned on the pattern forming area W1*a*. Accordingly, even if the second solidified film Kb is temporarily changed into liquid, the liquid does not reach the pattern forming area W1*a*. This can protect the pattern P suitably even if the second solidified film Kb is temporarily changed into liquid.

In the removing step, the second solidified film Kb vaporizes. Vaporizing the second solidified film Kb into the gas phase achieves suitable removal of the second solidified film Kb from the substrate W.

In the removing step, the second gas is blown to the second solidified film Kb. Accordingly, the second gas can change the second solidified film Kb into the gas phase suitably. As a result, with the removing step, the second solidified film Kb can be removed from the substrate W suitably.

In the removing step, the second gas is not blown out toward the pattern forming area W1*a*. As a result, the pattern P can be protected suitably in the removing step.

The flow rate Q2 is larger than the flow rate Q1, for example. Specifically, the flow rate Q2 of the second gas blown out toward the second solidified film Kb in the removing step is larger than the flow rate Q1 of the first gas blown out toward the first solidified film Ka in the sublimation step. Accordingly, the second gas can change the second solidified film Kb into the gas phase efficiently. As a result, with the removing step, the second solidified film Kb can be removed from the substrate W efficiently. In other words, removal of the second solidified film Kb can be promoted suitably. For example, reduction in time for the removing step can be achieved.

In the removing step, the second solidified film Kb is heated with the second gas. The second gas can change the second solidified film Kb into the gas phase more efficiently. As a result, with the removing step, the second solidified film Kb can be removed from the substrate W more efficiently. In other words, removal of the second solidified film Kb can be promoted suitably.

The second gas has a temperature T2 higher than the temperature T1 of the first gas, for example. Accordingly, the second gas can heat the second solidified film Kb suitably. As a result, removal of the second solidified film Kb can be promoted suitably.

The second gas has a temperature T2 higher than room temperature, for example. Accordingly, the second gas can heat the second solidified film Kb suitably. As a result, removal of the second solidified film Kb can be promoted suitably.

The second gas has a temperature T2 higher than the melting point MP of the sublimable substance, for example. The second gas can change the second solidified film Kb into the gas phase more efficiently. Moreover, this can protect the pattern P suitably even if the second solidified film Kb is temporarily changed into liquid.

The second gas has a temperature higher than the melting point of the second solidified film Kb, for example. The second gas can change the second solidified film Kb into the gas phase more efficiently. Moreover, this can protect the pattern P suitably even if the second solidified film Kb is temporarily changed into liquid.

The rotation speed v2 of the substrate W in the removing step is higher than the rotation speed v1 of the substrate W in the sublimation step, for example. As a result, the second solidified film Kb can be removed from the substrate W more efficiently.

In the sublimation step, the solidified film K is not heated. Accordingly, the solidified film K can sublimate appropriately in the sublimation step. In other words, changing of the solidified film K into liquid can be suppressed suitably in the sublimation step. In the sublimation step, the solidified film K is hard to change into liquid. Melting of the solidified film K can be suppressed in the sublimation step. In the sublimation step, the solidified film K is hard to melt. Therefore, the pattern P can be protected more suitably.

In the sublimation step, the substrate W is not heated. Accordingly, the solidified film K can sublimate appropriately in the sublimation step. Therefore, the pattern P can be protected more suitably.

The sublimable substance has a vapor pressure of 100 Pa or less at room temperature, for example. When the sublimable substance has a vapor pressure of 100 Pa or less, the vapor pressure of the sublimable substance is relatively low. Inventors have found that, when the vapor pressure of the sublimable substance is relatively low, the second solidified film Kb is harder to be sublimated than the first solidified film Ka. Inventors have also found that, when the vapor pressure of the sublimable substance is relatively low, a thickness of the second solidified film Kb is easily larger than a thickness of the first solidified film Ka. As described above, the substrate treating method according to the second embodiment includes the removing step in addition to the sublimation step. Accordingly, with the substrate treating method in the second embodiment, the second solidified film Kb can be removed from the substrate W suitably even when the second solidified film Kb is hard to be sublimated. Consequently, the substrate W can be treated efficiently with the substrate treating method even when the vapor pressure of the sublimable substance is 100 Pa or less. In other words, the substrate treating method produces a significantly large effect when the vapor pressure of the sublimable substance is 100 Pa or less.

3. Third Embodiment

The following describes a substrate treating apparatus 1 according to a third embodiment with reference to the drawings. Like numerals are used to identify like components which are the same as those in the first embodiment or the second embodiment, and the components will not particularly be described.

The third embodiment has an outline of a substrate treating apparatus 1 and a construction of a treatment liquid generating unit 20 substantially same as those in the first embodiment. The following describes a construction of a treating unit 11 according to the third embodiment.

3-1. Construction of Treating Unit 11

Figure 21:
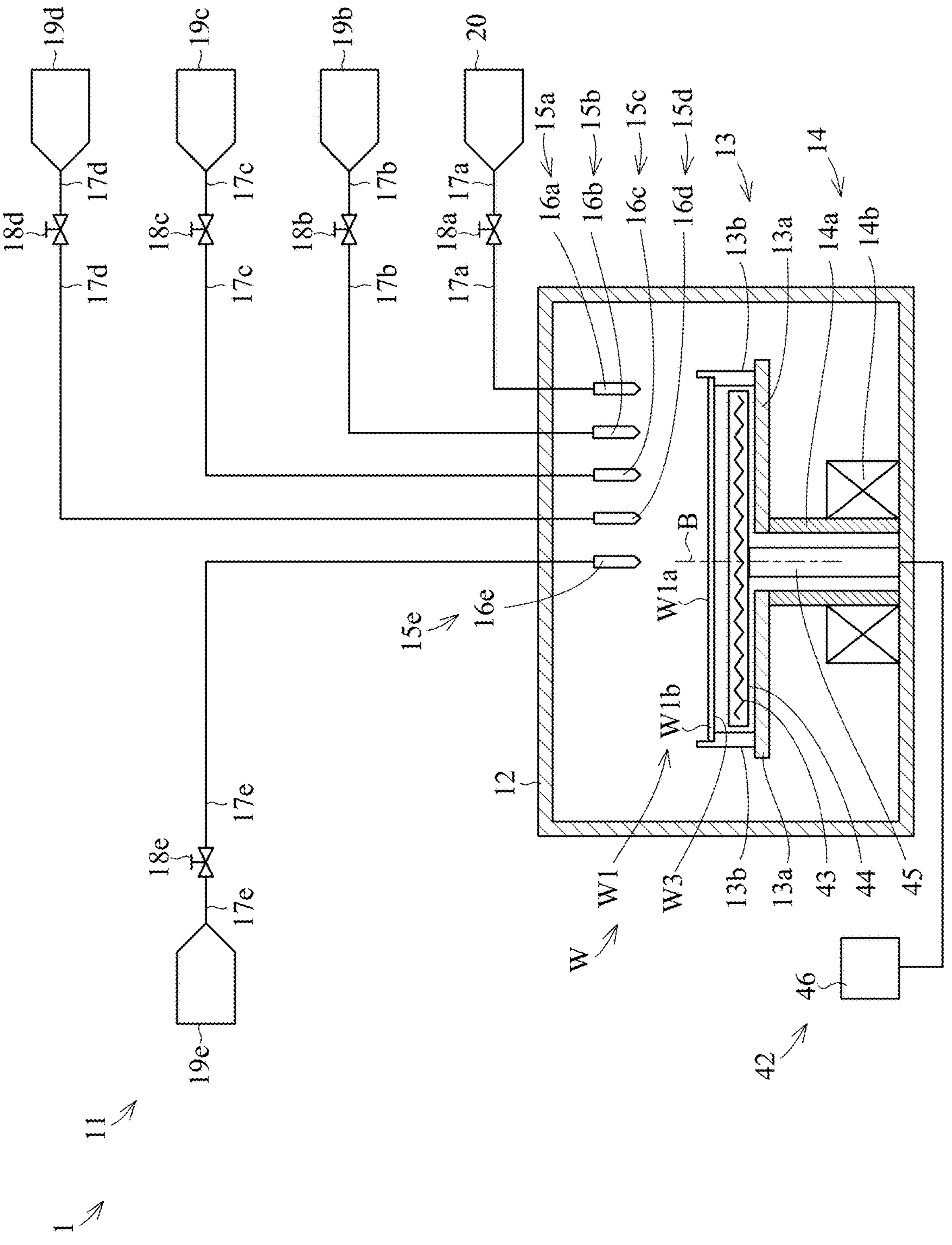
FIG. 21 shows a construction of a treating unit and a treatment liquid generating unit according to a third embodiment.

FIG. 21 shows a construction of the treating unit 11 and the treatment liquid generating unit 20 according to the third embodiment. FIG. 21 simply shows the construction of the treatment liquid generating unit 20. The treating unit 11 includes a heating unit 42. The heating unit 42 heats a second solidified film Kb. The heating unit 42 controls a temperature of the second solidified film Kb.

Specifically, the heating unit 42 heats a substrate W. The heating unit 42 heats the second solidified film Kb, contacting the substrate W, by heating the substrate W. The heating unit 42 heats the second solidified film Kb via the substrate W. The heating unit 42 controls a temperature of the substrate W. The heating unit 42 controls the temperature of the second solidified film Kb by controlling the temperature of the substrate W.

The following describes an example of a structure of the heating unit 42. The heating unit 42 includes a resistance heater 43. The resistance heater 43 is located below the substrate W. The resistance heater 43 includes a heating wire. The resistance heater 43 is also called an electric heater. The resistance heater 43 heats a substrate W. The resistance heater 43 heats a lower surface W3 of the substrate W. The resistance heater 43 heats the entire of the substrate W. The resistance heater 43 heats both a pattern forming area W1*a* and a pattern non-forming area W1*b*.

The heating unit 42 includes a plate 44. The resistance heater 43 is arranged on the plate 44. The resistance heater 43 is installed on a surface of the plate 44 or inside of the plate 44. The plate 44 is located blow the substrate W supported by a substrate holder 13. The plate 44 is located above a base 13*a*, for example.

The plate 44 has a planar and discal shape. The plate 44 has substantially the same dimension as that of the substrate W in plan view, which illustration is omitted. The plate 44 has a circular shape in plan view.

The heating unit 42 includes a fixed shaft 45. The fixed shaft 45 supports the plate 44. The fixed shaft 45 extends over the rotation axis B. The fixed shaft 45 is located in a hollow portion of a rotary shaft 14*a*. The fixed shaft 45 does not rotate even when the rotary shaft 14*a* rotates. Accordingly, the resistance heater 43 and the plate 44 do not rotate even when a rotation driving unit 14 rotates the substrate holder 13.

The heating unit 42 includes a power supply 46. The power supply 46 is electrically connected to the resistance heater 43. The power supply 46 supplies electric power to the resistance heater 43. The resistance heater 43 generates heat by the electric power supplied from the power supply 46.

The power supply 46 also adjusts a heating value of the resistance heater 43. The power supply 46 adjusts a heating value of the resistance heater 43, whereby the temperature of the substrate W is controlled.

A treatment liquid supplied from the supplying unit 15*a* is similar to that in the second embodiment. Specifically, the treatment liquid contains a sublimable substance and a solvent. The sublimable substance in the third embodiment may contain at least one selected from the chemical compounds a to d described above. The sublimable substance in the third embodiment need not contain at least one selected from the chemical compounds a to d. The sublimable substance in the third embodiment may contain a compound except the chemical compounds a to d.

The sublimable substance may have a vapor pressure of 100 Pa or less. More specifically, a vapor pressure of the sublimable substance at room temperature may be 100 Pa or less.

Alternatively, a vapor pressure of the sublimable substance at room temperature may be 100 Pa or more.

Moreover, it is preferred that a vapor pressure of the sublimable substance at room temperature is 0.1 Pa or more.

The controller 10 controls the heating unit 42, which illustration is omitted. The controller 10 controls the power supply 46.

3-2. Operation Example of Treatment Liquid Generating Unit 20 and Treating Unit 11

Reference is made to FIG. 14 for convenience. The substrate treating method according to the third embodiment includes a Step S21 in addition to the Steps S1 and S11 to S18 described in the first embodiment. Operation in the Steps S1, S11 to S14 and S18 are substantially common between the first embodiment and the third embodiment. Accordingly, description about the operation in the Steps S1, S11 to S14 and S18 is to be omitted. Operation in the Steps S15 to S17 are substantially common between the second embodiment and the third embodiment. Accordingly, simple description is to be made of operation in Steps S15 to S17. Detailed description is to be made of operation in Step S21.

Step S15: Treatment Liquid Supplying Step

Reference is made to FIG. 15 for convenience. The supplying unit 15*a* supplies the treatment liquid to the substrate W. The supplying unit 15*a* supplies the treatment liquid to an upper surface W1 of a substrate W. A liquid film H of the treatment liquid is formed on the upper surface W1 of the substrate W.

Step S16: Solidified Film Forming Step

Reference is made to FIG. 16 for convenience. In the solidified film forming step, the solvent evaporates from the treatment liquid on the substrate W. In the solidified film forming step, the solvent evaporates from the liquid film H. In the solidified film forming step, a solidified film K is formed on the upper surface W1 of the substrate W.

The solidified film K has a first solidified film Ka and a second solidified film Kb. The first solidified film Ka is positioned on a pattern forming area W1*a*. The second solidified film Kb is positioned on a pattern non-forming area W1*b*. The second solidified film Kb is not positioned on the pattern forming area W1*a*. The first solidified film Ka contacts the pattern forming area W1*a*. The second solidified film Kb contacts the pattern non-forming area W1*b*.

Step S17: Sublimation Step

Reference is made to FIGS. 17 and 18 for convenience. The supplying unit 15*e* blows out first gas to the first solidified film Ka. Thereby, the first solidified film Ka sublimates.

In the sublimation step, the substrate W is rotated at a rotation speed v1. In the sublimation step, the nozzle 16*e* blows out the first gas at a flow rate Q1. In the sublimation step, the first gas has a temperature T1. The temperature T1 is equal to or lower than room temperature, for example. In the sublimation step, the first solidified film Ka sublimates while the temperature of the solidified film K is kept equal to or lower than room temperature.

Step S21: Removing Step

The removing step starts after the sublimation step is completed. In the removing step, the second solidified film Kb is heated. Thereby, in the removing step, the second solidified film Kb is removed from the substrate W.

Figure 22:
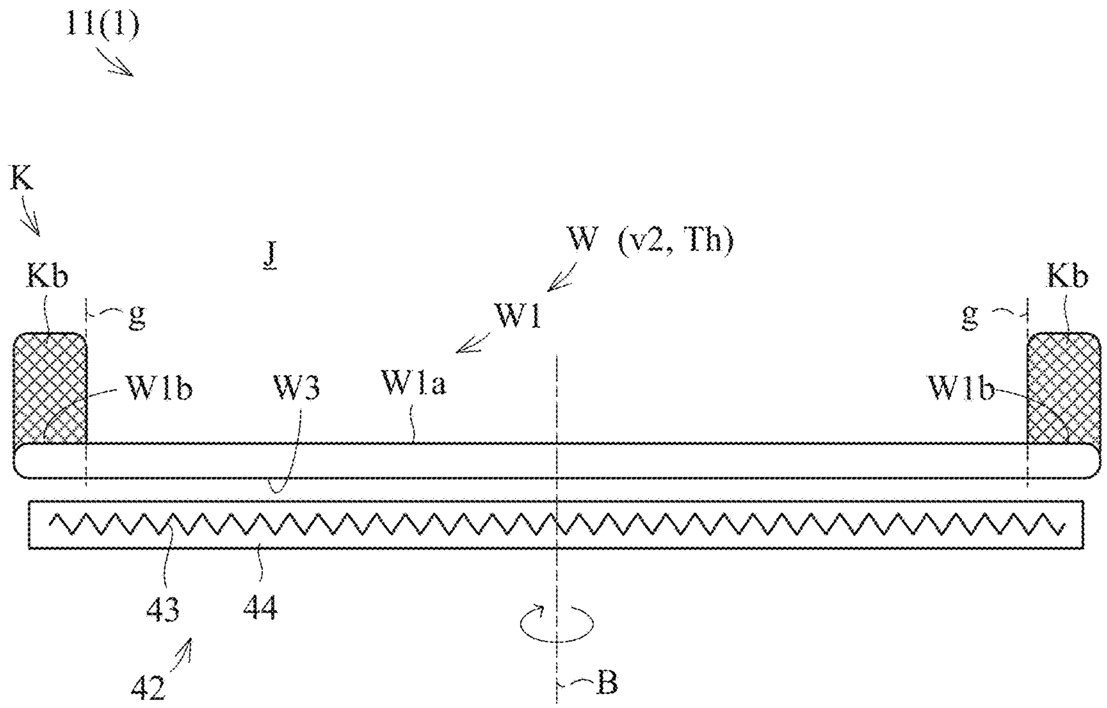
FIG. 22 schematically shows a substrate in a removing step.

FIG. 22 schematically shows the substrate W in the removing step. The substrate W is in substantially a horizontal posture. The substrate W is rotated around the rotation axis B.

The resistance heater 43 heats a lower surface W3 of the substrate W. The resistance heater 43 heats the entire of the lower surface W3 of the substrate W. The resistance heater 43 heats the pattern forming area W1*a* and the pattern non-forming area W1*b*.

The second solidified film Kb is heated via the substrate W. Specifically, the second solidified film Kb is heated via the pattern non-forming area W1*b* contacting the second solidified film Kb.

When the second solidified film Kb is heated, the second solidified film Kb vaporizes. The second solidified film Kb vaporizes, thereby being removed from the substrate W (specifically, pattern non-forming area W1*b*).

Here, the second solidified film Kb may be changed into the gas phase not through a liquid phase. Alternatively, the second solidified film Kb may be changed into the gas phase through the liquid phase. Since the second solidified film Kb is changed to the gas phase in any cases, the second solidified film Kb is removed from the pattern non-forming area W1*b*. Even if the second solidified film Kb is temporarily changed into liquid before the second solidified film Kb is changed into gas, the liquid does not reach the pattern forming area W1*a*.

Figure 23:
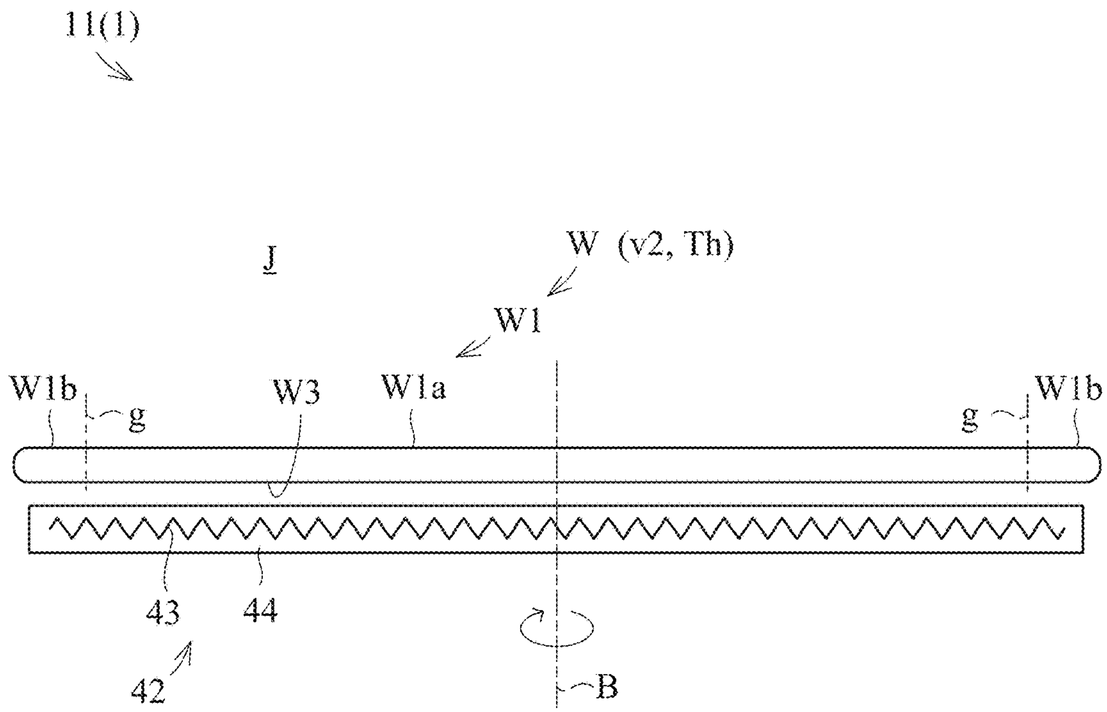
FIG. 23 schematically shows the substrate in the removing step.

FIG. 23 schematically shows the substrate W in the removing step. As shown in FIG. 23, the second solidified film Kb entirely vaporizes when the removing step is completed. When the removing step is completed, the second solidified film Kb does not remain on the pattern non-forming area W1*b*. With the removing step, the pattern non-forming area W1*b* is dried. This results in drying of the substrate W entirely.

The following describes a treatment condition of the removing step. In the removing step, the substrate W is rotated at the rotation speed v2. The heating unit 42 heats the substrate W to the temperature Th in the removing step. Accordingly, the substrate W has the temperature Th in the removing step.

Here, the rotation speed v2 may be substantially equal to the rotation speed v1, for example. Alternatively, the rotation speed v2 may be higher than the rotation speed v1. When the rotation speed v2 is higher than the rotation speed v1, the second solidified film Kb can be removed more rapidly.

The following three examples are to be given for the temperature Th.

First Example of Temperature Th

The temperature Th is higher than the temperature T1.

In the first example, the second solidified film Kb is removed as under. When the removing step starts, the second solidified film Kb has a temperature substantially equal to the temperature T1. Accordingly, in the first example, the temperature Th is higher than the temperature of the second solidified film Kb when the removing step starts. Consequently, the temperature of the second solidified film Kb rises when the substrate W is heated to the temperature Th. That is, the second solidified film KB is heated via the substrate W (specifically, pattern non-forming area W1*b*). In the removing step, the second solidified film Kb is changed into a gas phase while being heated. Consequently, the second solidified film Kb is removed rapidly.

Second Example of Temperature Th

The temperature Th is higher than room temperature.

In the second example, the second solidified film Kb is removed as under. When the removing step starts, the second solidified film Kb has a temperature substantially equal to or lower than room temperature. Accordingly, in the second example, the temperature Th is higher than the temperature of the second solidified film Kb when the removing step starts. As a result, the second solidified film KB is heated via the substrate W (specifically, pattern non-forming area W1*b*). In the removing step, the second solidified film Kb is changed into a gas phase while being heated. Consequently, the second solidified film Kb is removed rapidly.

Third Example of Temperature Th

For example, the temperature Th is higher than a melting point MP of the sublimable substance at normal pressure. For example, the temperature Th is higher than a melting point of the solidified film K at normal pressure.

In the third example, the second solidified film Kb is removed as under. When the removing step starts, the second solidified film Kb has a temperature lower than the melting point MP. Accordingly, in the third example, the temperature Th is higher than the temperature of the second solidified film Kb when the removing step starts. As a result, the second solidified film Kb is heated via the substrate W (specifically, pattern non-forming area W1*b*). In the removing step, the second solidified film Kb is changed into a gas phase while being heated. Consequently, the second solidified film Kb is removed rapidly.

As described above, the second solidified film Kb is heated via the substrate W in the first example, the second example, and the third example at the temperature Th.

3-3. Effect of Third Embodiment

The third embodiment produces a similar effect to that of the second embodiment. For example, since the substrate treating method according to the third embodiment includes the removing step in addition to the sublimation step, the substrate W can be treated efficiently. Moreover, the third embodiment produces the following effect.

In the removing step, the second solidified film Kb is heated. As a result, with the removing step, the second solidified film Kb can be removed from the substrate W more efficiently.

The pattern non-forming area W1*b* is heated and the second solidified film Kb is heated via the pattern non-forming area W1*b* in the removing step. The second solidified film Kb is positioned on a pattern non-forming area W1*b*. Accordingly, the pattern non-forming area W1*b* is in contact with the second solidified film Kb. As a result, heating the pattern non-forming area W1*b* can cause suitable heating of the second solidified film Kb via the pattern non-forming area W1*b*.

In the removing step, the pattern non-forming area W1*b* is heated to the temperature Th higher than the temperature T1 of the first gas, for example. Accordingly, the second solidified film Kb can be heated suitably. The second solidified film Kb is removed from the substrate W efficiently. Removal of the second solidified film Kb is promoted suitably. This can promote drying of the pattern non-forming area W1*b* suitably.

In the removing step, the pattern non-forming area W1*b* is heated to the temperature Th higher than room temperature, for example. Accordingly, the second solidified film Kb can be heated suitably. The second solidified film Kb is removed from the substrate W efficiently. Removal of the second solidified film Kb is promoted suitably. This can promote drying of the pattern non-forming area W1*b* suitably.

In the removing step, the pattern non-forming area W1*b* is heated to the temperature Th higher than the melting point MP of the sublimable substance, for example. The second solidified film Kb can be heated to a relatively high temperature taking advantage of the feature that the second solidified film Kb is not positioned on the pattern forming area W1*a*. The second solidified film Kb is removed from the substrate W more efficiently. Removal of the second solidified film Kb is promoted largely. Consequently, the second solidified film Kb can be changed into the gas phase more efficiently.

In the removing step, the pattern non-forming area W1*b* has a temperature higher than the melting point of the second solidified film Kb, for example. The second solidified film Kb can be heated to a relatively high temperature taking advantage of the feature that the second solidified film Kb is not positioned on the pattern forming area W1*a*. The second solidified film Kb is removed from the substrate W more efficiently. Removal of the second solidified film Kb is promoted largely. Consequently, the second solidified film Kb can be changed into the gas phase more efficiently.

In the removing step, the lower surface W3 of the substrate W is heated. Accordingly, the pattern non-forming area W1*b* can be heated suitably.

In the removing step, the substrate W is entirely heated. Accordingly, the pattern non-forming area W1*b* can be heated suitably. Moreover, in the removing step, an organic matter adhered to the substrate W can be removed together with the second solidified film Kb.

In the removing step, the second solidified film Kb is heated with the resistance heater 43. Accordingly, the second solidified film Kb can be heated suitably.

The rotation speed v2 of the substrate W in the removing step is higher than the rotation speed v1 of the substrate W in the sublimation step, for example. As a result, the second solidified film Kb can be removed from the substrate W more efficiently.

This invention is not limited to the foregoing examples, but may be modified as follows.

(1) In the first to third embodiments, the treatment liquid is generated in the tank 21. However, the present invention is not limited to this. The treatment liquid can be generated in a flow path that is in fluid communication with the supplying unit 15*a*, for example.

Figure 24:
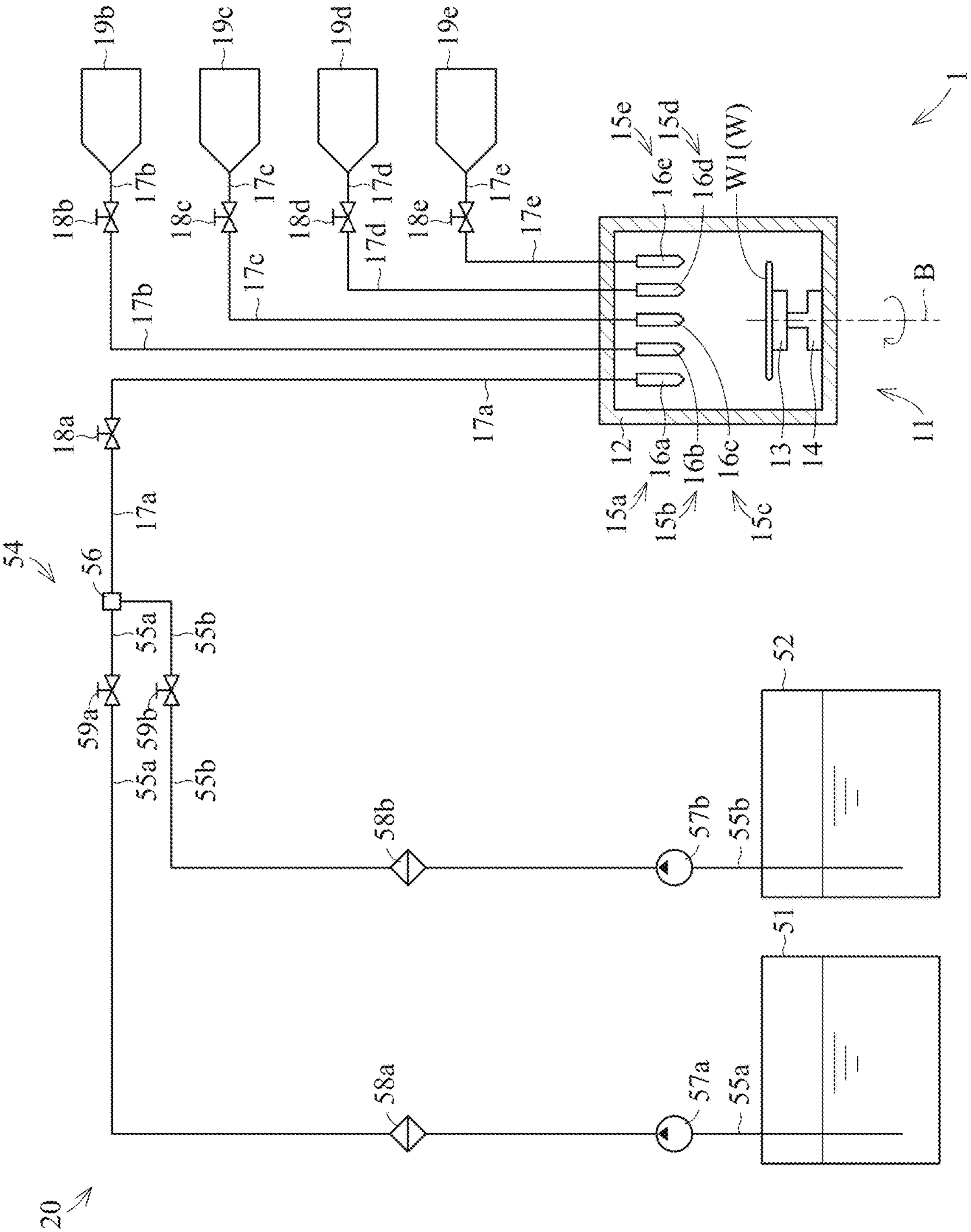
FIG. 24 shows a construction of a treating unit and a treatment liquid generating unit according to one modification.

FIG. 24 shows a construction of a treating unit 11 and a treatment liquid generating unit 20 according to one modification. Like numerals are used to identify like components which are the same as those in the first embodiment, and the components will not particularly be described.

The treatment liquid generating unit 20 includes a first tank 51 and a second tank 52. The first tank 51 stores a sublimable substance. For example, the first tank 51 may store a solvent together with the sublimable substance. The second tank 52 stores a solvent. For example, the second tank 52 stores only the solvent.

The treatment liquid generating unit 20 includes a mixing unit 54. The mixing unit 54 generates the treatment liquid. The mixing unit 54 is connected to the first tank 51 and the second tank 52. The mixing unit 54 is in fluid communication with the first tank 51 and the second tank 52.

The mixing unit 54 is also connected to the supplying unit 15*a*. The mixing unit 54 is also in fluid communication with the supplying unit 15*a*. The mixing unit 54 feeds the treatment liquid to the supplying unit 15*a*.

The mixing unit 54 includes pipes 55*a* and 55*b*, and a joint 56. The first tank 51 is connected to the joint 56 via the pipe 55*a*. The first tank 51 is in fluid communication with the joint 56 via the pipe 55*a*. The second tank 52 is connected to the joint 56 via the pipe 55*b*. The second tank 52 is in fluid communication with the joint 56 via the pipe 55*b*. The joint 56 is also connected to a pipe 17*a*. The joint 56 is also in fluid communication with the pipe 17*a*. The pipes 17*a*, 55*a*, and 55*b* are in fluid communication with one another through the joint 56.

The mixing unit 54 includes pumps 57*a* and 57*b*. The pumps 57*a* and 57*b* are provided on the pipes 55*a* and 55*b*, respectively. The pump 57*a* feeds the sublimable substance from the first tank 51 to the joint 56 via the pipe 55*a*. The pump 57*b* feeds the solvent from the second tank 52 to the joint 56 via the pipe 55*b*.

The mixing unit 54 includes filters 58*a* and 58*b*. The filters 58*a* and 58*b* are provided on the pipes 55*a* and 55*b*, respectively. The filer 58*a* filters the sublimable substance that flows in the pipe 55*a*. The filer 58*b* filters the solvent that flows in the pipe 55*b*.

The mixing unit 54 includes valves 59*a* and 59*b*. The valves 59*a* and 59*b* are provided on the pipes 55*a* and 55*b*, respectively. The valve 59*a* regulates a flow rate of the sublimable substance that flows in the pipe 55*a*. The valve 59*b* regulates a flow rate of the solvent that flows in the pipe 55*b*. Each of the valves 59*a* and 59*b* may include, for example, a flow rate regulating valve. Each of the valves 59*a* and 59*b* may include, for example, a flow rate regulating valve and an on-off valve.

The sublimable substance enters the joint 56 at a flow rate regulated by the valve 59*a*. The solvent enters the joint 56 at a flow rate regulated by the valve 59*b*. The sublimable substance and the solvent meet at the joint 56. The treatment liquid containing the sublimable substance and the solvent is generated at the joint 56. The generated treatment liquid flows from the joint 56 to the supplying unit 15*a*.

(2) Combination of the second embodiment and the third embodiment may be made as appropriate. For example, in the removing step in the second embodiment, the substrate W may be heated with the heating unit 42 in such a manner as described in the third embodiment. For example, in the removing step in the third embodiment, the second gas may be blown out toward the second solidified film Kb in such a manner as described in the second embodiment.

(3) In the second and third embodiments, a period of time where the removing step is performed does not overlap with a period of time where the sublimation step is performed. However, the present invention is not limited to this. For example, a period of time where the removing step is performed may overlap with at least part of a period of time where the sublimation step is performed. With this modification, reduction in time for performing the sublimation step and the removing step entirely can be achieved. As a result, the substrate W can be treated more efficiently.

For example, the removing step may start after the sublimation step starts. For example, the removing step may start after the sublimation step starts and before the sublimation step is completed. With this modification, drying the pattern forming area W1*a* starts before the removing step.

This can handle both protection of the pattern P and effective treatment to the substrate W suitably.

(4) In the second embodiment, the nozzle 16*e* blows out the first gas in the sublimation step, and the nozzle 16*f* blows out the second gas in the removing step. As described above, the two different nozzles 16*e* and 16*f* blow out the first gas and the second gas, respectively. The nozzle 16*f* that blows out the second gas in the removing step differs from the nozzle 16*e* that blows out the first gas in the sublimation step. However, the present invention is not limited to this. A common nozzle may blow out the first gas and the second gas. For example, the nozzle 16*e* may blow out the first gas in the sublimation step and may blow out the second gas in the removing step. The nozzle 16*e* may be provided so as to be movable between a first treating position above the pattern forming area W1*a* and a second treating position above the pattern non-forming area W1*b*. In the sublimation step, the nozzle 16*e* may be located at the first treating position. When the nozzle 16*e* is located at the first treating position, the nozzle 16*e* may blow out the first gas to the first solidified film Ka. In the removing step, the nozzle 16*e* may be located at the second treating position. When the nozzle 16*e* is located at the second treating position, the nozzle 16*e* may blow out the second gas to the second solidified film Kb. The nozzle 16*e* may be provided so as to be movable between a first posture pointing the pattern forming area W1*a* and a second posture pointing the pattern non-forming area W1*b*. In the sublimation step, the nozzle 16*e* may be at the first posture. When the nozzle 16*e* is at the first posture, the nozzle 16*e* may blow out the first gas to the first solidified film Ka. In the removing step, the nozzle 16*e* may be at the second posture. When the nozzle 16*e* is at the second posture, the nozzle 16*e* may blow out the second gas to the second solidified film Kb.

(5) In the sublimation step in the second and third embodiments, the first gas is blown out toward the center of the first solidified film Ka, for example. However, the present invention is not limited to this. For example, in the sublimation step, the first gas may be blown out toward a portion except the center of the first solidified film Ka. For example, in the sublimation step, the first gas may be blown out toward the entire of the first solidified film Ka. For example, in the sublimation step, the nozzle 16*e* may blow out the first gas toward the first solidified film Ka while the nozzle 16*e* moves horizontally. For example, in the sublimation step, the nozzle 16*e* may blow out the first gas toward the first solidified film Ka while the nozzle 16*e* moves above the first solidified film Ka. For example, in the sublimation step, the first gas may be blown out toward at least part of the second solidified film Kb in addition to the first solidified film Ka.

(6) In the second embodiment, in the removing step, the second gas is not blown out toward the pattern forming area W1*a*. However, the present invention is not limited to this. In the removing step, the second gas may be blown out toward at least part of the pattern forming area W1*a*.

(7) In the second and third embodiments, in the removing step, the supplying unit 15*e* does not blow out the first gas toward the pattern forming area W1*a*. However, the present invention is not limited to this. For example, in the removing step, the supplying unit 15*e* may blow out the first gas toward the pattern forming area W1*a*.

(8) In the third embodiment, the second solidified film Kb is heated via the pattern non-forming area W1*b*. However, the present invention is not limited to this. For example, the second solidified film Kb is heated not via the pattern non-forming area W1*b*. For example, the second solidified film Kb may be heated directly. For example, the resistance heater 43 may be located above the substrate W. For example, the resistance heater 43 may radiate heat toward the second solidified film Kb.

(9) In the third embodiment, the substrate W is entirely heated. However, the present invention is not limited to this. For example, the substrate W may be heated only partially.

(10) In the third embodiment, not only the pattern non-forming area W1*b* but also the pattern forming area W1*a* are heated. However, the present invention is not limited to this. For example, the pattern forming area W1*a* need not be heated. For example, the resistance heater 43 need not be located below the pattern forming area W1*a*. For example, the resistance heater 43 may heat only the pattern non-forming area W1*b* substantially. For example, the resistance heater 43 may be located only below the pattern non-forming area W1*b*.

(11) In the third embodiment, the second solidified film Kb is heated with the resistance heater 43. However, the present invention is not limited to this. For example, a lamp heater may heat the second solidified film Kb. The lamp heater is also called an optical heater. The lamp heater applies light such as infrared rays, for example. The lamp heater includes a light source such as a lamp for emitting light, for example. The lamp heater may be located above the substrate W. For example, the lamp heater may heat the second solidified film Kb by applying light to the second solidified film Kb. Alternatively, the lamp heater may be located below the substrate W. The lamp heater may heat the pattern non-forming area W1*b* by emitting light to the lower surface W3 of the substrate W, and may heat the second solidified film Kb via the pattern non-forming area W1*b*, for example. In this way, the lamp heater can also heat the second solidified film Kb suitably.

For example, the second solidified film Kb may be heated with a high-temperature fluid. The high-temperature fluid is gas or a liquid having a temperature high enough to heat the second solidified film Kb. For example, the high-temperature fluid may be dispensed toward the lower surface W3 of the substrate W. For example, the treating unit 11 may include a nozzle for dispensing the high-temperature fluid. The nozzle for dispensing the high-temperature fluid may be located below the substrate W, for example. For example, the nozzle for dispensing the high-temperature fluid may be located at the opening of the base 13*a* or the hollow portion of the rotary shaft 14*a*. The pattern non-forming area W1*b* may be heated with use of the high-temperature fluid and the second solidified film Kb may be heated via the pattern non-forming area W1*b*. In this way, the second solidified film Kb can be heated suitably also with the high-temperature fluid.

(12) In the second and third embodiments, the second solidified film Kb may sublimate at least partially in the sublimation step. Thereby, an amount of the second solidified film Kb to be removed in the removing step can be reduced. As a result, with the removing step, the second solidified film Kb can be removed easily.

(13) In the treatment liquid supplying step in the second and third embodiments, the liquid film H bulges upward in the pattern non-forming area W1*b*, as shown in FIG. 15. However, the present invention is not limited to this. For example, the liquid film H need not bulge upward substantially in the pattern non-forming area W1*b*. For example, a thickness of the liquid film H on the pattern non-forming area W1*b* may be substantially equal to a thickness of the liquid film H on the pattern forming area W1*a*. In this case, the second solidified film Kb bulges upward relatively slightly. As a result, with the removing step, the second solidified film Kb can be removed easily.

(14) In the solidified film forming step in the second and third embodiments, the second solidified film Kb bulges upward as shown in FIG. 16. However, the present invention is not limited to this. For example, the second solidified film Kb need not bulge upward substantially. For example, a thickness of the second solidified film Kb may be substantially equal to a thickness of the first solidified film Ka. In this case, in the removing step, the second solidified film Kb can be removed easily.

(15) In the first to third embodiments, the chemical liquid supplying step, the rinse liquid supplying step, and the replacement liquid supplying step are included. However, the present invention is not limited to this. For example, at least any of the chemical liquid supplying step, the rinse liquid supplying step, and the replacement liquid supplying step may be omitted. For example, all of the chemical liquid supplying step, the rinse liquid supplying step, and the replacement liquid supplying step may be omitted.

(16) In the first to third embodiments, a liquid (e.g., replacement liquid) exists on the substrate W when the treatment liquid supplying step is performed. That is, the treatment liquid is supplied to a non-dried substrate W in the treatment liquid supplying step. However, the present invention is not limited to this. For example, a liquid (e.g., replacement liquid) need not exist on the substrate W when the treatment liquid supplying step is performed. For example, the treatment liquid may be supplied to a dried substrate W in the treatment liquid supplying step.

(17) In the first to third embodiments, the replacement liquid is removed from the substrate W with the treatment liquid in the treatment liquid supplying step. However, the present invention is not limited to this. For example, the substrate W may be cleaned with the treatment liquid in the treatment liquid supplying step. For example, foreign substances attached to the substrate W may be removed with the treatment liquid in the treatment liquid supplying step. For example, foreign substances attached to the substrate W may be dissolved with the treatment liquid in the treatment liquid supplying step. The foreign substances are, for example, resist residual.

(18) In the first to third embodiments, gas is not supplied to the substrate W in the solidified film forming step. However, the present invention is not limited to this. Gas may be supplied to the substrate W in the solidified film forming step. Gas may be supplied to the treatment liquid on the substrate W in the solidified film forming step. This can form the solidified film K on the substrate W efficiently in the solidified film forming step.

(19) In the first to third embodiments, the chemical liquid is hydrofluoric acid, for example. Accordingly, in the chemical liquid supplying step, the substrate W is reformed to be hydrophobic. Accordingly, the substrate W has hydrophobicity when the treatment liquid supplying step is performed. The treatment liquid supplying step is performed to the substrate W having the hydrophobicity. However, the present invention is not limited to this. For example, the substrate W may have hydrophilicity when the treatment liquid supplying step is performed. For example, the treatment liquid supplying step may be performed to the substrate W having the hydrophophilic. The following describes one modification in detail.

(19-1) Construction of Modification

Figure 25:
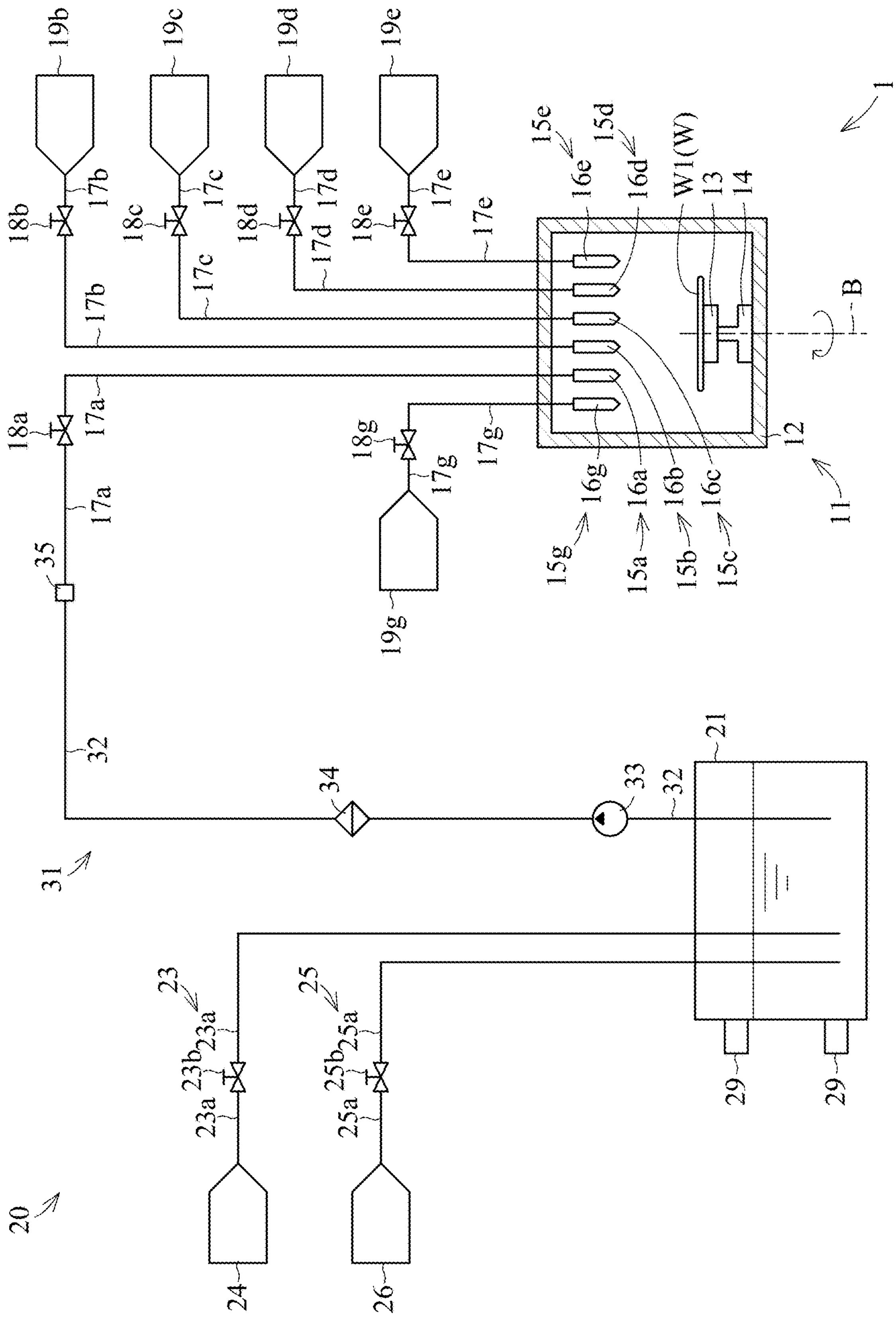
FIG. 25 shows a construction of a treating unit and a treatment liquid generating unit according to another modification.

The present modification has an outline of a substrate treating apparatus 1 and a construction of a treatment liquid generating unit 20 substantially same as those in the first embodiment. The following describes a construction of a treating unit 11 according to the modification. FIG. 25 shows a construction of a treating unit 11 and a treatment liquid generating unit 20 according to the modification. Like numerals are used to identify like components which are the same as those in the first embodiment, and the components will not particularly be described.

The treating unit 11 includes a supplying unit 15*g* in addition to the supplying units 15*a* to 15*e*. The supplying unit 15*g* supplies a hydrophilic agent to the substrate W. The supplying unit 15*g* supplies the hydrophilic agent to the substrate W held by the substrate holder 13. The hydrophilic agent is SC1, for example. SC1 is a mixed liquid of ammonia, hydrogen peroxide, and deionized water. SC1 is also called "APM" or "ammonia hydrogen peroxide mixture".

The supplying unit 15*g* a includes a nozzle 16*g*, a pipe 17*g*, and a valve 18*g*. The nozzle 16*g* is located inside of the casing 12. The nozzle 16*g* dispenses the hydrophilic agent. The pipe 17*g* is connected to the nozzle 16*g*. The valve 18*g* is provided on the pipe 17*g*. The valve 18*g* controls supply of the hydrophilic agent.

The supplying unit 15*g* is connected to a hydrophilic agent supplying source 19*g*. The supplying unit 15*g* is in fluid communication with the hydrophilic agent supplying source 19*g*. The hydrophilic agent supplying source 19*g* is connected to the pipe 17*g*, for example. The hydrophilic agent supplying source 19*g* feeds the hydrophilic agent to the supplying unit 15*g*.

(19-2) Exemplary Operation of Modification

Figure 26:
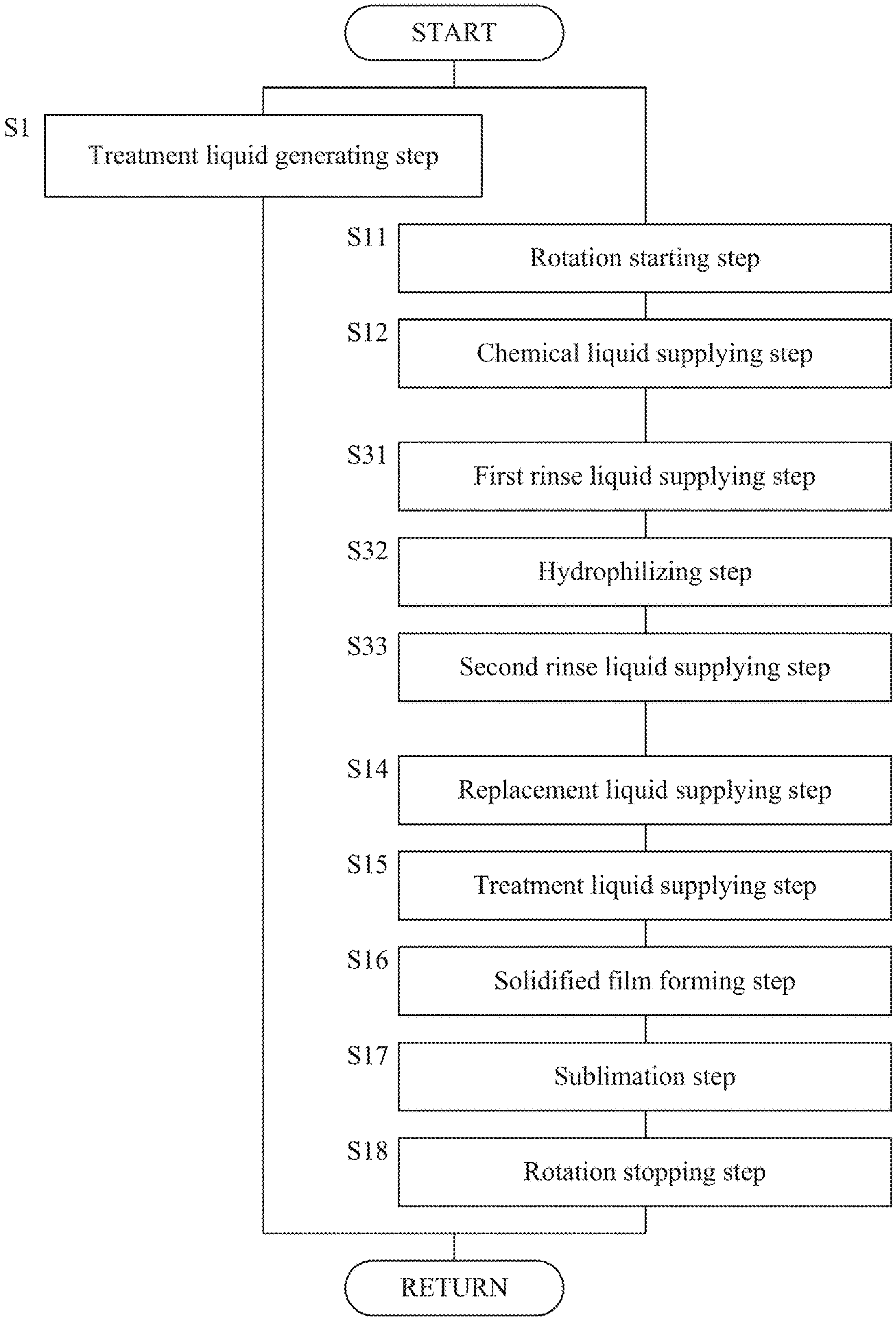
FIG. 26 is a flow chart showing procedures of a substrate treating method according to the modification.

FIG. 26 is a flow chart showing procedures of a substrate treating method according to this modification. The substrate treating method according to this modification includes the Steps S1, S11 and S12, and S14 to S18 described in the first embodiment. The substrate treating method according to this modification also includes Steps S31 to S33 instead of the Step S13 described in the first embodiment. The Steps S31 to S33 are performed after the Step S12. The Steps S31 to S33 are performed before the Step S14. Operation in the Steps S1, S11 and S12, and S14 to S18 are substantially common between the first embodiment and this modification. Accordingly, description about the operation in the Steps S1, S11, and S16 to S18 is to be omitted. The following describes operation in Steps S12, S31 to S33, S14, and S15.

Step S12: Chemical Liquid Supplying Step

The supplying unit 15*b* supplies a chemical liquid to the substrate W. The chemical liquid is supplied onto the upper surface W1 of the substrate W. For example, the substrate W is etched with the chemical liquid. Then, the supplying unit 15*b* stops supply of the chemical liquid to the substrate W.

When the chemical liquid is hydrofluoric acid, the chemical liquid terminates the upper surface W1 of the substrate W with hydrogens. For example, hydrogen is bonded with an atom (e.g., silicon atom) positioned on the upper surface W1 of the substrate W, for example. Accordingly, the substrate W is reformed to be hydrophobic.

The hydrofluoric acid corresponds to a hydrophobic agent. The chemical liquid contains the hydrophobic agent, for example.

Step S31: First Rinse Liquid Supplying Step

A first rinse liquid supplying step is performed after the chemical liquid supplying step. The supplying unit 15*c* supplies a rinse liquid to the substrate W. The rinse liquid is supplied onto the upper surface W1 of the substrate W. For example, the substrate W is cleaned with the rinse liquid. For example, the chemical liquid is removed from the substrate W with the rinse liquid. Then, the supplying unit 15*c* stops supply of the rinse liquid to the substrate W.

The substrate W still is terminated with hydrogens even after the first rinse liquid supplying step. Accordingly, the substrate W has hydrophobicity even after the first rinse liquid supplying step.

Step S32: Hydrophilizing Step

The supplying unit 15*g* supplies a hydrophilic agent to the substrate W. Specifically, the valve 18*g* opens. The nozzle 16*g* dispenses the hydrophilic agent. The hydrophilic agent is supplied onto the upper surface W1 of the substrate W. The rinse liquid is removed from the substrate W with the hydrophilic agent. This achieves replacement of the rinse liquid on the substrate W with the hydrophilic agent. Then, the supplying unit 15*g* stops supply of the hydrophilic agent to the substrate W. Specifically, the valve 18*g* closes. The nozzle 16*g* stops dispensing the replacement liquid.

The hydrophilic agent terminates the upper surface W1 of the substrate W with a hydroxyl groups. For example, the hydroxyl group is bonded with an atom (e.g., silicon atom) positioned on the upper surface W1 of the substrate W. Accordingly, the substrate W is reformed from hydrophobic to hydrophilic. For example, an affinity between the substrate W and water when the hydrophilizing step is completed is higher than an affinity between the substrate W and water when the chemical liquid supplying step is completed.

When the hydrophilic agent is SC1, the SC1 forms an oxide film on the upper surface W1, and forms the hydroxyl groups on the oxide film.

Step S33: Second Rinse Liquid Supplying Step

The supplying unit 15*c* supplies a rinse liquid to the substrate W. The rinse liquid is supplied onto the upper surface W1 of the substrate W. For example, the substrate W is cleaned with the rinse liquid. For example, the hydrophilic agent is removed from the substrate W with the rinse liquid. Then, the supplying unit 15*c* stops supply of the rinse liquid to the substrate W.

The substrate W still is terminated with the hydroxyl groups even after the second rinse liquid supplying step. Accordingly, the substrate W has hydrophilicity even after the second rinse liquid supplying step.

Step S14: Replacement Liquid Supplying Step

The supplying unit 15*d* supplies a replacement liquid to the substrate W. The replacement liquid is supplied onto the upper surface W1 of the substrate W. The rinse liquid is removed from the substrate W with the replacement liquid. This achieves replacement of the rinse liquid with the replacement liquid on the substrate W. Then, the supplying unit 15*d* stops supply of the replacement liquid to the substrate W.

The substrate W still is terminated with the hydroxyl groups even after the replacement liquid supplying step. Accordingly, the substrate W has hydrophilicity even after the replacement liquid supplying step.

Step S15: Treatment Liquid Supplying Step

The supplying unit 15*a* supplies the treatment liquid to the substrate W. The supplying unit 15*a* supplies a treatment liquid to the substrate W having hydrophilicity. The replacement liquid is removed from the substrate W with the treatment liquid. This achieves replacement of the replacement liquid on the substrate W with the treatment liquid. Then, the supplying unit 15*a* stops supply of the treatment liquid to the substrate W.

(19-3) Technical Meanings of Chemical Compound a

The following describes technical meanings of the chemical compound a as the sublimable substance from experimental examples 5a and 5b as well as comparative examples 1a, 1b, 2a, 2b, 3a, 3b, 4a, 4b, 5a, 6a, and 7a.

As for a substrate W, a first substrate Wa, a second substrate Wb, and a third substrate We are prepared. The first to third substrates Wa to We each have a pattern P. The pattern P of the first substrate Wa differs from the pattern P of the second substrate Wb. The pattern P of the first substrate Wa differs from the pattern P of the third substrate Wc. The pattern P of the second substrate Wb differs from the pattern P of the third substrate Wc. The pattern P of the first substrate Wa collapses more easily than the pattern P of the second substrate Wb. The pattern P of the second substrate Wb collapses more easily than the pattern P of the third substrate Wc. The pattern P of the first substrate Wa collapses more easily than the pattern P of the third substrate Wc.

The experimental examples 5a and 5b are performed under conditions as below. In each of the experimental examples 5a and 5b, the second substrate Wb is used as the substrate W.

In the experimental example 5a, a series of treatment is performed on the substrate W, the series including the chemical liquid supplying step, a rinse liquid supplying step, a replacement liquid supplying step, a treatment liquid supplying step, a solidified film forming step, and a sublimation step.

In the chemical liquid supplying step, a hydrophobic agent is used as a chemical liquid. The hydrophobic agent is hydrofluoric acid. The hydrofluoric acid is a mixed liquid of hydrogen fluoride and deionized water. A volume ratio of the hydrogen fluoride and the deionized water is as under.

Hydrogen fluoride:Deionized water=1:10 (volume ratio)

In the rinse liquid supplying step, deionized water (DIW) is used as a rinse liquid.

In the replacement liquid supplying step, isopropyl alcohol is used as a replacement liquid.

In the treatment liquid supplying step, a treatment liquid consisting of a sublimable substance and a solvent is used. The sublimable substance is pinacolone oxime. The solvent is isopropyl alcohol (IPA). A volume ratio of the sublimable substance and the solvent is as under.

Sublimable substance:Solvent=1:30 (volume ratio)

That is, a volume ratio RV of the sublimable substance to the solvent is 3.3 [Vol %].

In the solidified film forming step, the substrate W is rotated at a rotation speed of 1500 rpm.

In the sublimation step, first gas is supplied to the substrate W while the substrate W is rotated at the rotation speed of 1500 rpm.

As described above, in the treatment liquid supplying step, the substrate W has hydrophobicity. That is, a surface condition of the substrate W is hydrophobic in the treatment liquid supplying step. An index "a" in the experimental example 5a means that the surface condition of the substrate W is hydrophobic in the treatment liquid supplying step.

In the experimental example 5b, a series of treatment is performed on the substrate W, the series including a chemical liquid supplying step, a first rinse liquid supplying step, a hydrophilizing step, a second rinse liquid supplying step, a replacement liquid supplying step, a treatment liquid supplying step, a solidified film forming step, and a sublimation step. The experimental example 5b is same as the experimental example 5a in conditions of the chemical liquid supplying step, the replacement liquid supplying step, the treatment liquid supplying step, the solidified film forming step, and the sublimation step.

In the first rinse liquid supplying step, deionized water (DIW) is used as a rinse liquid.

In the hydrophilizing step, SC1 is used as a hydrophilic agent. The SC1 is a mixed liquid of ammonia, hydrogen peroxide, and deionized water. A volume ratio of the ammonia, the hydrogen peroxide, and the deionized water is as under.

Ammonia:Hydrogen peroxide:Deionized water=1:8:60 (volume ratio)

In the second rinse liquid supplying step, deionized water (DIW) is used as a rinse liquid.

As described above, in the treatment liquid supplying step, the substrate W has hydrophilicity. That is, a surface condition of the substrate W is hydrophilic in the treatment liquid supplying step. An index "b" in the experimental example 5b means that the surface condition of the substrate W is hydrophilic in the treatment liquid supplying step.

The comparative examples 1a and 1b are performed under conditions as below. In each of the comparative examples 1a and 1b, the third substrate We is used as the substrate W. In the treatment liquid supplying step of the comparative examples 1a and 1b, the treatment liquid consists of a sublimable substance and a solvent. The sublimable substance is cyclohexanone oxime in the comparative examples 1a and 1b. The solvent is isopropyl alcohol (IPA) in the comparative examples 1a and 1b. A volume ratio of the sublimable substance and the solvent is as under in the comparative examples 1a and 1b.

Sublimable substance:Solvent=1:40 (volume ratio)

That is, a volume ratio RV of the sublimable substance to the solvent is 2.5 [Vol %]. The conditions of the comparative example 1a other than the above are the same as those of the experimental example 5a. The conditions of the comparative example 1b other than the above are the same as those of the experimental example 5b.

The comparative examples 2a and 2b are performed under conditions as below. In each of the comparative examples 2a and 2b, the third substrate We is used as the substrate W. In the treatment liquid supplying step of the comparative examples 2a and 2b, the treatment liquid consists of a sublimable substance and a solvent. The sublimable substance is cyclohexanone oxime in the comparative examples 2a and 2b. In the comparative examples 2a and 2b, the solvent is methanol. A volume ratio of the sublimable substance and the solvent is as under in the comparative examples 2a and 2b.

Sublimable substance:Solvent=1:40 (volume ratio)

That is, a volume ratio RV of the sublimable substance to the solvent is 2.5 [Vol %]. The conditions of the comparative example 2a other than the above are the same as those of the experimental example 5a. The conditions of the comparative example 2b other than the above are the same as those of the experimental example 5b.

The comparative examples 3a and 3b are performed under conditions as below. In each of the comparative examples 3a and 3b, the third substrate We is used as the substrate W. In the treatment liquid supplying step of the comparative examples 3a and 3b, the treatment liquid consists of a sublimable substance and a solvent. In the comparative examples 3a and 3b, the sublimable substance is camphor. The solvent is isopropyl alcohol in the comparative examples 3a and 3b. A volume ratio of the sublimable substance and the solvent is as under in the comparative examples 3a and 3b.

Sublimable substance:Solvent=1:110 (volume ratio)

That is, a volume ratio RV of the sublimable substance to the solvent is 0.91 [Vol %]. The conditions of the comparative example 3a other than the above are the same as those of the experimental example 5a. The conditions of the comparative example 3b other than the above are the same as those of the experimental example 5b.

The comparative examples 4a and 4b are performed under conditions as below. In each of the comparative examples 4a and 4b, the third substrate We is used as the substrate W. In the treatment liquid supplying step of the comparative examples 4a and 4b, the treatment liquid consists of a sublimable substance and a solvent. In the comparative examples 4a and 4b, the sublimable substance is camphor. In the comparative examples 4a and 4b, the solvent is methanol. A volume ratio of the sublimable substance and the solvent is as under in the comparative examples 4a and 4b.

Sublimable substance:Solvent=1:100 (volume ratio) That is, a volume ratio RV of the sublimable substance to the solvent is 1.0 [Vol %]. The conditions of the comparative example 4a other than the above are the same as those of the experimental example 5a. The conditions of the comparative example 4b other than the above are the same as those of the experimental example 5b.

The comparative example 5a is performed under conditions as below. In the comparative example 5a, the first substrate Wa is used as the substrate W. In the treatment liquid supplying step of the comparative example 5a, the treatment liquid consists of a sublimable substance and a solvent. The sublimable substance is cyclohexanone oxime in the comparative example 5a. The solvent is isopropyl alcohol in the comparative example 5a. A volume ratio of the sublimable substance and the solvent is as under in the comparative example 5a.

Sublimable substance:Solvent=1:40 (volume ratio)

That is, a volume ratio RV of the sublimable substance to the solvent is 2.5 [Vol %]. The conditions of the comparative example 5a other than the above are the same as those of the experimental example 5a.

The comparative example 6a is performed under conditions as below. In the comparative example 6a, the first substrate Wa is used as the substrate W. In the treatment liquid supplying step of the comparative example 6a, the treatment liquid consists of a sublimable substance, a solvent, and an additive. The sublimable substance is cyclohexanone oxime in the comparative example 6a. The solvent is isopropyl alcohol in the comparative example 6a. In the comparative example 6a, the additive is tert-butanol. The tert-butanol is also called TBA or tert-butyl alcohol. A volume ratio of the sublimable substance and the solvent is as under in the comparative example 6a.

Sublimable substance:Solvent=1:40 (volume ratio)

That is, a volume ratio RV of the sublimable substance to the solvent is 2.5 [Vol %]. A volume ratio of the additive to the total of the sublimable substance and the solvent is as under in the comparative example 6a.

Additive:Total of Sublimable substance and Solvent=10:100 (volume ratio)

The conditions of the comparative example 6a other than the above are the same as those of the experimental example 5a.

The comparative example 7a is performed under conditions as below. In the comparative example 7a, the first substrate Wa is used as the substrate W. In the treatment liquid supplying step of the comparative example 7a, the treatment liquid consists of a sublimable substance, a solvent, and an additive. The sublimable substance is cyclohexanone oxime in the comparative example 7a. The solvent is isopropyl alcohol in the comparative example 7a. In the comparative example 7a, the additive is tert-butanol. A volume ratio of the sublimable substance and the solvent is as under in the comparative example 7a.

Sublimable substance:Solvent=1:40 (volume ratio)

That is, a volume ratio RV of the sublimable substance to the solvent is 2.5 [Vol %]. A volume ratio of the additive to the total of the sublimable substance and the solvent is as under in the comparative example 7a.

Additive:Total of Sublimable substance and Solvent=1:100 (volume ratio)

The conditions of the comparative example 6a other than the above are the same as those of the experimental example 5a.

Substrates W treated in the experimental examples 5a and 5b and the comparative examples 1a, 1b, 2a, 2b, 3a, 3b, 4a, 4b, 5a, 6a, and 7a are individually evaluated under the following evaluation criterions. An observer observes the pattern P at a plurality of measurement points on a substrate W. The observer calculates a collapse rate at each measurement point based on observed results. The collapse rate is as described in the evaluation criterions in the experimental examples 1 to 4. In addition, an average collapse rate is calculated based on the collapse rates at the measuring points. The average collapse rate is obtained by dividing the sum of the collapse rates by the number of measurement points.

FIG. 27 is a table showing evaluations of the substrates W treated in the experimental examples 5a and 5b and the comparative examples 1a, 1b, 2a, and 2b. FIG. 28 is a table showing evaluations of the substrates W treated in the comparative examples 3a, 3b, 4a, 4b, 5a, 6a, and 7a.

In the experimental example 5a, an average collapse rate is 0.02%. In the experimental example 5b, an average collapse rate is 0.16%.

The following is found from the experimental examples 5a and 5b. When the sublimable substance is pinacolone oxime, collapse of the pattern P is effectively suppressed regardless of whether the substrate W has hydrophobicity or hydrophilicity. When the sublimable substance is pinacolone oxime, the substrate is treated suitably while the pattern P is protected, regardless of whether the surface condition of the substrate W is hydrophobic or hydrophilic. When the sublimable substance is pinacolone oxime, treatment quality of the substrate W does not depend on the surface condition of the substrate W substantially.

In the comparative example 1a, an average collapse rate is 0.7%. In the comparative example 1b, an average collapse rate is 78.6%. In the comparative example 2a, an average collapse rate is 0.1%. In the comparative example 2b, an average collapse rate is 100%.

The following is found from the comparative examples 1a, 1b, 2a, and 2b. When the sublimable substance is cyclohexanone oxime, collapse of the pattern P on the substrate W having hydrophobicity is suppressed suitably. On the other hand, when the sublimable substance is cyclohexanone oxime, collapse of the pattern P on the substrate W having hydrophilicity occurs significantly. That is, when the sublimable substance is cyclohexanone oxime, treatment quality of the substrate W significantly depends on the surface condition of the substrate W.

In the comparative example 3a, an average collapse rate is 37.4%. In the comparative example 3b, an average collapse rate is 100%. In the comparative example 4a, an average collapse rate is 9.95%. In the comparative example 4b, an average collapse rate is 100%. The following is found from the comparative examples 3a, 3b, 4a, and 4b. When the sublimable substance is camphor, collapse of the pattern P on the substrate W having hydrophobicity is suppressed. On the other hand, when the sublimable substance is camphor, collapse of the pattern P on the substrate W having hydrophilicity occurs significantly. That is, when the sublimable substance is camphor, treatment quality of the substrate W significantly depends on the surface condition of the substrate W.

(19-4) Factor Impacting Collapse Rate

The Inventors studied a factor impacting the collapse rate. As a result, the Inventors assume that a factor impacting the collapse rate is interfacial free energy. The following describes the Inventors' finding regarding the factor impacting the collapse rate.

Figure 29:
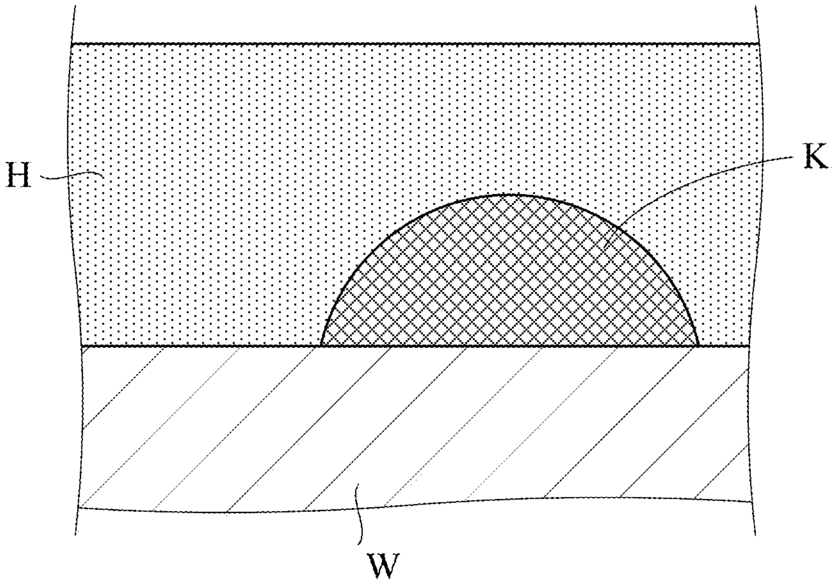
FIG. 29 is a schematical enlarged view of the substrate in the solidified film forming step.

FIG. 29 is a schematic enlarged view of a substrate W in the solidified film forming step. In the solidified film forming step, a liquid film H of a treatment liquid is formed on the substrate W. Hereinafter, the liquid film H of the treating liquid is referred to as a "treatment liquid H" appropriately. The substrate W contacts the treatment liquid H. Moreover, in the solidified film forming step, a solidified film K is formed on the substrate W. The substrate W contact the solidified film K. The solidified film K contacts the treatment liquid H.

When the solidified film K starts to be formed on the substrate W, there exist a first interface, a second interface, and a third interface. The first interface is an interface between the substrate W and the treatment liquid H. The second interface is an interface between the substrate W and the solidified film K. The third interface is an interface between the solidified film K and the treatment liquid H.

The first interface has interfacial free energy $\gamma WH$. The second interface has interfacial free energy $\gamma KW$. The third interface has interfacial free energy $\gamma HK$.

The interfacial free energies $\gamma WH$, $\gamma KW$, and $\gamma HK$ are each calculated through measurement or calculation.

The measurement includes measurement of a surface free energy of the treatment liquid H, for example. The measurement of the surface free energy of the treatment liquid H is made by a pendant drop method, for example. The measurement includes measurement of a contact angle between a first reference liquid and the substrate W and of a contact angle between a second reference liquid and the substrate W, for example. The measurement includes measurement of a contact angle between the first reference liquid and the solidified film K and measurement of a contact angle between the second reference liquid and the solidified film K, for example. Here, a surface free energy of the first reference liquid is known. Specifically, a surface free energy of the first reference liquid, a dispersive component of the surface free energy of the first reference liquid, and a polar component of the surface free energy of the first reference liquid are known. Likewise, a surface free energy of the second reference liquid is known. Specifically, a surface free energy of the second reference liquid, a dispersive component of the surface free energy of the second reference liquid, and a polar component of the surface free energy of the second reference liquid are known.

The calculation is made based on the measurement results described above. Specifically, the calculation is made based on the measurement results described above and the surface free energies known. The calculation is made with use of a Young equation, a Dupre equation, and an extended Fowkes equation, for example. The calculation is made by substituting the measurement results in these equations. The calculation is made by substituting the measurement results and the known surface free energies in these equations. The calculation obtains the interfacial free energies $\gamma WH$, $\gamma KW$ $\gamma HK$.

Moreover, the interfacial free energies γWH, γKW, angle γHK define an angle θ. Specifically, an angle θ is defined through an equation (1).

$$\cos\theta = (\gamma WH \cdot \gamma KW)/\gamma HK \quad (1)$$

The angle θ is a concept similar to the contact angle.

The Inventors obtain the angles θ in the experimental examples 5a, 5b, and the comparative examples 1a, 1b, 2a, 2b, 3a, 3b, 4a, 4b, 5a, 6a, and 7*a*.

Figure 30:
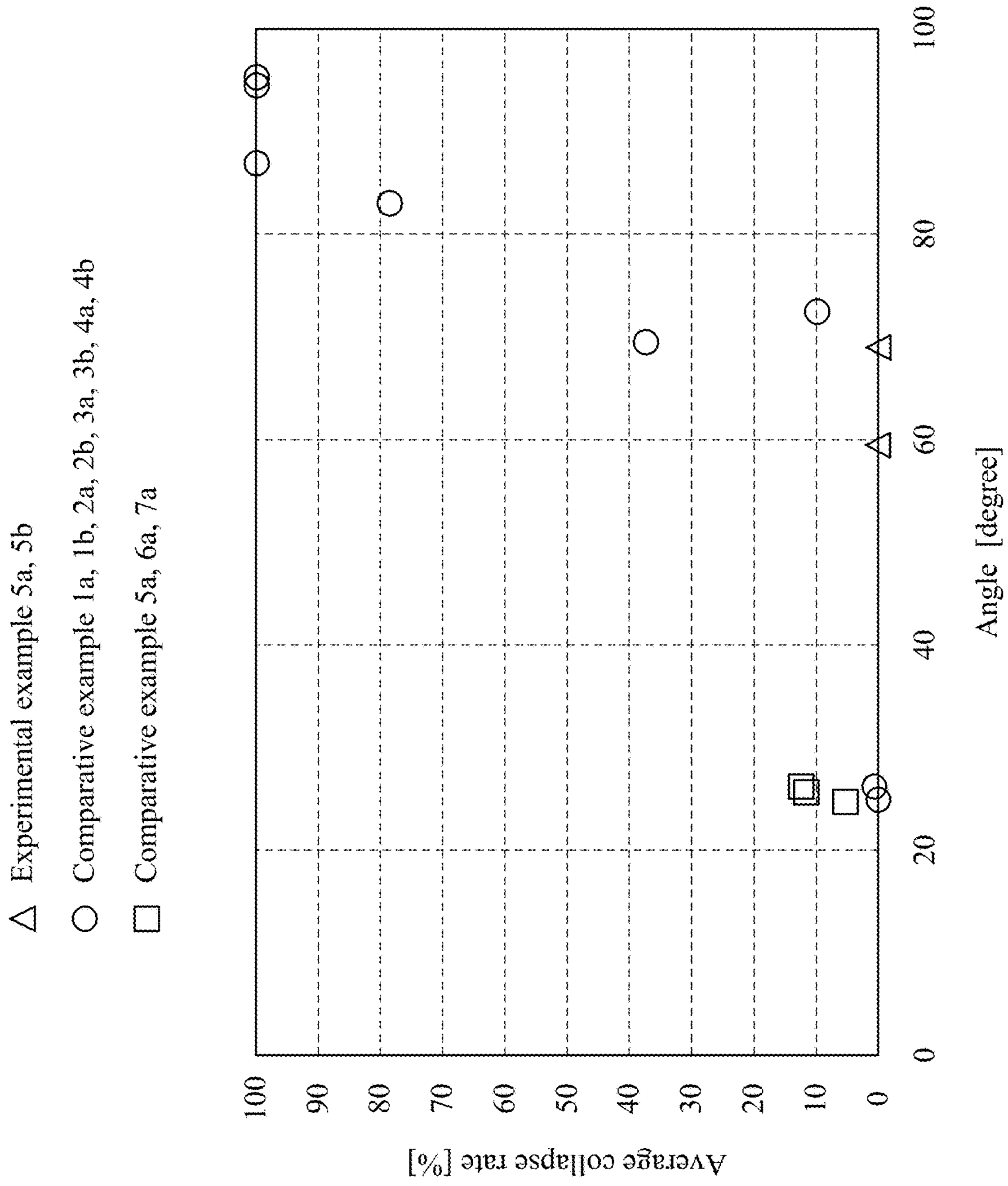
FIG. 30 is a graph showing a relationship between an angle and an average collapse rate.

FIGS. 27 and 28 each show an angles θ in the experimental examples 5a, 5b, and the comparative examples 1a, 1b, 2a, 2b, 3a, 3b, 4a, 4b, 5a, 6a, and 7a. FIG. 30 is a graph showing a relationship between the angle θ and the average collapse rate.

The angles θ fall between 24.7 degrees to 95.5 degrees. The average collapse rate falls between 0.02% and 100%. When the angle θ is 72.6 degrees or less, the average collapse rate is 37.4% or less. When the angle θ is 83.2 degrees or more, the average collapse rate is 78.6% or more. Accordingly, the average collapse rate when the angle θ is 72.6 degrees or less is lower than the average collapse rate when the angle θ is 83.2 degrees or more.

Accordingly, it is found that the average collapse rate is suitably reduced when the angle θ is 70 degrees or less. The angle θ is assumed to be one factor of impacting the average collapse rate.

(19-5) Mechanism for Collapse of Pattern P

As described above, the pattern P is significantly collapsed in the comparative examples 1b, 2b, 3b, and 4b. The angle θ is large in the comparative examples 1b, 2b, 3b, and 4b. The Inventors supposed a mechanism of collapse of the pattern P as under when the angle θ is large.

Figure 31:
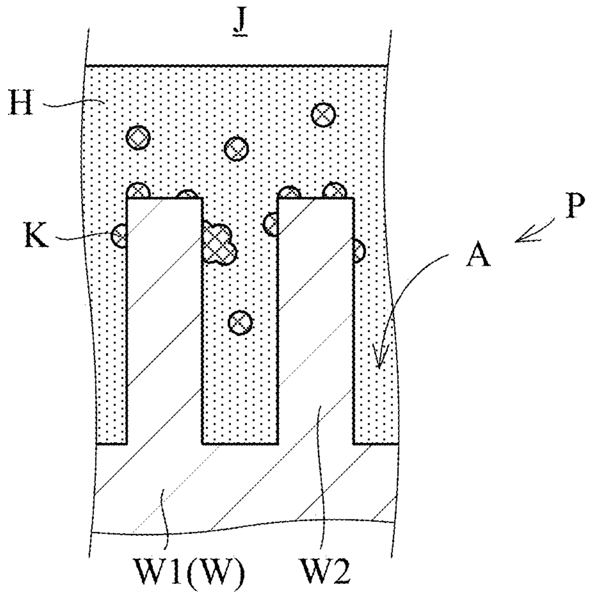
FIG. 31 exemplarily shows a mechanism for pattern collapse.
Figure 32:
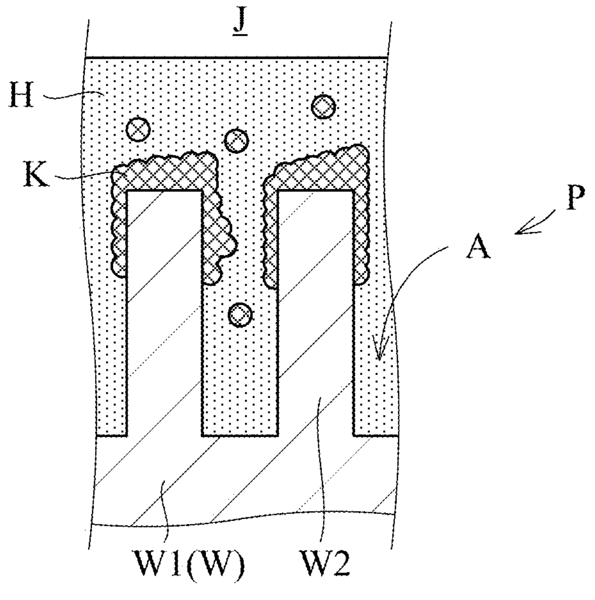
FIG. 32 exemplarily shows a mechanism for pattern collapse.
Figure 33:
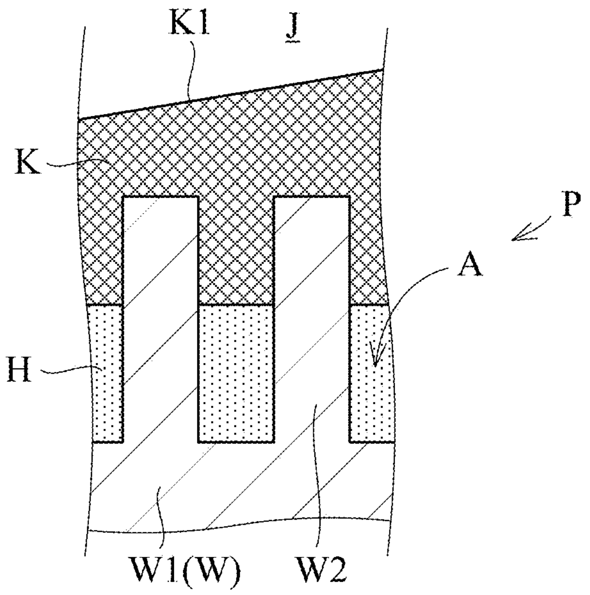
FIG. 33 exemplarily shows a mechanism for pattern collapse.
Figure 34:
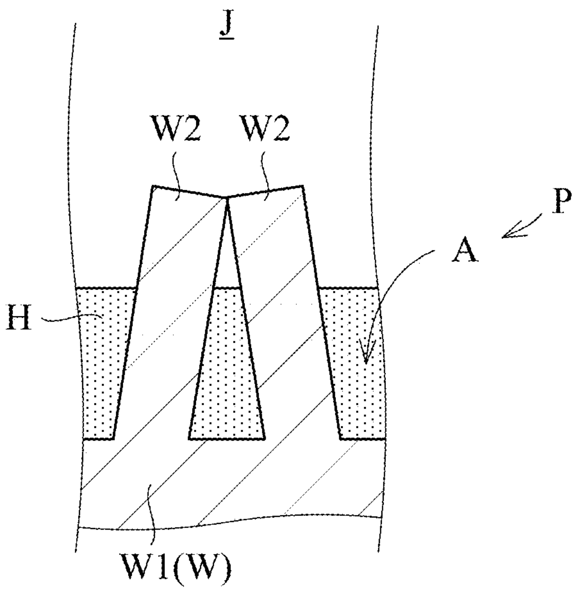
FIG. 34 exemplarily shows a mechanism for pattern collapse.

FIGS. 31, 32, 33, and 34 each exemplarily show a mechanism for collapse of pattern P. FIGS. 31, 32, and 33 each schematically show the substrate W in the solidified film forming step. FIG. 34 schematically shows the substrate W in the sublimation step.

Reference is made to FIG. 31. In the solidified film forming step, the sublimable substance is changed to solid from the solute of the treatment liquid. The solid sublimable substance corresponds to the solidified film K. When the solidified film K starts to generate, the solidified film K has a particle shape, for example. The solidified film K is deposited on the substrate W, for example. Here, the angle θ is large. Accordingly, the solidified film K is deposited on the substrate W nonuniformly. For example, the solidified film K is deposited only on upper portions of the projections W2. For example, the solidified film K is not deposited on lower portions of the projections W2.

Reference is made to FIG. 32. The solidified film K grows. The solidified film K becomes large. Here, the angle θ is large. Accordingly, the solidified film K grows nonuniformly. For example, the solidified film K grows only near the upper portions of the projections W2. For example, the solidified film K does not grow near the lower portions of the projections W2.

Reference is made to FIG. 33. The solidified film K further grows. The solidified film K becomes larger. Here, the angle θ is large. Accordingly, the solidified film K grows nonuniformly. For example, the solidified film K grows near the upper portions of the projections W2. For example, the solidified film K does not grow near the lower portions of the projections W2. For example, the solidified film K covers only part of the upper surface W1 of the substrate W. For example, the solidified film K does not cover the entire of the upper surface W1 of the substrate W.

Moreover, a thickness of the solidified film K becomes nonuniform. The solidified film K has a top face K1. For example, the top face K1 is inclined.

FIG. 33 schematically shows the substrate W when the solidified film forming step is completed. For example, the solidified film K does not entirely fill the recesses A even when the solidified film forming step is completed. For example, the recesses A are not filled with the solidified film K even when the solidified film forming step is completed. For example, even when the solidified film forming step is completed, the liquid film H of the treatment liquid still remains in the recesses A.

Reference is made to FIG. 34. The solidified film K sublimates. After the solidified film K sublimates, the projections W2 are not supported by the solidified film K. The liquid film H of the treatment liquid stills remains in the recesses A even after the solidified film K sublimates. The treatment liquid (e.g., the liquid film H of the treatment liquid) applies a significant force to the projections W2. The projections W2 receives a significant force. The significant force is, for example, a surface tension of the treatment liquid L. The significant force is, for example, a capillary force. Accordingly, the projections W2 are collapsed.

In summary, the angle θ is large in the comparative examples 1b, 2b, 3b, and 4b. Accordingly, in the solidified film forming step, the solidified film K is precipitated nonuniformly. In the solidified film forming step, the solidified film K grows nonuniformly. As a result, the treatment liquid remains in the recesses A when the solidified film forming step is completed. Consequently, the pattern P collapses.

(19-6) Mechanism for Protection of Pattern P

As described above, collapse of the pattern P is suppressed in the experimental examples 5a and 5b. The angle θ is small in the experimental examples 5a and 5b. Then, the Inventors supposed a mechanism of protection of the pattern P when the angle θ is small as under.

Figure 35:
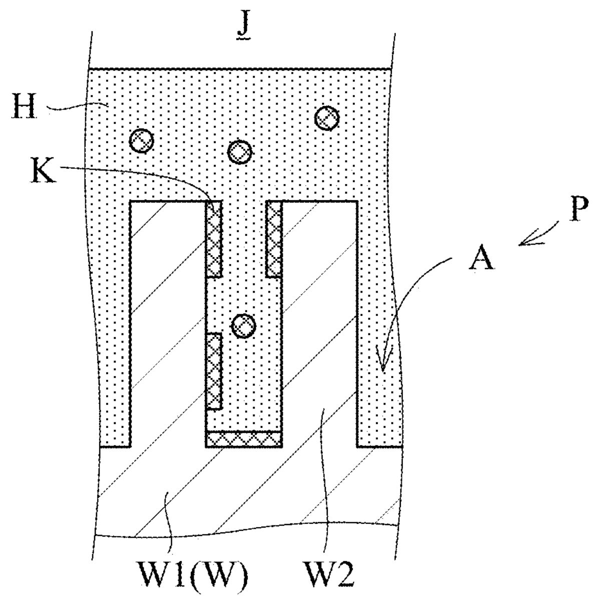
FIG. 35 exemplarily shows a mechanism for protection of pattern.
Figure 36:
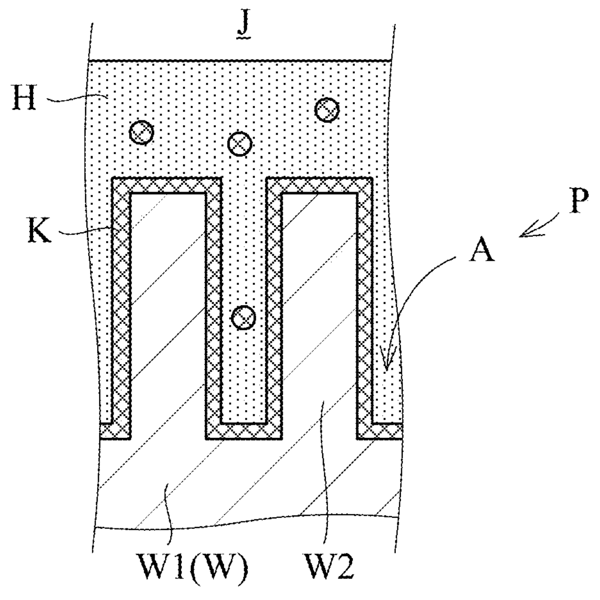
FIG. 36 exemplarily shows a mechanism for protection of pattern.
Figure 37:
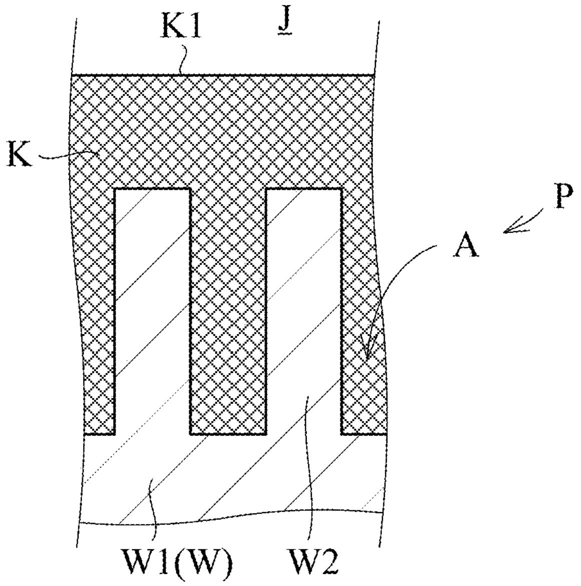
FIG. 37 exemplarily shows a mechanism for protection of pattern.
Figure 38:
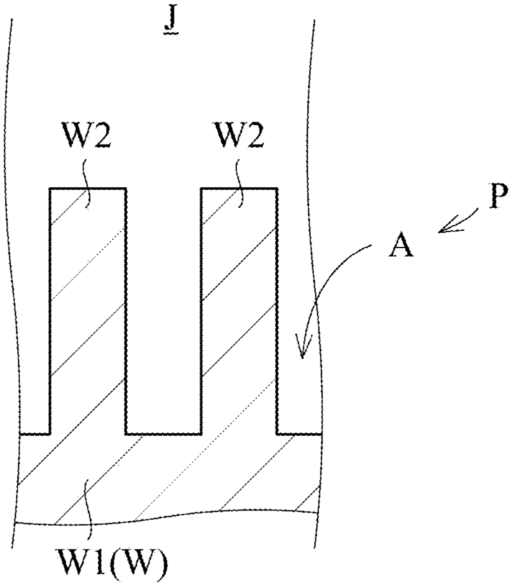
FIG. 38 exemplarily shows a mechanism for protection of pattern.

FIGS. 35, 36, 37, and 38 each exemplarily show a mechanism for protection of the pattern P. FIGS. 35, 36, and 37 each schematically show the substrate W in the solidified film forming step. FIG. 38 schematically shows the substrate W in the sublimation step.

Reference is made to FIG. 35. The solidified film K is deposited on the substrate W. Here, the angle θ is small. Accordingly, the solidified film K is deposited on the substrate W uniformly. For example, the solidified film K is deposited uniformly over the upper surface W1. For example, the solidified film K is deposited uniformly over the projections W2. For example, the solidified film K is deposited not only on upper portions of the projections W2 but also lower portions of the projections W2, for example.

Reference is made to FIG. 36. The solidified film K grows. The solidified film K becomes large. Here, the angle θ is small. Accordingly, the solidified film K grows uniformly. For example, the solidified film K grows not only near the upper portions of the projections W2 but also near the lower portions of the projections W2. For example, the solidified film K covers the entire of the upper surface W1 of the substrate W.

Reference is made to FIG. 37. The solidified film K further grows. The solidified film K becomes larger. Here, the angle θ is small. Accordingly, the solidified film K grows uniformly. For example, the solidified film K grows not only near the upper portions of the projections W2 but also near the lower portions of the projections W2.

Moreover, a thickness of the solidified film K is uniform. For example, the top face K1 of the solidified film K is not inclined. For example, the top face K1 is horizontal.

FIG. 37 schematically shows the substrate W when the solidified film forming step is completed. For example, the solidified film K fills all the recesses A when the solidified film forming step is completed. For example, the recesses A are filled with the solidified film K when the solidified film forming step is completed. For example, when the solidified film forming step is completed, the treatment liquid (e.g., liquid film H of the treatment liquid) does not remain in the recesses A. For example, when the solidified film forming step is completed, the treatment liquid (e.g., liquid film H of the treatment liquid) does not exist in the recesses A.

Reference is made to FIG. 38. The solidified film K sublimates. The treatment liquid (e.g., liquid film H of the treatment liquid) does not exist in the recesses A. The projections W2 do not receive a significant force. Accordingly, the projections W2 are not collapsed.

In summary, the angle θ is small in the experimental examples 5a and 5b. Accordingly, in the solidified film forming step, the solidified film K is deposited uniformly. In the solidified film forming step, the solidified film K grows uniformly. As a result, the treatment liquid does not remain in the recesses A when the solidified film forming step is completed. Consequently, the pattern P is protected.

(20) The first to third embodiments and each of the modified embodiments described in paragraphs (1) to (19) above may be further varied as appropriate by replacing or combining their constructions with the constructions of other modified embodiments.

REFERENCE SIGNS LIST

1 . . . substrate treating apparatus
10 . . . controller
11 . . . treating unit
13 . . . substrate holder
**15*a*** . . . supplying unit (treatment liquid supplying unit)
**15*e*** . . . supplying unit (first gas supplying unit)
**15*f*** . . . supplying unit (second gas supplying unit)
**16*a*** . . . nozzle (treatment liquid nozzle)
**16*e*** . . . nozzle (first gas nozzle)
**16*f*** . . . nozzle (second gas nozzle)
20 . . . treatment liquid generating unit
21 . . . tank
41 . . . heating unit
42 . . . heating unit
43 . . . resistance heater
54 . . . mixing unit
H . . . liquid film
K . . . solidified film
Ka . . . first solidified film
Kb . . . second solidified film
MP . . . melting point of sublimable substance
Q1 . . . flow rate of first gas in sublimation step
Q2 . . . flow rate of second gas in removing step
T1 . . . temperature of first gas in sublimation step
T2 . . . temperature of second gas in removing step
Th . . . temperature of substrate in removing step
v1 . . . rotation speed of substrate in sublimation step
v2 . . . rotation speed of substrate in removing step
W . . . substrate
W1 . . . upper surface of substrate
W**1*a*** . . . pattern forming area
W**1*b*** . . . pattern non-forming area
P . . . pattern
W2 . . . projection
A . . . recess
W3 . . . lower surface

The invention claimed is:

1. A substrate treating method for performing treatment on a substrate, the substrate having an upper surface provided with a pattern forming area where a pattern is formed and a pattern non-forming area where the pattern is not formed, the substrate treating method comprising:

a treatment liquid supplying step of supplying a treatment liquid, containing a sublimable substance and a solvent, to the upper surface of the substrate to form a liquid film of the treatment liquid on the upper surface of the substrate;

a solidified film forming step of evaporating the solvent from the liquid film to form a solidified film on the upper surface of the substrate, the solidified film containing the sublimable substance and including a first solidified film on the pattern forming area and a second solidified film on the pattern non-forming area;

a sublimation step of blowing first gas to the first solidified film to sublimate the first solidified film; and a removing step of removing the second solidified film from the substrate.

2. The substrate treating method according to claim 1, wherein the removing step starts after the sublimation step is completed.

3. The substrate treating method according to claim 1, wherein a period of time where the removing step is performed overlaps with at least part of a period of time where the sublimation step is performed.

4. The substrate treating method according to claim 3, wherein the removing step starts after the sublimation step starts.

5. The substrate treating method according to claim 1, wherein the second solidified film is changed to a gas phase in the removing step.

6. The substrate treating method according to claim 1, wherein the second gas is blown to the second solidified film in the removing step.

7. The substrate treating method according to claim 6, wherein a flow rate of the second gas is larger than a flow rate of the first gas.

8. The substrate treating method according to claim 6, wherein the second solidified film is heated with the second gas in the removing step.

9. The substrate treating method according to claim 6, wherein the second gas has a temperature higher than a temperature of the first gas.

10. The substrate treating method according to claim 6, wherein the second gas has a temperature higher than a melting point of the sublimable substance.

11. The substrate treating method according to claim 1, wherein the second solidified film is heated in the removing step.

12. The substrate treating method according to claim 11, wherein the pattern non-forming area is heated and the second solidified film is heated via the pattern non-forming area in the removing step.

13. The substrate treating method according to claim 12, wherein the pattern non-forming area is heated to a temperature higher than a temperature of the first gas in the removing step.

14. The substrate treating method according to claim 11, wherein a lower surface of the substrate is heated in the removing step.

15. The substrate treating method according to claim 11, wherein the second solidified film is heated with at least any of high-temperature fluid, a resistance heater, and a lamp heater in the removing step.

16. The substrate treating method according to claim 1, wherein the sublimable substance has a vapor pressure of 100 Pa or less at room temperature.

17. The substrate treating method according to claim 1, wherein the sublimable substance contains at least one selected from pinacolone oxime, acetophenone oxime, cyclopentanone oxime, and 4-tert-butylphenol.

* * * * *